(12) United States Patent
Kim et al.

(10) Patent No.: US 11,035,777 B2
(45) Date of Patent: Jun. 15, 2021

(54) LIGHT SENSING DEVICE AND PARTICLE SENSING DEVICE

(71) Applicant: LG INNOTEK CO., LTD., Seoul (KR)

(72) Inventors: Sun Woo Kim, Seoul (KR); Yong Jun Ko, Seoul (KR); Ki Min Lee, Seoul (KR); Joo Seung Choi, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 0 days.

(21) Appl. No.: 16/475,184

(22) PCT Filed: Dec. 29, 2017

(86) PCT No.: PCT/KR2017/015735
§ 371 (c)(1),
(2) Date: Jul. 1, 2019

(87) PCT Pub. No.: WO2018/124814
PCT Pub. Date: May 7, 2018

(65) Prior Publication Data
US 2019/0339191 A1    Nov. 7, 2019

(30) Foreign Application Priority Data

Jan. 2, 2017 (KR) .................. 10-2017-0000241
Feb. 28, 2017 (KR) .................. 10-2017-0026813

(51) Int. Cl.
| | | |
|---|---|---|
| *G01N 15/14* | (2006.01) | |
| *H01L 25/16* | (2006.01) | |
| *H01L 27/144* | (2006.01) | |
| *H01L 31/0352* | (2006.01) | |

(52) U.S. Cl.
CPC ....... *G01N 15/1436* (2013.01); *H01L 25/167* (2013.01); *H01L 27/1443* (2013.01);
(Continued)

(58) Field of Classification Search
CPC ..... C12Q 2565/607; G01T 1/366; G01T 3/08; G01B 9/00; G01N 15/0211;
(Continued)

(56) References Cited

U.S. PATENT DOCUMENTS 3,835,315 A * 9/1974 Gravitt, Jr. ......... G01N 15/0205
250/574
4,597,666 A * 7/1986 Gerber .................. G01N 21/53
250/574
(Continued)

FOREIGN PATENT DOCUMENTS

JP     2010-039937     2/2010
JP     2011-133483     7/2011
(Continued)

OTHER PUBLICATIONS

International Search Report dated Apr. 6, 2018 issued in Application No. PCT/KR2017/015735.

*Primary Examiner* — Hoa Q Pham
(74) *Attorney, Agent, or Firm* — KED & Associates LLP

(57) ABSTRACT

A light sensing device, according to an embodiment, for sensing light emitted from a light source, and reflected or scattered from an object comprises: a light transmitting member; and a light sensing unit disposed on the light transmitting member, wherein the light sensing unit comprises: a light transmitting region; a first electrode layer; a semiconductor layer; and a second electrode layer, wherein the semiconductor layer comprises: a first semiconductor layer disposed around the light-transmitting region; and a second semiconductor layer disposed outside the first semiconductor layer.

12 Claims, 34 Drawing Sheets

(52) U.S. Cl.
CPC ........ *H01L 31/035281* (2013.01); *G01N 2015/1486* (2013.01)

(58) Field of Classification Search
CPC .......... G01N 15/1436; G01N 15/1459; G01N 2015/0046; G01N 2015/1486; G01N 21/1486; G01N 21/47; H01L 25/167
USPC ..................... 356/335–343, 73, 432–440
See application file for complete search history.

(56) References Cited

U.S. PATENT DOCUMENTS

| | | | |
|---|---|---|---|
| 5,319,827 A | 6/1994 | Yang | |
| 7,038,189 B2 | 5/2006 | Kawai | |
| 8,797,650 B2 * | 8/2014 | Matsushita | G01J 3/51 |
| | | | 359/579 |
| 2010/0226029 A1 * | 9/2010 | Funasaka | G02B 5/28 |
| | | | 359/850 |
| 2012/0162644 A1 | 6/2012 | Kwon et al. | |
| 2013/0027707 A1 * | 1/2013 | Matsushita | G01J 3/0264 |
| | | | 356/432 |
| 2013/0221472 A1 * | 8/2013 | Mase | G01S 17/894 |
| | | | 257/443 |

FOREIGN PATENT DOCUMENTS

| | | |
|---|---|---|
| JP | 2013-072930 | 4/2013 |
| JP | 2016-045093 | 4/2016 |
| KR | 20-0335852 | 12/2003 |
| KR | 10-2012-0074558 | 7/2012 |
| KR | 10-1679041 | 11/2016 |

\* cited by examiner

SCATTERING DISTRIBUTION OF
PARTICLE HAVING SIZE OF 3 mm

SCATTERING DISTRIBUTION OF
PARTICLE HAVING SIZE OF 0.3 mm (a)

(b)

(c)

LIGHT SENSING DEVICE AND PARTICLE SENSING DEVICE

CROSS-REFERENCE TO RELATED PATENT APPLICATIONS

This application is a U.S. National Stage Application under 35 U.S.C. § 371 of PCT Application No. PCT/KR2017/015735, filed Dec. 29, 2017, which claims priority to Korean Patent Application No's. 10-2017-0000241, filed Jan. 2, 2017 and 10-2017-0026813, filed Feb. 28, 2017, whose entire disclosures are hereby incorporated by reference.

TECHNICAL FIELD

Embodiments relate to a light-sensing device and a particle-sensing device.

BACKGROUND ART

In general, a conventional dust-sensing device for sensing particles such as dust radiates light toward dust in an optical-axis direction, and senses light scattered by the dust on the lateral side of the optical axis, thereby obtaining information about the dust. One example of such a conventional lateral-type dust-sensing device is disclosed in U.S. Pat. No. 7,038,189 (registered on May 2, 2006).

However, when sensing light scattered by dust on the lateral side of the optical-axis direction, the intensity of the sensed scattered light is low, thus making it difficult to sense a particle having a small size, e.g. a size of 1 μm or less, and causing a narrow focusing zone.

Further, the conventional lateral-type dust-sensing device has a limited flow path. That is, a path through which air including dust flows is formed by heat flow, and thus a region through which particles flow becomes larger than a light-collecting region. Thus, the number of unmeasured particles increases, and the accuracy of sensing particles is lowered. Further, the overall size of the dust-sensing device increases due to the arrangement of a heat source for generating heat flow. For example, the conventional lateral-type dust-sensing device has a very large measurement error of about 30%.

Further, in the case of the conventional lateral-type dust-sensing device, the intensity of scattered light is not large because the light scattered by dust is sensed from the lateral side. Therefore, a relatively large amount of power is consumed to increase the intensity of the scattered light.

Furthermore, in the case of the conventional lateral-type dust-sensing device, it is impossible to count the number of dusts due to the structural limitation of the flow path through which particles pass.

DISCLOSURE

Technical Problem

Embodiments provide a particle-sensing device capable of accurately sensing information about small particles with a simple structure.

Technical Solution

In one embodiment, a particle-sensing device may include a light-emitting unit emitting light, a flow path unit disposed below the light-emitting unit so as to be perpendicular to an optical axis of the light-emitting unit, the flow path unit being configured to allow air including a particle to flow therethrough, a light-receiving unit disposed on the optical axis below the flow path unit and receiving light that has passed through the flow path unit, and a light-absorbing unit disposed on the optical axis below the light-receiving unit and absorbing light that has passed through the light-receiving unit.

For example, the flow path unit may include a flow path inlet portion into which the air flows, a flow path outlet portion through which the air flows out, a scattering portion disposed on the optical axis between the light-emitting unit and the light-receiving unit and between the flow path inlet portion and the flow path outlet portion, the scattering portion being configured to allow light emitted from the light-emitting unit to be scattered by the particle therein, a first flow path intermediate portion located between the flow path inlet portion and the scattering portion, and a second flow path intermediate portion located between the scattering portion and the flow path outlet portion. The flow path inlet portion may include an inlet hole through which the air flows from the outside and a first path formed between the inlet hole and the first flow path intermediate portion. The flow path outlet portion may include an outlet hole through which the air flows out and a second path formed between the second flow path intermediate portion and the outlet hole.

For example, the first flow path intermediate portion may include a portion, the cross-sectional area of which gradually decreases in a direction perpendicular to the direction in which the air flows as it goes toward the scattering portion, and the second flow path intermediate portion may include a portion, the cross-sectional area of which gradually increases in the direction perpendicular to the direction in which the air flows as it goes away from the scattering portion.

For example, the cross-sectional area of the first flow path intermediate portion may gradually decrease and thereafter increase in the direction perpendicular to the direction in which the air flows as it goes toward the scattering portion, and the cross-sectional area of the second flow path intermediate portion may gradually decrease and thereafter increase in the direction perpendicular to the direction in which the air flows as it goes away from the scattering portion.

For example, the cross-sectional areas of the flow path inlet portion, the flow path outlet portion, the first and second flow path intermediate portions, and the scattering portion may be the same as each other in the direction perpendicular to the direction in which the air flows.

For example, the cross-sectional area of each of the flow path inlet portion and the flow path outlet portion may be greater than the cross-sectional area of the scattering portion in the direction perpendicular to the direction in which the air flows.

For example, the particle-sensing device may further include a fan disposed adjacent to the flow path unit in the direction in which the air flows in order to induce the flow of the air. For example, the fan may be disposed adjacent to the outlet hole.

For example, the light-emitting unit may include a light source unit, and a first opening disposed on the optical axis in order to radiate light emitted from the light source unit toward the scattering portion.

For example, the light-emitting unit may further include a lens unit disposed on the optical axis between the light source unit and the first opening and configured to concentrate light emitted from the light source unit onto the first opening. In addition, the lens unit may convert the light emitted from the light source unit into parallel light.

For example, the light emitted from the first opening may form a light curtain in the scattering portion in the direction perpendicular to the direction in which the air flows.

For example, the first opening may have an area corresponding to an emission angle of the light emitted from the light source unit.

For example, the cross-sectional area of the flow path unit may be less than the area of the first opening.

For example, the cross-sectional area of the flow path unit may be less than the beam size of the light emitted from the first opening.

For example, the area of the first opening may be greater than the cross-sectional area of the second opening in the direction perpendicular to the direction in which the air flows, and the second opening may correspond to an open region through which the first or second flow path intermediate portion communicates with the scattering portion, or may correspond to an open region having the smallest cross-sectional area in the first or second flow path intermediate portion.

For example, the light source unit may emit light in a wavelength band of 405 nm to 660 nm or 850 nm to 940 nm.

For example, the light-receiving unit may include a light-transmitting member, and a light-sensing part sensing light scattered by the particle in the scattering unit. The light-receiving unit may further include a light guide part guiding the scattered light to the light-sensing part, and the light-sensing part and the light guide part may be disposed around the optical axis on respectively different surfaces of the light-transmitting member.

For example, the light-sensing unit may include a center portion located on the optical axis and having a light-transmitting property, and a photodiode disposed around the center portion and sensing the scattered light.

For example, the photodiode may include a plurality of sensing segments spaced apart from each other in the same plane. The sensing segments may be spaced apart from each other at regular intervals or at different intervals.

For example, the sensing segments may be spaced apart from each other by a gap of 0.01 mm to 1 mm, e.g. 0.1 mm to 0.5 mm, specifically 0.15 mm to 0.25 mm.

For example, the sensing segments may have the same planar area as each other, or may have different planar areas from each other.

For example, the sensing segments may be disposed symmetrically or asymmetrically when viewed in plan.

For example, the planar shape of the photodiode may include at least one of a circular ring shape, a polygonal ring shape, or an elliptical ring shape.

For example, the center portion may cover a light entrance of the light-absorbing unit.

For example, the photodiode may sense light in a wavelength band of 380 nm to 1100 nm.

For example, the particle-sensing device may further include a light incidence portion disposed between the scattering portion and the light-receiving unit in order to adjust the amount of light incident on the light-receiving unit, the light incidence portion including a third opening disposed on the optical axis.

For example, 20% to 80% of the total amount of scattered light may be incident through the third opening.

For example, a portion of the scattered light, which is located within a range of an angle of 12° to 30° in the left and right with respect to the optical axis, may be incident through the third opening.

For example, the areas of the first opening and the third opening may be different from each other. For example, the area of the first opening may be greater than the area of the third opening.

For example, the diameter of the third opening having a circular planar shape may range from 1 mm to 12 mm.

For example, the cross-sectional area of each of the inlet hole and the outlet hole may be greater than the area of the first opening and may be greater than the cross-sectional area of the second opening in the direction perpendicular to the direction in which the air flows. Alternatively, the maximum cross-sectional area of each of the first path and the second path may be greater than the area of the first opening and may be greater than the cross-sectional area of the second opening in the direction perpendicular to the direction in which the air flows.

For example, the light guide part may include an inner partition wall defining a fourth opening overlapping the light entrance of the light-absorbing part in a direction parallel to the optical axis, and an outer partition wall defining a fifth opening overlapping the photodiode in a direction parallel to the optical axis together with the inner partition wall.

For example, the light incidence portion may include a light-inducing portion disposed between the scattering portion and the light guide portion to define the third opening, and a light-blocking portion disposed between the scattering portion and the light-inducing portion to define a sixth opening.

For example, the light incidence portion may further include a cover light-transmitting portion disposed between the third opening and the sixth opening. For example, the area of the fourth opening may be less than the area of the sixth opening.

For example, the inner partition wall may have a height such that the scattered light that has passed through the third opening travels to the fifth opening and such that the light that has passed through the sixth opening travels to the fourth opening.

For example, the inner partition wall may include an inner portion defining the fourth opening and an outer portion extending from the inner portion and defining the fifth opening together with the outer partition wall. For example, the width of the fifth opening may be greater than the width of the outer portion.

For example, the light-absorbing unit may include an absorption case defining a light entrance, on which light that has passed through the light-receiving unit is incident, and receiving light that has passed through the light-receiving unit, and a protruding portion protruding from the bottom surface of the absorption case toward the light entrance. The width of the protruding portion may gradually decrease toward the light entrance.

For example, the particle-sensing device may further include an information-analyzing unit analyzing at least one of the number, concentration, size or shape of particles using an electrical signal of light incident on the light-receiving unit. The information-analyzing unit may predict the shape of the particle using a relative intensity of the results sensed by the sensing segments.

For example, the information-analyzing unit may include an amplification unit amplifying an electrical signal input from the light-receiving unit, and a control unit comparing an analog signal amplified by the amplification unit with a pulse width modulation reference signal and analyzing at least one of the number, concentration, size or shape of particles using the comparison result.

For example, the particle-sensing device may further include a signal-converting unit converting a current-type signal input from the light-receiving unit into a voltage-type signal and outputting the converted result as an electrical signal.

For example, the particle-sensing device may further include a housing accommodating the light-emitting unit, the light-receiving unit, and the light-absorbing unit, and including the flow path unit therein. The housing may include a top portion accommodating the light-emitting unit, a bottom portion accommodating the light-receiving unit and the light-absorbing unit, and an intermediate portion accommodating the flow path unit and the fan.

In another embodiment, a light-sensing device, sensing light that is emitted from a light source and is reflected or scattered from an object, may include a light-transmitting member, and a light-sensing part disposed on the light-transmitting member and including a light-transmitting region. The light-sensing part may include a first electrode layer, a semiconductor layer disposed on the first electrode layer, and a second electrode layer disposed on the semiconductor layer. The semiconductor layer may include a first semiconductor layer disposed around the light-transmitting region, and a second semiconductor layer disposed outside the first semiconductor layer.

For example, the light-transmitting region may be located on an optical axis of the light source.

For example, the light-transmitting member may have a circular planar shape, and each of the first semiconductor layer and the second semiconductor layer may have an annular planar shape.

For example, the first semiconductor layer and the second semiconductor layer may be formed so as to have a concentric circle shape when viewed in plan.

For example, the optical axis may pass through the center of the concentric circle.

For example, the semiconductor layer may further include a third semiconductor layer disposed outside the second semiconductor layer and sensing the scattered light.

For example, the first semiconductor layer and the second semiconductor layer may have a polygonal planar shape.

In still another embodiment, a particle-sensing device may include a light-emitting unit emitting light, a flow path unit disposed below the light-emitting unit so as to intersect an optical axis of the light-emitting unit, the flow path unit providing a space in which air including a particle flows and light is scattered by the particle, a light-receiving unit disposed below the flow path unit and receiving the scattered light, and a light-absorbing unit disposed on the optical axis below the light-receiving unit and absorbing light that has passed through the light-receiving unit. Here, the light-receiving unit may include a light-transmitting member, and a light-sensing part disposed on the light-transmitting member. The light-sensing part may include a light-transmitting region, a first electrode layer, a semiconductor layer, and a second electrode layer. The semiconductor layer may include a first semiconductor layer disposed around the light-transmitting region, and a second semiconductor layer disposed outside the first semiconductor layer.

For example, the particle-sensing device may further include an information-analyzing unit determining the size of the particle using a ratio of the intensity of an output signal of the first semiconductor layer to the intensity of an output signal of the second semiconductor layer.

For example, the light-transmitting region may have a circular planar shape, and the first semiconductor layer and the second semiconductor layer may have an annular planar shape, which are concentric with each other.

Advantageous Effects

The particle-sensing device according to the embodiment has improved performance of sensing a particle due to an increase in the intensity of sensed scattered light, and is capable of sensing a particle having a very small size of 1 μm or less, e.g. from 0.1 μm to 0.8 μm, specifically 0.3 μm to 0.5 μm, predicting the shape of a particle, facilitating the design of a light-absorbing unit, solving deterioration in detection of scattered light due to main beam, counting the number of particles, increasing the intensity of scattered light without an increase in power consumption, and reducing the overall size. As a result, the particle-sensing device may be appropriately used in a field that requires a small-sized particle-sensing device, for example, for vehicles.

In addition, since scattered light is received at different positions with respect to the same particle and the intensities of the scattered light are compared, the particle-sensing device is robust against deterioration of a light-emitting device, contamination of an optical system, and a manufacturing tolerance of the components, and thus has a high reliability.

DESCRIPTION OF DRAWINGS

FIG. 10e is a cross-sectional view taken along line J-J' in the light-sensing part shown in FIG. 10a.

FIG. 11 is a perspective view showing an embodiment of detecting scattered light through the light-sensing part shown in FIG. 10a.

FIG. 13a shows a planar shape of another embodiment of the light-sensing part shown in FIG. 9, and FIGS. 13b and 13c are cross-sectional views taken along line K-K' in the light-sensing part shown in FIG. 13a.

FIG. 14 is a perspective view illustrating an embodiment of detecting scattered light through the light-sensing part shown in FIG. 13a.

BEST MODE

The present disclosure will now be described more fully hereinafter with reference to the accompanying drawings, in which various embodiments are shown. The examples, however, may be embodied in many different forms and should not be construed as being limited to the embodiments set forth herein. Rather, these embodiments are provided so that this disclosure will be more thorough and complete, and will more fully convey the scope of the disclosure to those skilled in the art.

It will be understood that when an element is referred to as being "on" or "under" another element, it may be directly on/under the element, or one or more intervening elements may also be present.

When an element is referred to as being "on" or "under", "under the element" as well as "on the element" may be included based on the element.

In addition, relational terms, such as "first", "second", "on/upper part/above" and "under/lower part/below", are used only to distinguish between one subject or element and another subject or element, without necessarily requiring or involving any physical or logical relationship or sequence between the subjects or elements.

Hereinafter, a particle-sensing device 100 (100A to 100D) according to an embodiment will be described with reference to the accompanying drawings. The particle-sensing device 100 (100A to 100D) will be described using the Cartesian coordinate system (x-axis, y-axis, z-axis) for convenience of description. However, other different coordinate systems may be used.

Figure 1:
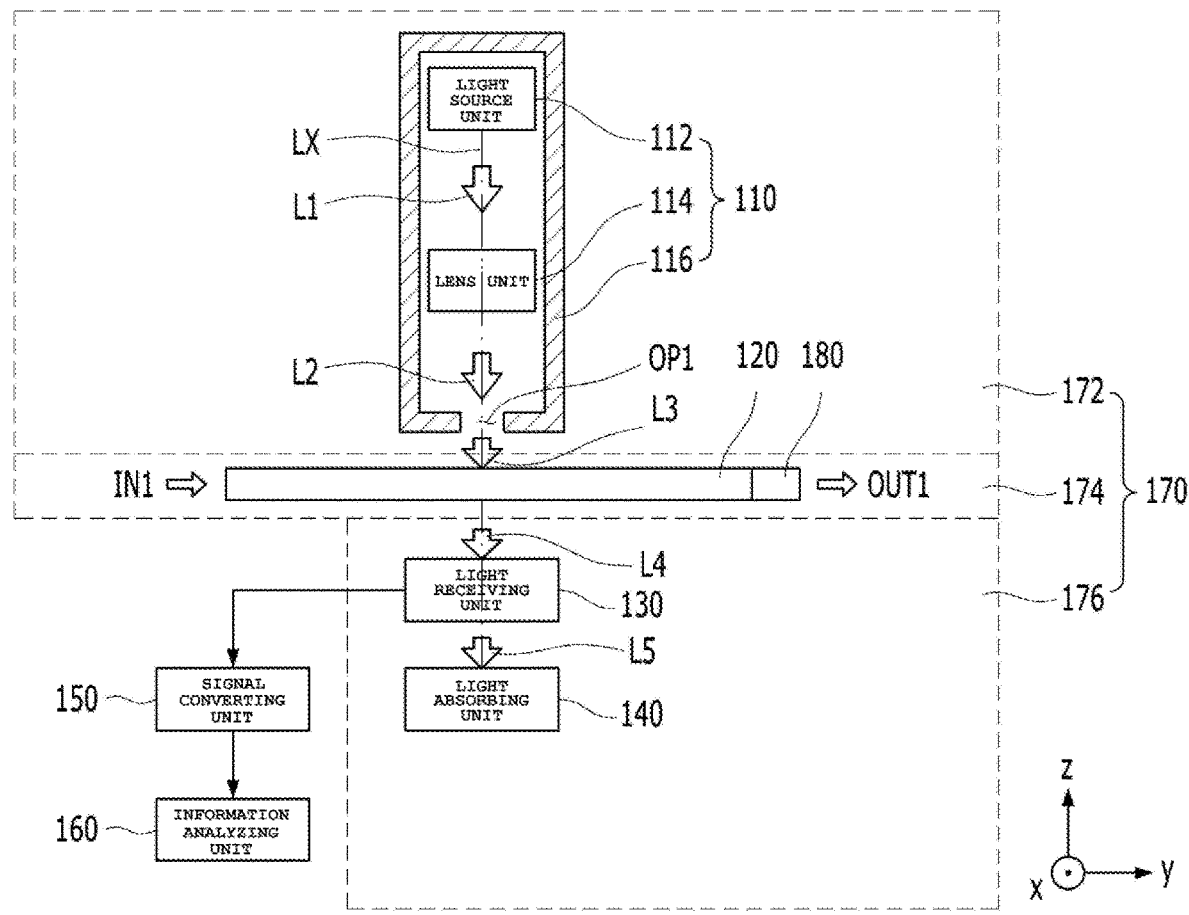
FIG. 1 is a schematic block diagram showing the concept of a particle-sensing device according to an embodiment.

FIG. 1 is a schematic block diagram showing the concept of a particle-sensing device 100 according to an embodiment. The particle-sensing device may include a light-emitting unit 110, a flow path unit 120, a light-receiving unit 130, a light-absorbing (dumping) unit 140, a signal-converting unit 150, an information-analyzing unit 160, a housing 170, and a fan 180.

Referring to FIG. 1, the light-emitting unit 110 may serve to emit light, and may include a light source unit 112, a lens unit 114, and a light-emitting case 116.

The light source unit 112 may serve to emit first light L1, and may include at least one light source. The light source included in the light source unit 112 may be at least one of a light-emitting diode (LED) or a laser diode (LD). The embodiment is not limited as to the specific type of light source or the number of light sources included in the light source unit 112. For example, the light source that implements the light source unit 112 may be a blue LED, a high-brightness LED, a chip LED, a high-flux LED, or a power LED, which has straightness. However, the light source according to the embodiment is not limited as to the specific type of LED.

If the light source unit 112 is implemented as an LED, the light source unit may emit light of a visible light wavelength band (e.g. 405 nm to 660 nm) or an infrared (IR) wavelength band (e.g. 850 nm to 940 nm). Alternatively, if the light source unit 112 is implemented as an LD, the light source unit may emit light of a red/blue wavelength band (e.g. 450 nm to 660 nm). However, the embodiment is not limited as to the specific wavelength band of the first light L1 emitted from the light source unit 112.

Further, the intensity of third light L3 emitted from the light-emitting unit 110 may be equal to or greater than 3000 mcd. However, the embodiment is not limited as to the specific emission intensity of the third light L3.

The light source of the light-emitting unit 110 described above may be packaged in a surface-mount-device (SMD) type or a lead type. Here, the SMD type is a packaging type in which a light source of a light-emitting unit 112A is mounted on a printed circuit board (PCB) through soldering, which will be described later with reference to FIG. 3. The lead type is a packaging type in which a lead protrudes from a light source so as to be connected to a PCB electrode. However, the embodiment is not limited as to the specific packaging type of the light source.

Further, when the light-emitting unit 110 is implemented as an LD, the LD may be of a TO Can type packaged with metal, and may consume power of 5 mW or more. However, the embodiment is not limited thereto.

The lens unit 114 may be disposed on an optical axis LX between the light source unit 112 and a first opening OP1. That is, the lens unit 114 may be disposed in a path through which the first light L1 passes from the light source unit 112 toward the first opening OP1. The lens unit 114 serves to concentrate (L2) the first light L1 emitted from the light source unit 112 into the first opening OP1. Further, the lens unit 114 may also convert the first light L1 emitted from the light source unit 112 into parallel light L2. To this end, the lens unit 114 may include only one lens, or may include a plurality of lenses disposed on the optical axis LX. The material of the lens unit 114 may be the same as that of a lens that is applied to a general camera module or an LED module.

The light-emitting case 116 serves to accommodate the light source unit 112 and the lens unit 114 and to form the first opening OP1. In FIG. 1, the light-emitting case 116 is illustrated as being provided separately from a top portion 172 of the housing 170. However, the embodiment is not limited thereto. That is, the light-emitting case 116 may be integrally formed with the top portion 172 of the housing 170, as illustrated in FIG. 19, 20, 21 or 22 to be described later. In this case, the light-emitting case 116 may be omitted.

Further, the light-emitting case 116 may include the first opening OP1. The first opening OP1 may be a part through which the second light L2 that has been emitted from the light source unit 112 and has passed through the lens unit 114 is radiated to a scattering portion (or a scattering space) SS of the flow path unit 120 as third light L3, and may be disposed on the optical axis LX of the light-emitting unit 110. The description of the scattering unit SS will be made later in detail with the description of the flow path unit 120.

Further, the first opening OP1 may have an area corresponding to a view angle of the first light L1 emitted from the light source unit 112. In general, the view angle of the LED, which may be provided as the light source unit 112, is about 15° when the luminous intensity decreases to 50%. As such, since the LED has high beam power at the center thereof, light having a desired intensity may be radiated through the first opening OP1 even when the area of the first opening OP1 is not large. However, in the case in which the view angle is large, if the area of the first opening OP1 is determined such that the third light L3 having a desired intensity is emitted from the light-emitting unit 110, optical loss may occur, and the intensity of the light may be decreased. Therefore, the view angle may be determined in consideration of this phenomenon. For example, when the first opening OP1 has a circular planar shape, if the diameter of the first opening OP1 exceeds 10 mm, the size of the particle-sensing device 100 also increases, which may cause optical noise. Thus, the maximum value of the diameter of the first opening OP1 may be set to 10 mm. However, the embodiment is not limited thereto.

The flow path unit 120 may be disposed below the light-emitting unit 110 so as to be perpendicular to the optical axis LX of the light-emitting unit 110, and may provide a path through which air including particles flows. The air including particles may flow into the flow path unit 120 through an inlet hole IH in a direction IN1, and may flow out of the flow path unit 120 through an outlet hole OH in a direction OUT1. Particles may be particles that float in the air, and may be, for example, dust or smoke. However, the embodiment is not limited as to the particular form of particles.

Particles included in the air flowing into the flow path unit 120 through the inlet hole IH in the direction IN1 may be scattered from the scattering unit SS of the flow path unit 120 by the third light L3 emitted from the light-emitting unit 110, and scattered fourth light L4 (hereinafter referred to as "scattered light") may be provided to the light-receiving unit 130.

In FIG. 1, the flow path unit 120 is illustrated as being spaced apart from the light-emitting unit 110 and the light-receiving unit 130. However, this is merely for explaining the concept of the particle-sensing device 100 according to the embodiment. That is, in accordance with a type in which the flow path unit 120 is implemented, the flow path unit 120 may be disposed so as to be in contact with the light-emitting unit 110 and the light-receiving unit 130 in the same manner as in particle-sensing devices 100A to 100D, which will be described later.

The fan 180 serves to induce the flow of air in the flow path unit 120. That is, the fan 180 serves to maintain the flow rate of the air at a constant level in the flow path unit 120. To this end, the fan 180 may be disposed adjacent to the flow path unit 120 in the direction (e.g. the y-axis direction) in which the air flows. For example, as shown in FIG. 1, the fan 180 may be disposed at the outlet hole OH of the flow path unit 120. However, the embodiment is not limited thereto. That is, the embodiment is not limited as to the specific arrangement position of the fan 180, as long as the fan is capable of inducing the flow of air in the flow path unit 120.

For example, the flow path unit 120 may be implemented or the rotating speed of the fan 180 may be determined so that the flow rate of the air including particles in the flow path unit 120 is maintained at 5 ml/sec. However, the embodiment is not limited thereto.

Meanwhile, the light-receiving unit 130 (or the light-sensing device) serves to receive the fourth light L4 that has passed through the flow path unit 120. To this end, the light-receiving unit may be disposed on the optical axis LX below the flow path unit 120. Here, the fourth light L4 that has passed through the flow path unit 120 may include at least one of scattered light or non-scattered light.

Hereinafter, the characteristics of scattered light scattered by a particle P will be described with reference to FIGS. 2a to 2c.

Figure 2A:
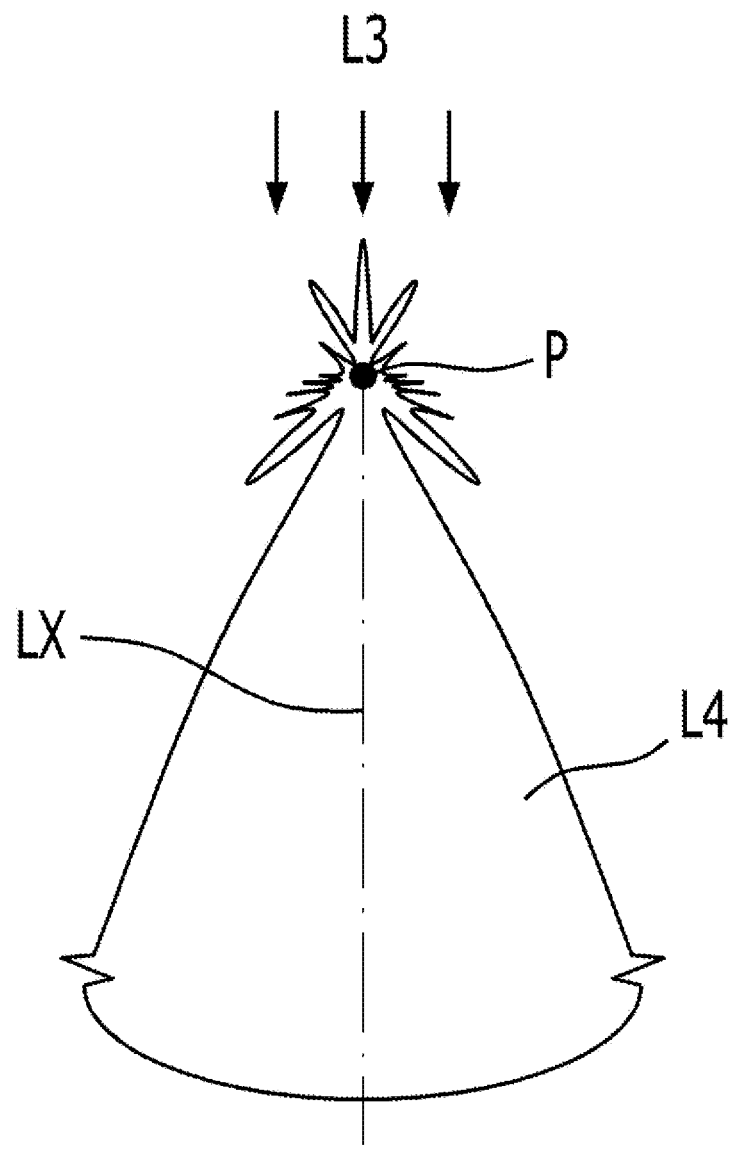
FIG. 2a shows an exemplary profile of scattered light scattered by a particle.
Figure 2B:
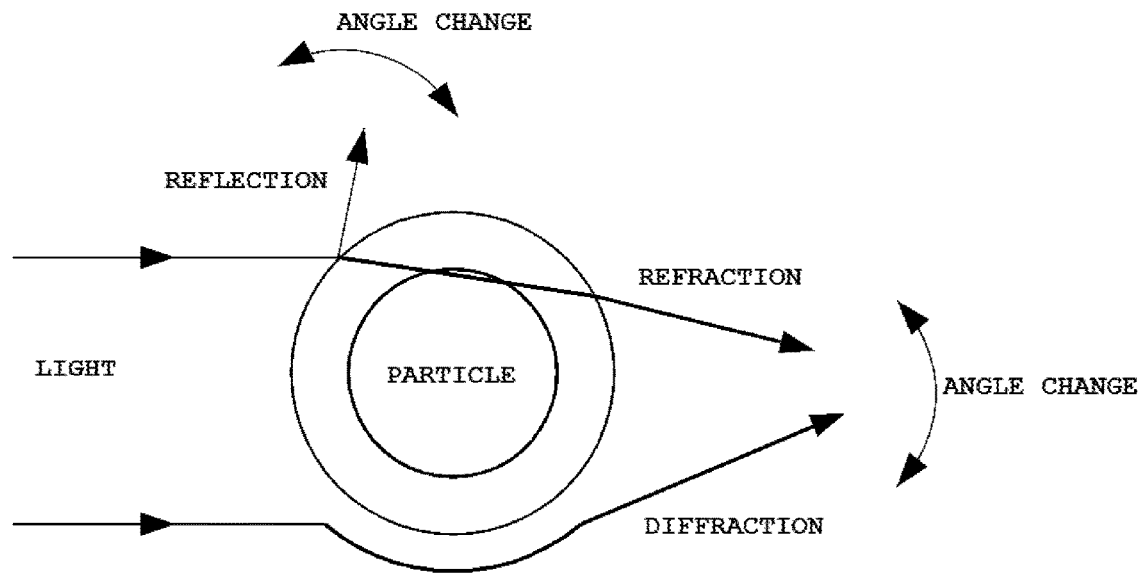
FIG. 2b is a view showing a variation in the angle of scattered light in accordance with the size of a particle.
Figure 2C:
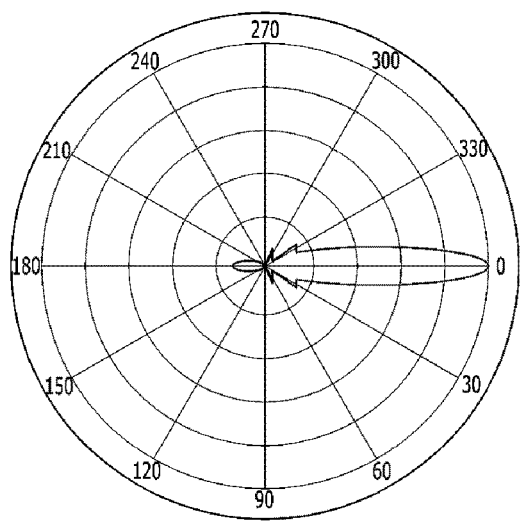
FIG. 2c shows an example of the distribution of scattered light in accordance with the size of a particle.
Figure 2C:
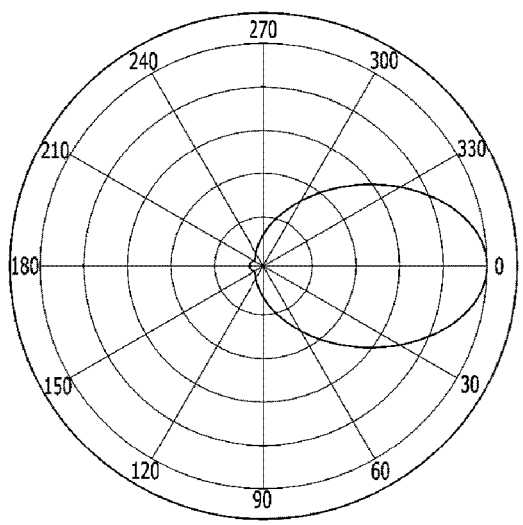

FIG. 2a shows an exemplary profile of scattered light scattered by particles P. FIG. 2b is a view showing a variation in the angle of scattered light in accordance with the size of a particle, and FIG. 2c shows an example of the distribution of scattered light in accordance with the size of a particle.

First, referring to FIG. 2a, the scattered light may be light L4 that is generated in the process in which the third light L3 emitted from the light-emitting unit 110 is scattered by the particle P included in the air passing through the flow path unit 120. As shown in FIG. 2a, the scattered light L4 may have a profile in which the light is diffused in a cone shape with the particle P as a vertex. The non-scattered light may be light that is generated in the process in which the third light L3 emitted from the light-emitting unit 110 is not scattered by the particle P passing through the flow path unit 120 but travels to the light-receiving unit 130.

However, the scattered light may have respectively different profiles depending on the size of a particle. As shown in FIG. 2b, light emitted from the light source is reflected, refracted, or diffracted as it approaches the particle. However, even when the same light travels, the rate or point at which the light is reflected, refracted, or diffracted varies depending on the size of a particle. Thus, in the case in which the size of the particle is 3 μm as shown in the left graph in FIG. 2c, the scattering distribution of the scattered light has a profile similar to that shown in FIG. 2a. However, in the case in which the size of the particle is 0.3 μm, the scattering distribution of the scattered light has a profile shown in the right graph in FIG. 2c. More specifically, in each graph in FIG. 2c, angles between 0° and 360° are marked along the circumference of a circle, and 0° corresponds to the optical-axis direction. Further, the graph indicates that the distribution gradually increases in the direction from the center of the circle to the circumference thereof. For example, in the case in which the size of a particle is 3 μm, most of the scattered light is distributed within the range of 30° (i.e. from 330° to 30°) from the optical axis (0°). However, in the case in which the size of a particle is 0.3 μm, the scattered light exceeds the range of 60° (i.e. from 300° to 60°) as well as the range of 30°.

Referring back to FIG. 1, the light-receiving unit 130 may receive the scattered light, and may provide an electrical signal related to the received light to the signal-converting unit 150.

The light-absorbing unit 140 serves to absorb fifth light L5 that has passed through the light-receiving unit 130. To this end, the light-absorbing unit may be disposed on the optical axis LX below the light-receiving unit 130. The light-absorbing unit 140 may correspond to a kind of darkroom that absorbs and confines unnecessary light (hereinafter referred to as "main light"), which is not received by the light-receiving unit 130 but travels straight.

The housing 170 serves to accommodate the light-emitting unit 110, the flow path unit 120, the light-receiving unit 130, and the light-absorbing unit 140. For example, the housing 170 may include a top portion 172, an intermediate portion 174, and a bottom portion 176. The top portion 172 is a portion accommodating the light-emitting unit 110, the intermediate portion 174 is a portion accommodating the flow path unit 120 and the fan 180, and the bottom portion 176 is a portion accommodating the light-receiving unit 130 and the light-absorbing unit 140.

In FIG. 1, the intermediate portion 174 of the housing 170 and the flow path unit 120 are illustrated as being separately provided from each other. However, the embodiment is not limited thereto. According to another embodiment, a flow path unit 120A, 120B and 120C may be defined by the intermediate portion 174 of the housing 170 in a particle-sensing device 100A to 100D, which will be described later.

The signal-converting unit 150 may convert a current-type signal input from the light-receiving unit 130 into a voltage-type signal, and may output the converted result to the information-analyzing unit 160 as an electrical signal. Depending on the embodiment, the signal-converting unit 150 may be omitted, and the light-receiving unit 130 may serve as the signal-converting unit 150. Here, the electrical signal output from the light-receiving unit 130 may be provided to the information-analyzing unit 160.

The information-analyzing unit 160 may analyze at least one of the number, density, size or shape of the particles P using the electrical signal provided from the signal-converting unit 150 (or the light-receiving unit 130 when the signal-converting unit 150 is omitted).

Hereinafter, embodiments 100A to 100D of the particle-sensing device 100 shown in FIG. 1 will be described with reference to the accompanying drawings.

Figure 3:
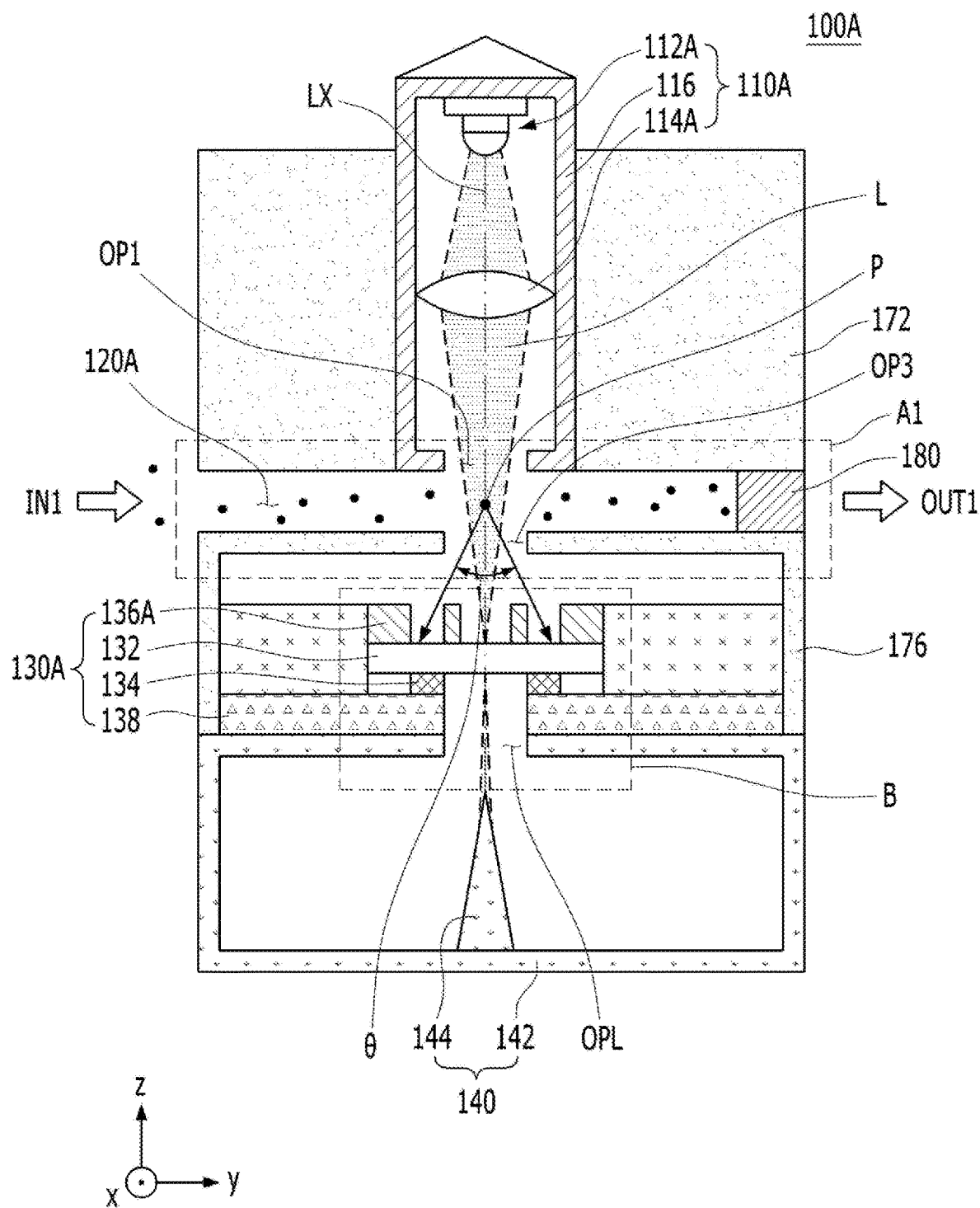
FIG. 3 is a cross-sectional view of one embodiment of the particle-sensing device shown in FIG. 1.

FIG. 3 is a cross-sectional view of one embodiment 100A of the particle-sensing device 100 shown in FIG. 1. For better understanding, the progress of the light is indicated as a shaded portion L in FIG. 3.

The particle-sensing device 100A shown in FIG. 3 includes a light-emitting unit 110A, a flow path unit 120A, a light-receiving unit 130A, a light-absorbing unit 140, a housing 172 and 176, and a fan 180. The signal-converting unit 150 and the information-analyzing unit 160 shown in FIG. 1 are omitted.

The light-emitting unit 110A, the flow path unit 120A, the light-receiving unit 130A, the light-absorbing unit 140, the housing 172 and 176, and the fan 180 shown in FIG. 3 respectively perform the same functions as the light-emitting unit 110, the flow path unit 120, the light-receiving unit 130, the light-absorbing unit 140, the housing 172 and 176, and the fan 180 shown in FIG. 1, and thus a duplicate explanation thereof is omitted.

Referring to FIG. 3, a light source unit 112A includes only one light source. A lens unit 114A includes only one lens. The lens 114A is disposed on the optical axis LX between the light source 112A and the first opening OP1, and serves to concentrate the light emitted from the light source 112A onto the first opening OP1.

Figure 4:
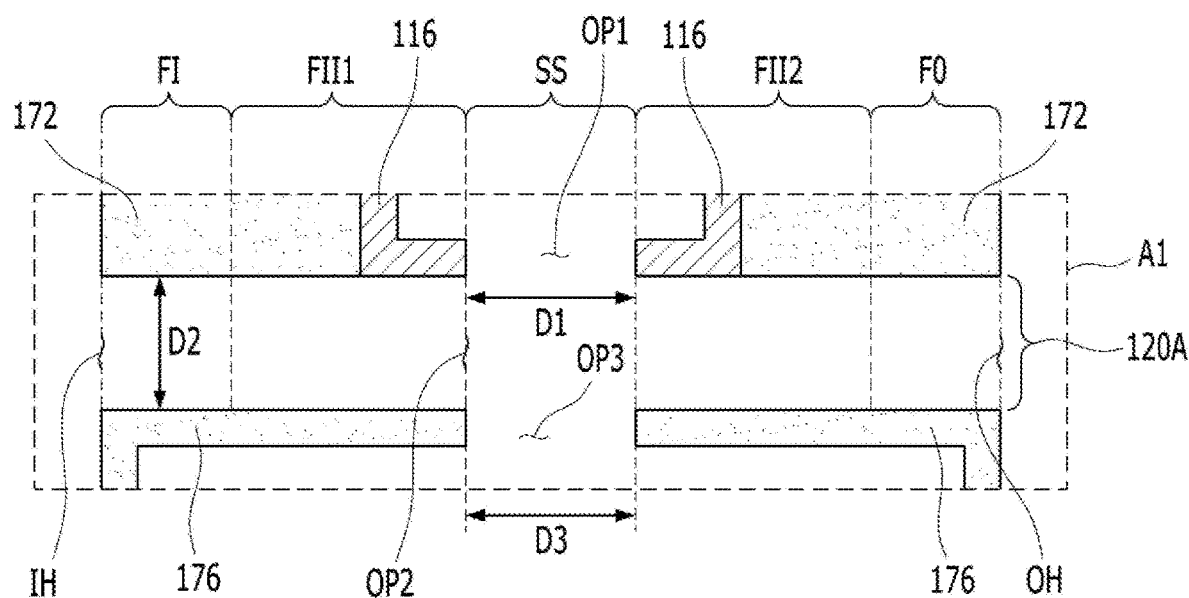
FIG. 4 is an enlarged cross-sectional view of portion 'A1' to explain a flow path unit shown in FIG. 3.

FIG. 4 is an enlarged cross-sectional view of portion 'A' to explain the flow path unit 120A shown in FIG. 3. For convenience of description, illustration of the fan 180 shown in FIG. 3 is omitted from FIG. 4.

Referring to FIGS. 3 and 4, the flow path unit 120A may include a flow path inlet portion FI, a first flow path intermediate portion FII1, a scattering portion SS, a second flow path intermediate portion FII2, and a flow path outlet portion FO.

The flow path inlet portion FI may be a portion into which air, which may include a particle P, flows, and may include an inlet hole IH and a first path. Here, the inlet hole IH corresponds to an entrance of the flow path unit 120, into which air flows from the outside in the direction IN1, and the first path corresponds to a path formed between the inlet hole IH and the first flow path intermediate portion FII1.

The flow path outlet portion FO may be a portion through which air, which may include a particle P, flows out, and may include an outlet hole OH and a second path. Here, the outlet hole OH corresponds to an exit of the flow path unit 120, through which air flows out in the direction OUT1, and the second path corresponds to a path formed between the second flow path intermediate portion FII2 and the outlet hole OH.

The scattering portion SS is located on the optical axis LX between the light-emitting unit 110A and the light-receiving unit 130A and between the flow path inlet portion FI and the flow path outlet portion FO. The scattering portion SS provides a space in which the light emitted from the light-emitting unit 110A is scattered by the particle P. To this end, the scattering portion SS may be defined as a region of the flow path unit 120 and 120A that overlaps the first opening OP1 in the direction in which the light-emitting unit 110A and the light-receiving unit 130A face each other (e.g. the z-axis direction).

The first flow path intermediate portion FII1 may be located between the flow path inlet portion FI and the scattering portion SS, and the second flow path intermediate portion FII2 may be located between the scattering portion SS and the flow path outlet portion FO.

The air including the particle P flows into the flow path inlet portion FI, travels to the scattering portion SS via the first flow path intermediate portion FII1, and flows out through the flow path outlet portion FO via the second flow path intermediate portion FII2. In order to secure smooth travel of the air including the particle P to the flow path unit 120A, the fan 180 may be provided in the same manner as described above. For example, as shown in FIG. 3, the fan 180 may be disposed in the flow path outlet portion FO. Alternatively, unlike the illustrated configuration, the fan may be disposed adjacent to the outlet hole OH in the flow path outlet portion FO. Alternatively, according to another embodiment, the fan 180 may be disposed in the flow path inlet portion FI, or may be disposed adjacent to the inlet hole IH.

While the air including the particle P passes through the flow path unit 120A, the third light L3 emitted from the first opening OP collides with the particle P in the scattering portion SS, and is scattered in the form shown in FIG. 2. Here, in order to cause the third light L3 emitted from the light-emitting unit 110A to collide with all of the particles P passing through the scattering portion SS, the first opening OP1 may have an area suitable for the third light L3 emitted from the first opening OP1 to form a light curtain in the scattering portion SS in a direction (e.g. the x-axis direction and the z-axis direction) perpendicular to the direction (e.g. the y-axis direction) in which the air flows.

Further, the cross-sectional area (e.g. the area in the x-axis and z-axis directions) of the flow path unit 120A may be smaller than the area (e.g. the area in the x-axis and y-axis directions) of the first opening OP1. For example, referring to FIG. 4, on the assumption that the length of the first opening OP1 in the x-axis direction and the length of the flow path unit 120A in the x-axis direction are the same as each other, the width D1 of the first opening OP1 may be greater than the height D2 of the flow path unit 120A. Alternatively, referring to FIG. 4, when the first opening OP1 has a circular planar shape and when the flow path unit 120A has a circular side cross-sectional shape, the diameter D1 of the first opening OP1 may be greater than the diameter D2 of the flow path unit 120A.

As such, when the cross-sectional area of the flow path unit 120A is less than the area of the first opening OP1, the amount of air including the particle P, which passes through the flow path unit 120A, increases, and thus the number of particles passing through the flow path unit 120A also increases, thereby making it possible to sense a greater number of particles.

Further, the cross-sectional area of the flow path unit 120A may be less than the beam size of the light emitted from the first opening OP1. Thus, the amount of air including the particle P, which passes through the flow path unit 120A, increases, and thus the number of particles passing through the flow path unit 120A also increases, thereby making it possible to sense a greater number of particles P.

As described above, when the number of particles P passing through the flow path unit 120A increases, a larger amount of information about the particles P may be secured. As a result, it is possible to more accurately analyze the information about the particles P.

The flow path unit 120 shown in FIG. 1 may have various configurations other than the configurations shown in FIGS. 3 and 4 so as to allow a greater number of particles P to pass therethrough.

Figure 5:
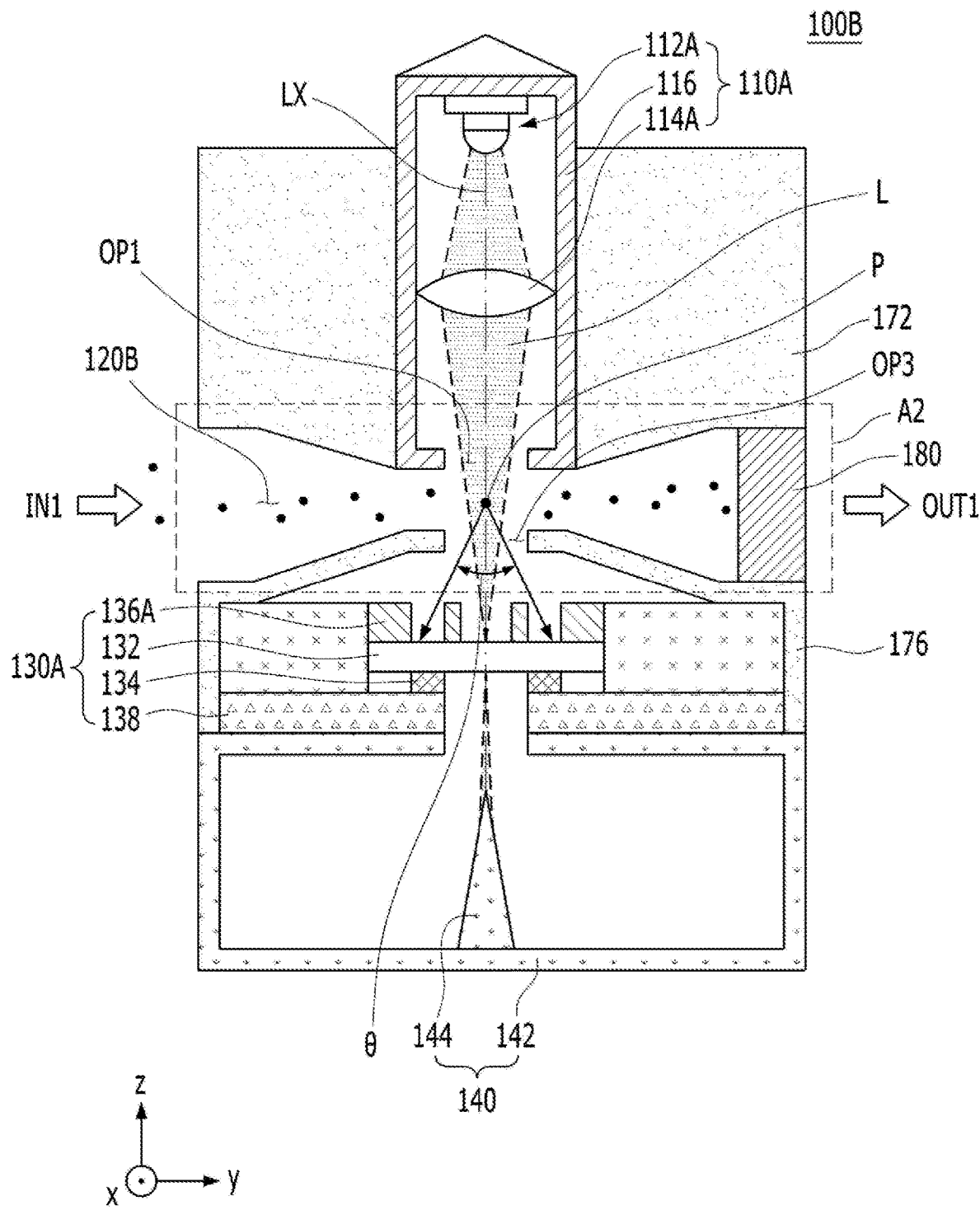
FIG. 5 is a cross-sectional view of another embodiment of the particle-sensing device shown in FIG. 1.
Figure 6:
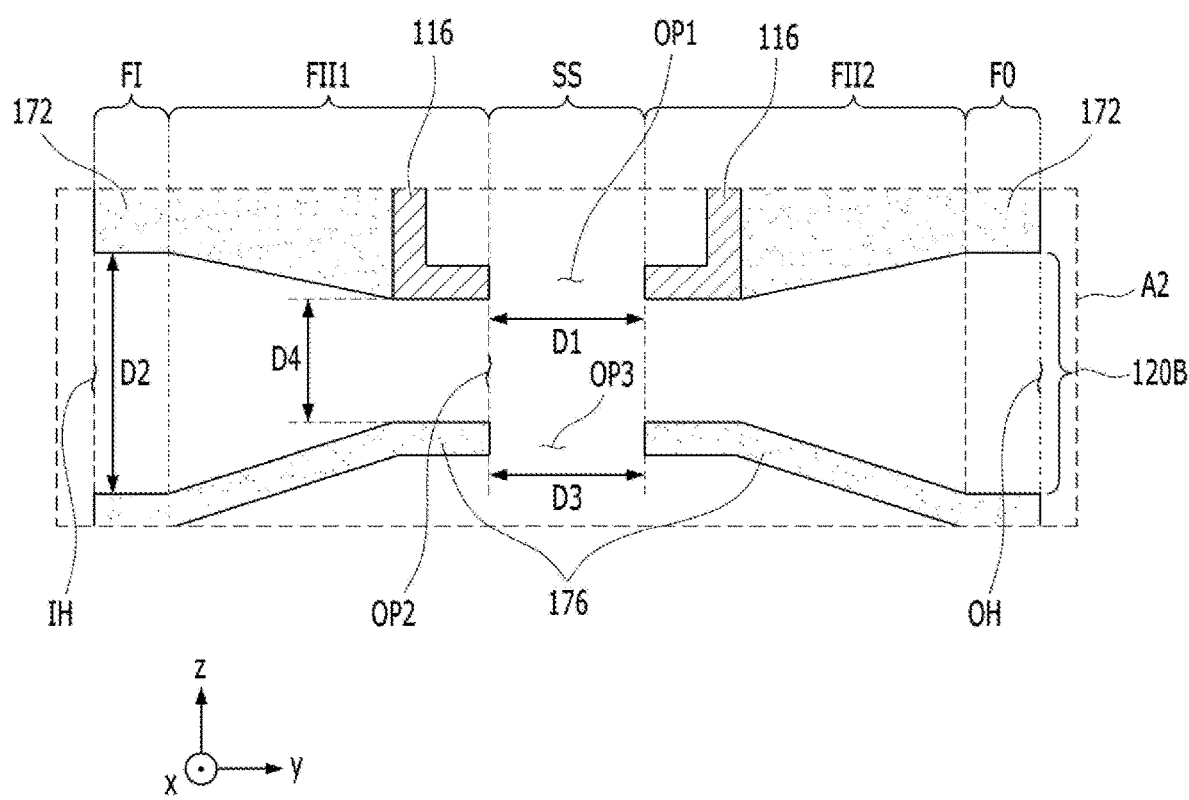
FIG. 6 is an enlarged cross-sectional view of portion 'A2' to explain the flow path unit shown in FIG. 5.

FIG. 5 is a cross-sectional view of another embodiment 100B of the particle-sensing device 100 shown in FIG. 1, and FIG. 6 is an enlarged cross-sectional view of portion 'A2' to explain the flow path unit 120B shown in FIG. 5. For convenience of description, illustration of the fan 180 shown in FIG. 5 is omitted from FIG. 6.

The cross-sectional shape of the flow path unit 120A shown in FIG. 3 and the cross-sectional shape of the flow path unit 120B shown in FIG. 5 are different from each other. Except for this, since the particle-sensing device 100B shown in FIG. 5 is the same as the particle-sensing device 100A shown in FIG. 3, a duplicate explanation thereof will be omitted. For example, the definition of the scattering unit SS described above with reference to FIG. 4 may also be applied to the flow path unit 120B shown in FIG. 6.

In the configuration shown in FIGS. 3 and 4, the flow path inlet portion FI, the first flow path intermediate portion FII1, the scattering portion SS, the second flow path intermediate portion FII2, and the flow path outlet portion FO have a constant cross-sectional area in a direction (e.g. the x-axis direction and the z-axis direction) perpendicular to the direction (e.g. the y-axis direction) in which the air flows.

On the other hand, the first flow path intermediate portion FII1 may include a portion, the cross-sectional area of which gradually decreases in the direction (e.g. the x-axis direction and the z-axis direction) perpendicular to the direction (e.g. the y-axis direction) in which the air flows as it goes toward the scattering portion SS, and the second flow path intermediate portion FII2 may include a portion, the cross-sectional area of which gradually increases in the direction (e.g. the x-axis direction and the z-axis direction) perpendicular to the direction (e.g. the y-axis direction) in which the air flows as it goes away from the scattering portion SS.

For example, as shown in FIGS. 5 and 6, the cross-sectional area of the first flow path intermediate portion FII1 may gradually decrease and thereafter be constant in the direction (e.g. the x-axis direction and the z-axis direction) perpendicular to the direction (e.g. the y-axis direction) in which the air flows as it goes toward the scattering portion SS, and the cross-sectional area of the second flow path intermediate portion FII2 may be constant and thereafter gradually increase in the direction (e.g. the x-axis direction and the z-axis direction) perpendicular to the direction (e.g. the y-axis direction) in which the air flows as it goes away from the scattering portion SS. Alternatively, unlike the configuration shown in FIGS. 5 and 6, the cross-sectional area of the first flow path intermediate portion FII1 may gradually and continuously decrease in the direction (e.g. the x-axis direction and the z-axis direction) perpendicular to the direction (e.g. the y-axis direction) in which the air flows as it goes toward the scattering portion SS, and the cross-sectional area of the second flow path intermediate portion FII2 may gradually and continuously increase in the direction (e.g. the x-axis direction and the z-axis direction) perpendicular to the direction (e.g. the y-axis direction) in which the air flows as it goes away from the scattering portion SS.

Further, unlike the configuration shown in FIGS. 3 and 4, the cross-sectional area of each of the flow path inlet portion FI and the flow path outlet portion FO may be greater than the cross-sectional area of the scattering portion SS in the direction (e.g. the x-axis direction and the z-axis direction) perpendicular to the direction (e.g. the y-axis direction) in which the air flows.

Further, in the flow path units 120A and 120B shown in FIGS. 4 and 6, when an open region in which the first flow path intermediate portion FII1 (or the second flow path intermediate portion FII2) and the scattering portion SS communicate with each other is defined as a second opening OP2, the area (e.g. the area in the x-axis and y-axis directions) of the first opening OP1 may be greater than the cross-sectional area of the second opening OP2 in the direction (e.g. the x-axis direction and the z-axis direction) perpendicular to the direction (e.g. the y-axis direction) in which the air flows.

For example, referring to FIGS. 4 and 6, when the length of the first opening OP1 in the x-axis direction and the length of the second opening OP2 in the x-axis direction are the same as each other, the width D1 of the first opening OP1 may be greater than the height D4 of the second opening OP2. Alternatively, referring to FIGS. 4 and 6, when the first opening OP1 has a circular planar shape and the second opening OP2 has a circular side cross-sectional shape, the diameter D1 of the first opening OP1 may be greater than the diameter D2 of the second opening OP2.

When the flow path unit 120B has a cross-sectional shape shown in FIGS. 5 and 6, a greater number of particles P pass through the flow path unit 120B due to a change in the cross-sectional area of the first and second flow path intermediate portions FII1 and FII2, thus making it possible to more accurately sense the particles P.

Figure 7:
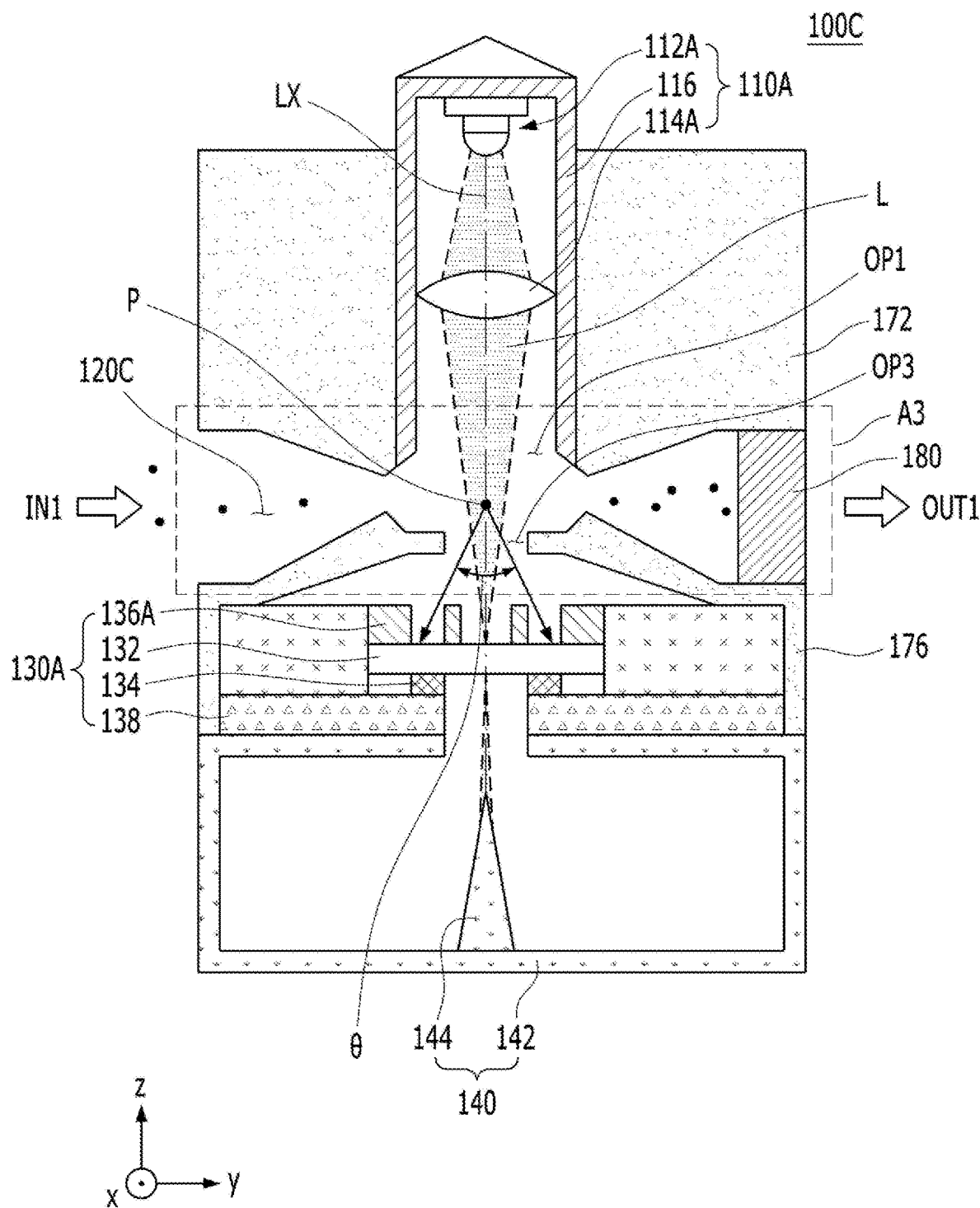
FIG. 7 is a cross-sectional view of still another embodiment of the particle-sensing device shown in FIG. 1.
Figure 8:
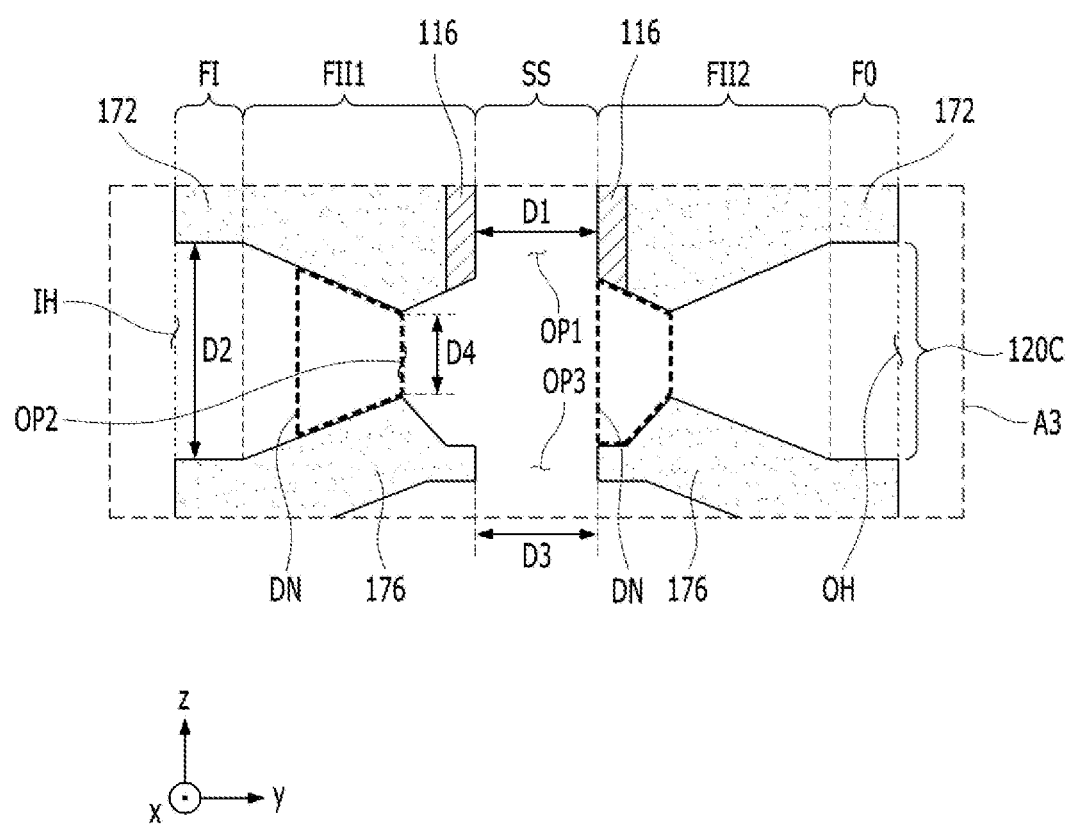
FIG. 8 is an enlarged cross-sectional view of portion 'A3' to explain the flow path unit shown in FIG. 7.

FIG. 7 is a cross-sectional view of still another embodiment 100C of the particle-sensing device 100 shown in FIG. 1, and FIG. 8 is an enlarged cross-sectional view of portion 'A3' to explain the flow path unit 120C shown in FIG. 7. For convenience of description, illustration of the fan 180 shown in FIG. 7 is omitted from FIG. 8.

The cross-sectional shape of the flow path unit 120A shown in FIG. 3 and the cross-sectional shape of the flow path unit 120C shown in FIG. 7 are different from each other. Except for this, since the particle-sensing device 100C shown in FIG. 7 is the same as the particle-sensing device 100A shown in FIG. 3, a duplicate explanation thereof will be omitted.

In the configuration shown in FIGS. 3 and 4, the flow path inlet portion FI, the first flow path intermediate portion FII1, the scattering portion SS, the second flow path intermediate portion FII2, and the flow path outlet portion FO have a constant cross-sectional area in a direction (e.g. the x-axis direction and the z-axis direction) perpendicular to the direction (e.g. the y-axis direction) in which the air flows.

On the other hand, in the configuration shown in FIGS. 7 and 8, the cross-sectional area of the first flow path intermediate portion FII1 may gradually decrease and thereafter increase in the direction (e.g. the x-axis direction and the z-axis direction) perpendicular to the direction (e.g. the y-axis direction) in which the air flows as it goes toward the scattering portion SS. Further, the cross-sectional area of the second flow path intermediate portion FII2 may gradually decrease and thereafter increase in the direction (e.g. the x-axis direction and the z-axis direction) perpendicular to the direction (e.g. the y-axis direction) in which the air flows as it goes away from the scattering portion SS.

Furthermore, in the first flow path intermediate portion FII1 (or the second flow path intermediate portion FII2) of the flow path unit 120C shown in FIG. 8, when an open region having the smallest cross-sectional area in a direction perpendicular to the direction in which the air flows is defined as a second opening OP2, the area (e.g. the area in the x-axis and y-axis directions) of the first opening OP1 may be greater than the cross-sectional area of the second opening OP2 in the direction (e.g. the x-axis direction and the z-axis direction) perpendicular to the direction (e.g. the y-axis direction) in which the air flows.

For example, referring to FIG. 8, when the length of the first opening OP1 in the x-axis direction and the length of the second opening OP2 in the x-axis direction are the same as each other, the width D1 of the first opening OP1 may be greater than the height D4 of the second opening OP2. Alternatively, referring to FIG. 8, when the first opening OP1 has a circular planar shape and the second opening OP2 has a circular side cross-sectional shape, the diameter D1 of the first opening OP1 may be greater than the diameter D4 of the second opening OP2.

For example, the height D4 of the second opening OP2 shown in FIGS. 4, 6 and 8 may be 10.0 mm or less, 6.0 mm or less, 4.0 mm or less, or 2.0 mm or less. However, the embodiment is not limited thereto. As described above, according to the embodiment, since the height D4 of the second opening OP2 is reduced, the overall size of the particle-sensing device 100A to 100C may be reduced.

Still further, in order to allow a greater number of particles to pass through the flow path unit 120 (120A, 1206 and 120C), the volume of the airflow passing through the flow path unit 120 should not be changed. To this end, as shown in FIGS. 7 and 8, in the case in which a double nozzle (DN) structure is formed using the second opening OP2, even when the volume of the airflow passing through the flow path unit 120C is changed, it is possible to adjust the flow rate of the air so as to facilitate the measurement, thereby increasing the accuracy in sensing the particles P. For example, since a bottleneck phenomenon is created by the double nozzle structure, a greater number of particles P may pass through the flow path unit 120C, thus increasing the accuracy in sensing the particles P.

The structure of each of the flow path units 120A, 120B and 120C shown in FIGS. 3 to 8 is just one example. That is, the embodiment is not limited as to the specific example of the flow path unit 120, as long as a large amount of air is capable of being introduced through the flow path units 120A, 120B and 120C.

Meanwhile, the light-receiving unit 130 may have various structures in order to accurately sense light scattered by the particle P. The light-receiving unit 130A shown in FIGS. 3, 5 and 7 corresponds to an embodiment of the light-receiving unit 130 shown in FIG. 1.

Figure 9:
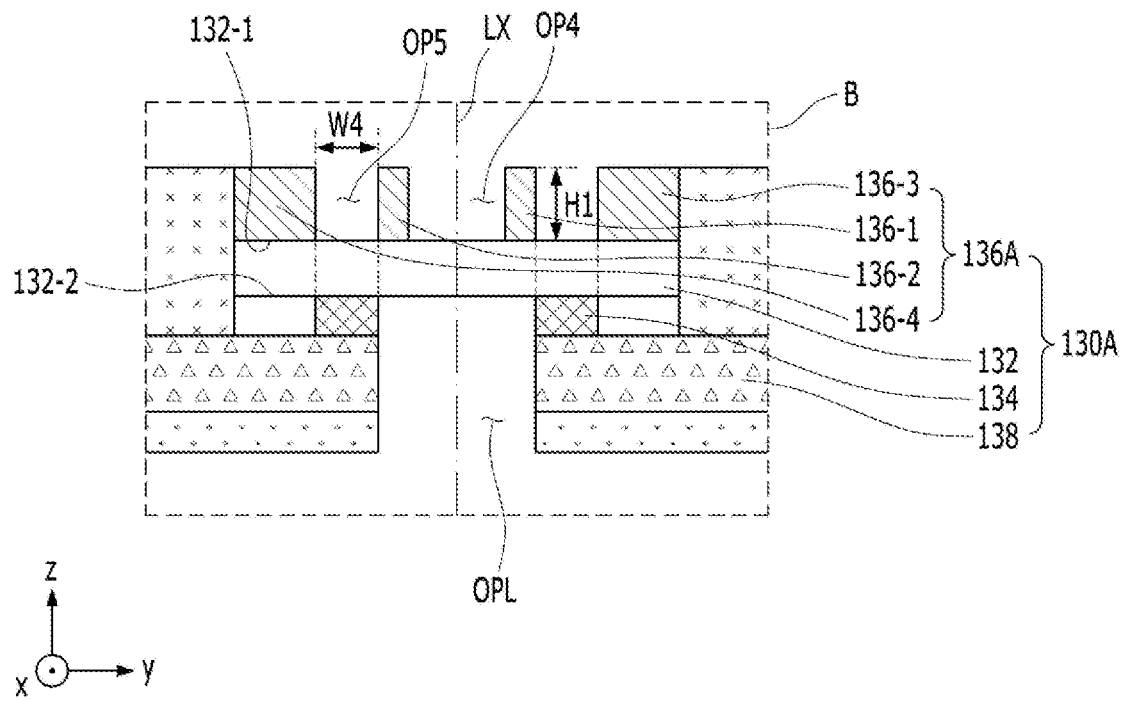
FIG. 9 is an enlarged cross-sectional view of portion 'B' shown in FIG. 3.

FIG. 9 is an enlarged cross-sectional view of portion 'B' shown in FIG. 3.

Referring to FIGS. 3 and 9, the light-receiving unit 130A may include a light-transmitting member 132 and a light-sensing part 134. In addition, the light-receiving unit 130A may further include a light guide part 136A. Depending on the embodiment, the light guide part 136A may be omitted.

The light-transmitting member 132 may be formed of a material capable of transmitting light, e.g. glass. The light-transmitting member 132 may include a first surface 132-1 and a second surface 132-2. The first surface 132-1 may correspond to the upper surface (i.e. the top surface) of the light-transmitting member 132, which faces the scattering portion SS, and the second surface 132-2 may correspond to the lower surface (i.e. the bottom surface) of the light-transmitting member 132, which is opposite the first surface 132-1.

The light-sensing part 134 and the light guide part 136A may be disposed around the optical axis of the light-transmitting member 132. The light-sensing part 134 and the light guide part 136A may be disposed on the opposite surfaces of the light-transmitting member 132, or may be disposed on the same surface of the light-transmitting member 132. For example, as shown in FIG. 9, the light-sensing part 134 may be disposed on the second surface 132-2 of the light-transmitting member 132, and the light guide part 136A may be disposed on the first surface 132-1 of the light-transmitting member 132. Alternatively, unlike the configuration shown in FIG. 9, the light-sensing part 134 may be disposed on the first surface 132-1 of the light-transmitting member 132, and the light guide part 136A may be disposed on the second surface 132-2 of the light-transmitting member 132. Alternatively, both the light-sensing part 134 and the light guide part 136A may be disposed on the first surface 132-1 or the second surface 132-2 of the light-transmitting member 132. For example, the light-sensing part 134 may be disposed between the inner partition walls 136-1 and 136-2 and the outer partition walls 136-3 and 136-4.

As described above, the light-sensing part 134 and the light guide part 136A may be disposed in various types, and the following description may be applied to any type.

The light-sensing part 134 may be disposed around the optical axis LX below (or above) the light-transmitting member 132, and may sense light that is incident thereon through a light incidence portion OP3 after being scattered by the particle P in the scattering portion SS. A description of the light incidence portion will be made later.

Figure 10A:
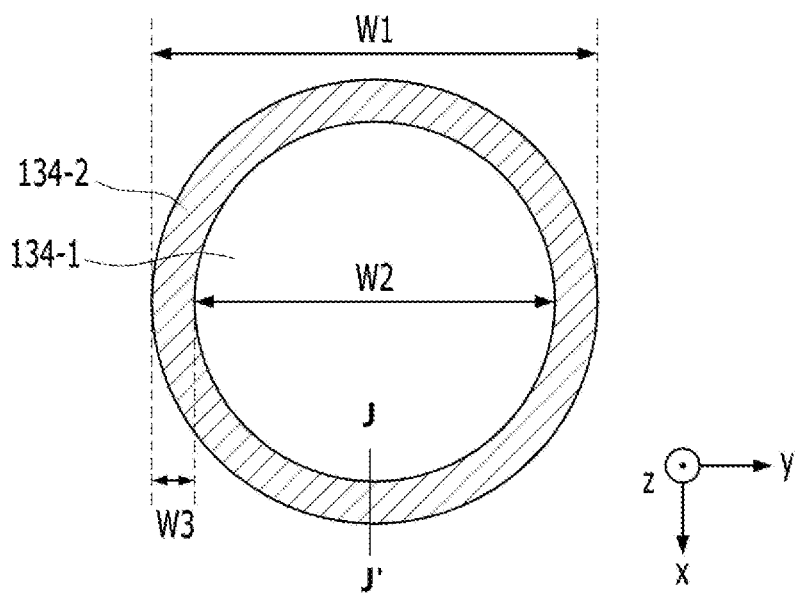
FIGS. 10a to 10d show planar shapes of examples of a light-sensing part shown in FIG. 9.
Figure 10B:
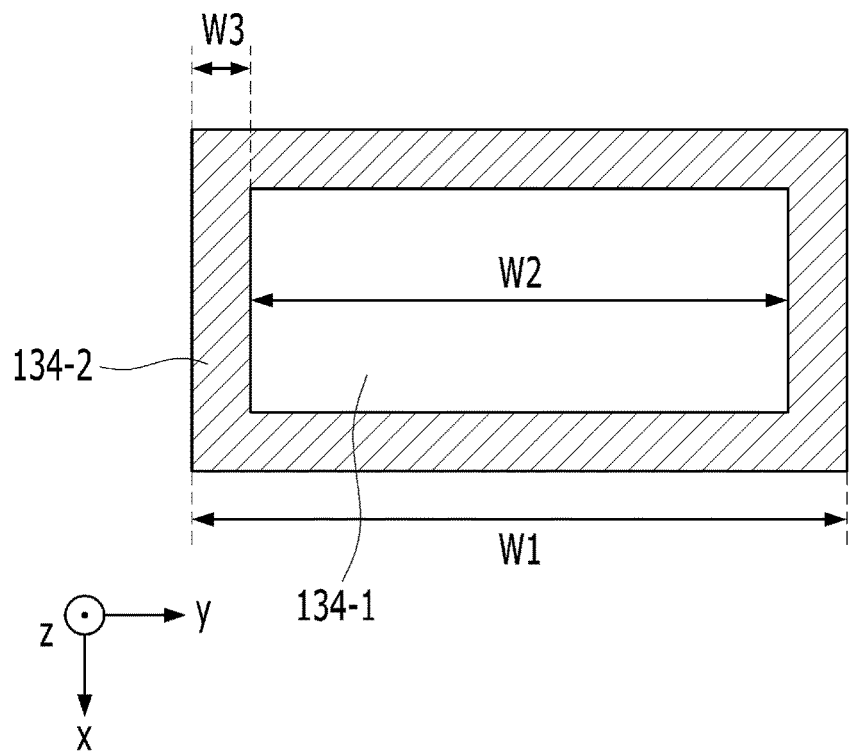
Figure 10C:
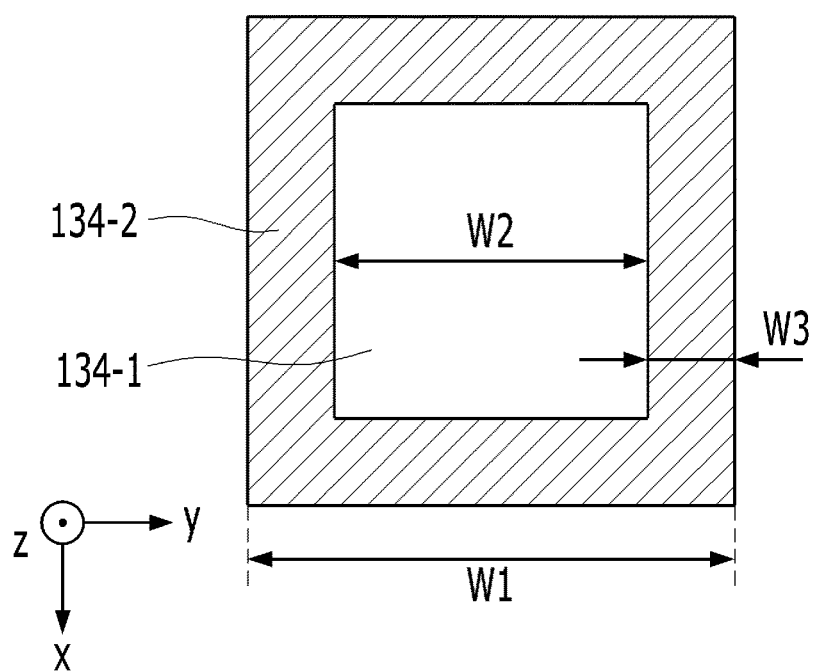
Figure 10D:
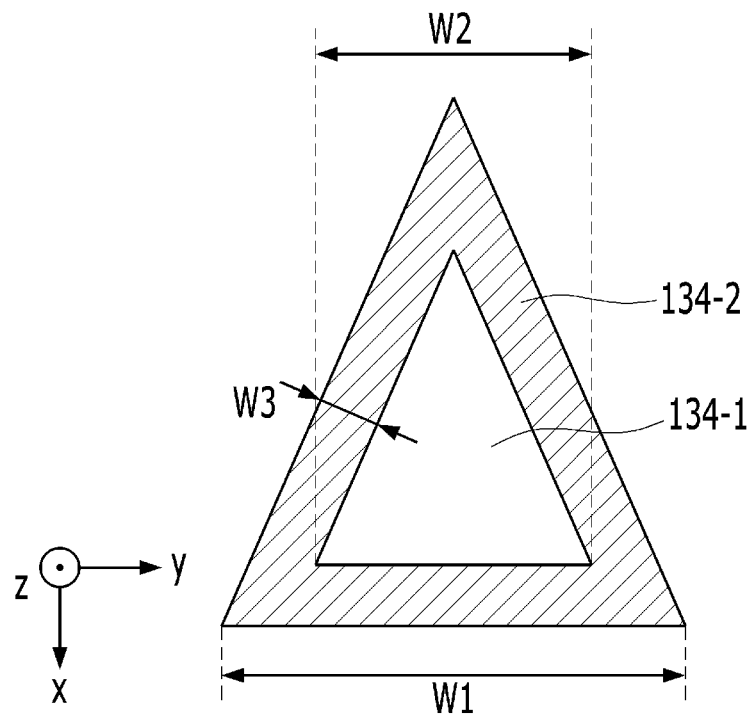
Figure 10E:
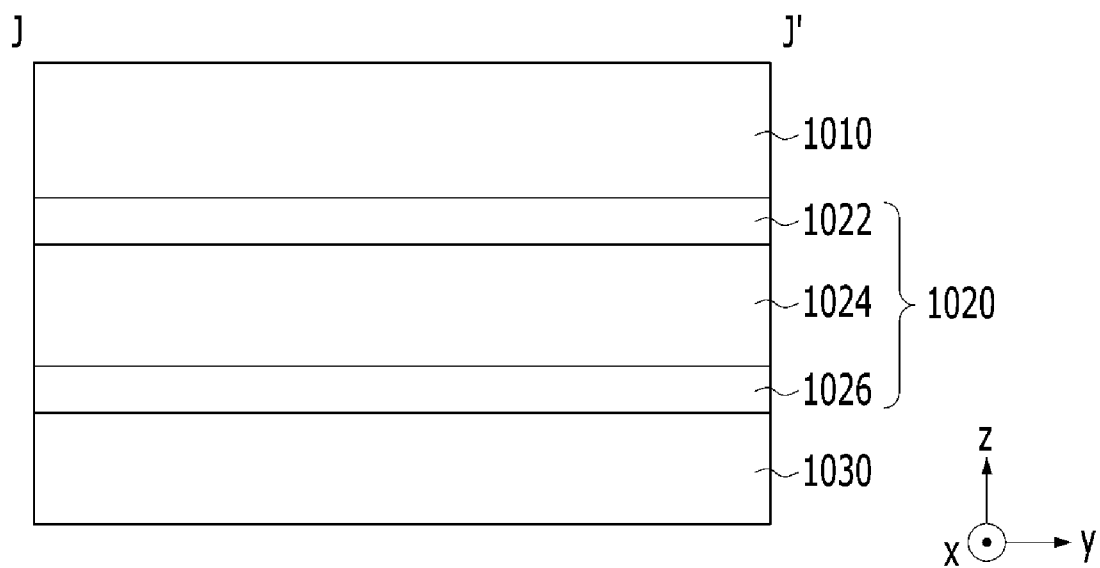

FIGS. 10a to 10d show planar shapes of examples of the light-sensing part shown in FIG. 9, and FIG. 10e is a cross-sectional view taken along line J-J' in the light-sensing part shown in FIG. 10a.

Referring to FIG. 10a, a light-sensing part 134A may include a photodiode 134-2. Further, a light-transmitting region 134-1 may be defined by the inner edge of the photodiode 134-2.

Further, referring to FIG. 10E, the photodiode 134-2 may include a first electrode 1010, a semiconductor layer 1020, and a second electrode 1030. The first electrode 1010, the semiconductor layer 1020, and the second electrode 1030 may at least partially overlap in the thickness direction (i.e. the Z-axis).

The semiconductor layer 1020 may be implemented such that a PN, PIN or Avalanche diode is disposed in the form of a thin film. In the case in which the semiconductor layer 1020 is implemented as a PIN diode, the semiconductor layer may include a P layer 1022, an active (intrinsic) layer 1024, and an N layer 1026. The P layer 1022 and the N layer 1026 may have a thickness of 15 to 20 nm in the Z-axis direction, and the active layer 1024 may have a thickness of 200 nm to 600 nm in the Z-axis direction. Further, the first electrode 1010 may have a light-transmitting property, and may include a material such as GAZO, GZO, or ITO. The second electrode 1030 may include a metal material such as Al, Ti, TiN, Ag, or Au. Therefore, the first electrode 1010 may be referred to as a "transparent electrode", and the second electrode 1030 may be referred to as a "metal electrode". The thickness of the first electrode 1010 and the second electrode 1030 in the Z-axis direction may range from 100 μm to 1 mm. Of course, the thicknesses of the respective layers described above are merely illustrative, and the embodiment is not limited thereto. The photodiode 134-2 having the above-described structure may be manufactured through a method such as deposition or printing.

Meanwhile, the light-transmitting member 132 may serve as a substrate for the photodiode 134-2. When the photodiode 134-2 is disposed on the second surface 132-2 of the light-transmitting member 132, the upper surface of the first electrode layer 1010 is brought into contact with the second surface 132-2 of the light-transmitting member 132. Alternatively, when the photodiode 134-2 is disposed on the first surface 132-1 of the light-transmitting member 132, the lower surface of the second electrode layer 1030 is brought into contact with the first surface 132-1 of the light-transmitting member 132.

The light-transmitting region 134-1 may be a region, which is located on the optical axis LX and on which the semiconductor layer 1020 and the second electrode 1030 of the photodiode 134-2 are not disposed in order to allow main light that has passed through the scattering portion SS to pass through the light-transmitting region and to travel to the light-absorbing unit 140. Depending on the embodiment, in the case in which the first electrode 1010 extends in the direction J (i.e. the optical-axis direction) in FIG. 10b, the light-transmitting region 134-1 may include at least a portion of the first electrode 1010. For example, in the case in which the first electrode extends to the optical axis and has a circular planar shape, the first electrode 1010 may be included in the entire light-transmitting region 134-1.

Further, the light-transmitting region 134-1 may cover a light entrance OPL of the light-absorbing unit 140. As such, in the case in which the light-transmitting region 134-1 covers the light entrance OPL, it is possible to prevent foreign substances from entering the light-absorbing unit 140 and to prevent the particle P that has passed through the scattering portion SS from entering the light-absorbing unit 140, thereby securing smooth flow of the particle P in the flow path unit 120 and reducing a measurement error.

Further, in the case in which the photodiode 134-2 is disposed on the second surface 132-2 of the light-transmitting member 132, it is possible to prevent the photodiode 132-2 from being damaged due to foreign substances.

The photodiode 134-2 is disposed around the light-transmitting region 134-1, and serves to sense the light scattered by the particle P. Here, when the photodiode 134-2 is disposed around the light-transmitting region 134-1, the photodiode 134-2 may be disposed so as to surround the entire outer side (periphery) of the light-transmitting region 134-1. However, the photodiode 134-2 does not necessarily surround the light-transmitting region in the form of a closed curve or a closed straight line, but may include one or more portions that are open toward the outside (e.g. regions between respective segments 134-21, 134-22, 134-23 and 134-24 shown in FIG. 17a, which will be described later).

The photodiode 134-2 corresponds to an active region absorbing light in the structure of a general photodiode. For example, the photodiode 134-2 may detect light in a wavelength band of 380 nm to 1100 nm. However, the embodiment is not limited as to the specific wavelength band that is capable of being detected by the photodiode 134-2. Further, in order to effectively sense scattered light, the photodiode 134-2 may have a sensitivity of 0.4 A/W at a wavelength band of 660 nm or a sensitivity of 0.3 A/W at a wavelength band of 450 nm. However, the embodiment is not limited thereto.

Referring to FIG. 10a, the width W1 of the light-sensing part 134A may range from 5 mm to 20 mm, e.g. from 7 mm and 15 mm, specifically from 8 mm and 10 mm. However, the embodiment is not limited thereto.

The width W2 of the light-transmitting region 134-1 may range from 3 mm to 18 mm, e.g. from 5 mm to 13 mm, specifically from 7 mm to 9 mm. However, the embodiment is not limited thereto.

Further, the planar width W3 of the photodiode 134-2 may range from 0.1 mm to 5 mm, e.g. from 1 mm to 3 mm, specifically from 1.5 mm to 2.5 mm. However, the embodiment is not limited thereto.

The planar shape of the photodiode 134-2 shown in FIG. 10a is an annular shape, i.e. a circular ring shape. However, the embodiment is not limited thereto. For example, the photodiode 134-2 may have various planar shapes, as long as the light-sensing part 134 is capable of including the light-transmitting region 134-1.

For example, as shown in FIGS. 10b to 10d, the planar shape of the photodiode 134-2 may be a polygonal ring shape. The planar shape of the photodiode 134-2 shown in FIG. 10b may be a rectangular ring shape, the planar shape of the photodiode 134-2 shown in FIG. 10c may be a square ring shape, and the planar shape of the photodiode 134-2 shown in FIG. 10d may be a triangular ring shape. Alternatively, although not illustrated, the planar shape of the photodiode 134-2 may be an elliptical ring shape.

Figure 11:
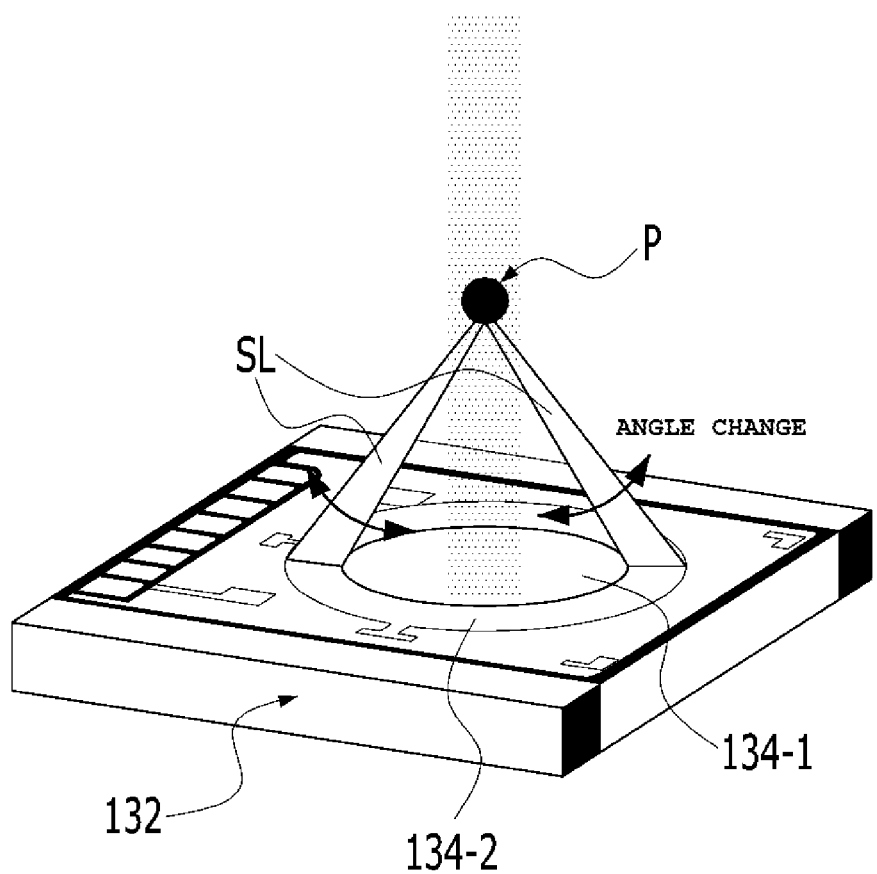

FIG. 11 is a perspective view illustrating an embodiment of detecting scattered light through the light-sensing part shown in FIG. 10a.

In the case in which the photodiode 134-2 having an annular planar shape shown in FIG. 10a is used, as shown in FIG. 11, the photodiode 134-2 may receive at least a portion SL of the scattered light that is scatted by the particle P.

The photodiode 134-2 may output a signal corresponding to the intensity of the received scattered light SL, and the information-analyzing unit 160 may perform size classification of particles using the intensity of the signal. This will be described below with reference to FIG. 12a.

Figure 12A:
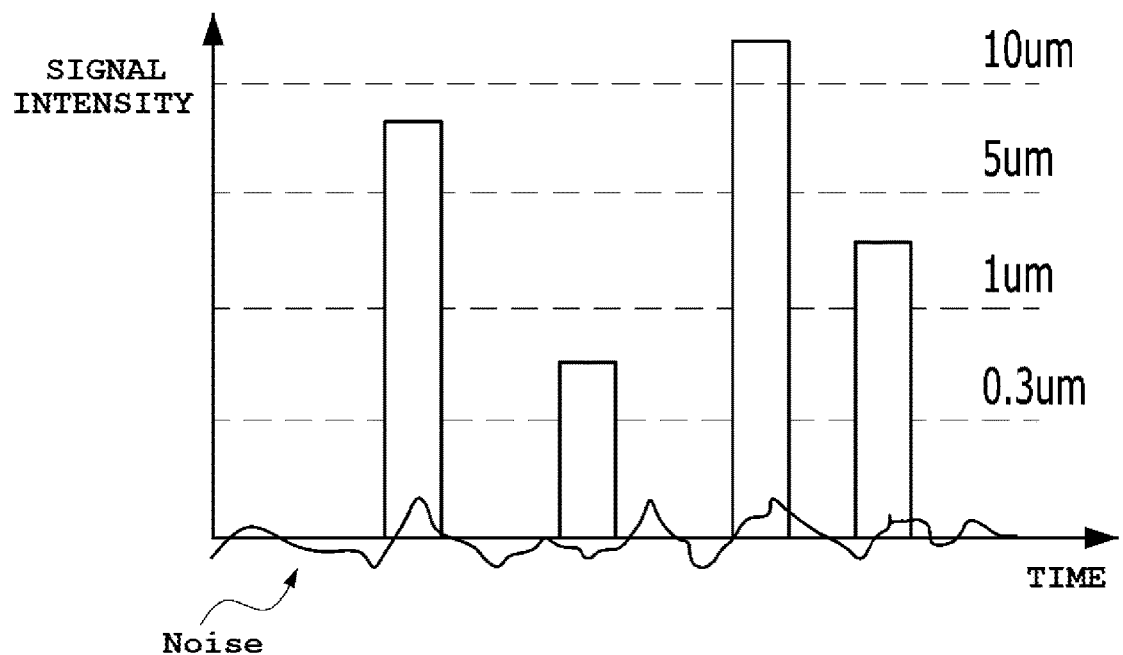
FIG. 12a shows an example of the process in which an information-analyzing unit performs size classification of particles through leveling.

FIG. 12a shows an example of the process in which the information-analyzing unit performs size classification of particles through leveling.

Referring to FIG. 12a, the information-analyzing unit 160 may classify the sizes of particles through leveling in accordance with a correspondence relationship between a predetermined intensity of signal and a particle size. This leveling is performed on the assumption that the intensity of signal and the size of a particle are proportional to each other.

However, in a forward scattering method, the intensity of signal and the size of a particle may not be always proportional to each other due to interference with backward scattering that occurs behind the particle (i.e. the direction oriented from the particle toward the light source) in accordance with the size of the particle. This will be described below with reference to FIG. 12b.

Figure 12B:
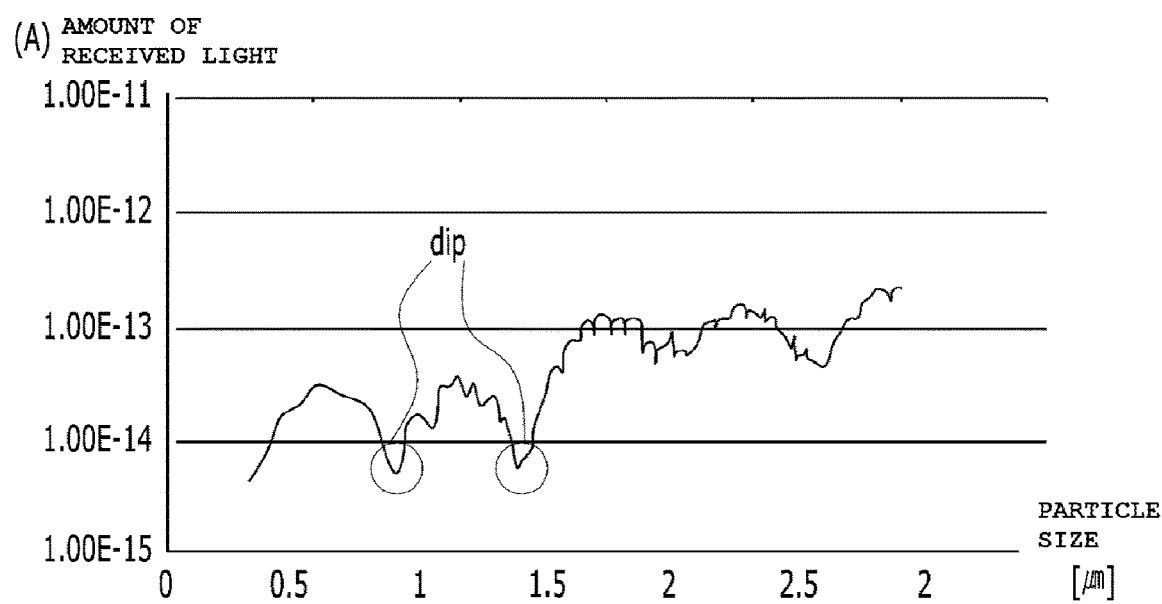
FIG. 12b is a graph showing an example of the relationship between a particle size and the amount of received light.

FIG. 12b is a graph showing an example of the relationship between the particle size and the amount of received light.

Referring to FIG. 12b, as the size of a particle increases from 0.5 µm to 3 µm, the amount of light received by the photodiode 134-2 generally increases. However, dip sections due to interference with backward scattering occur around 1 µm and around 1.5 µm. In other words, in the case in which two or more particle sizes correspond to the same amount of received light, the information-analyzing unit 160 may erroneously determine a particle size.

However, as described above with reference to FIGS. 2a to 2c, the profile of scattered light, i.e. the angle and intensity of scattered light changes depending on the size of the particle P. Therefore, on the basis of the relationship between a change in the profile of scattered light and a particle size, an embodiment of the disclosure proposes to determine the size of a particle by measuring the light, scattered by the same particle, at different positions and comparing the measurement results.

The structure of the light-receiving unit for measuring scattered light at different positions will now be described.

Figure 13A:
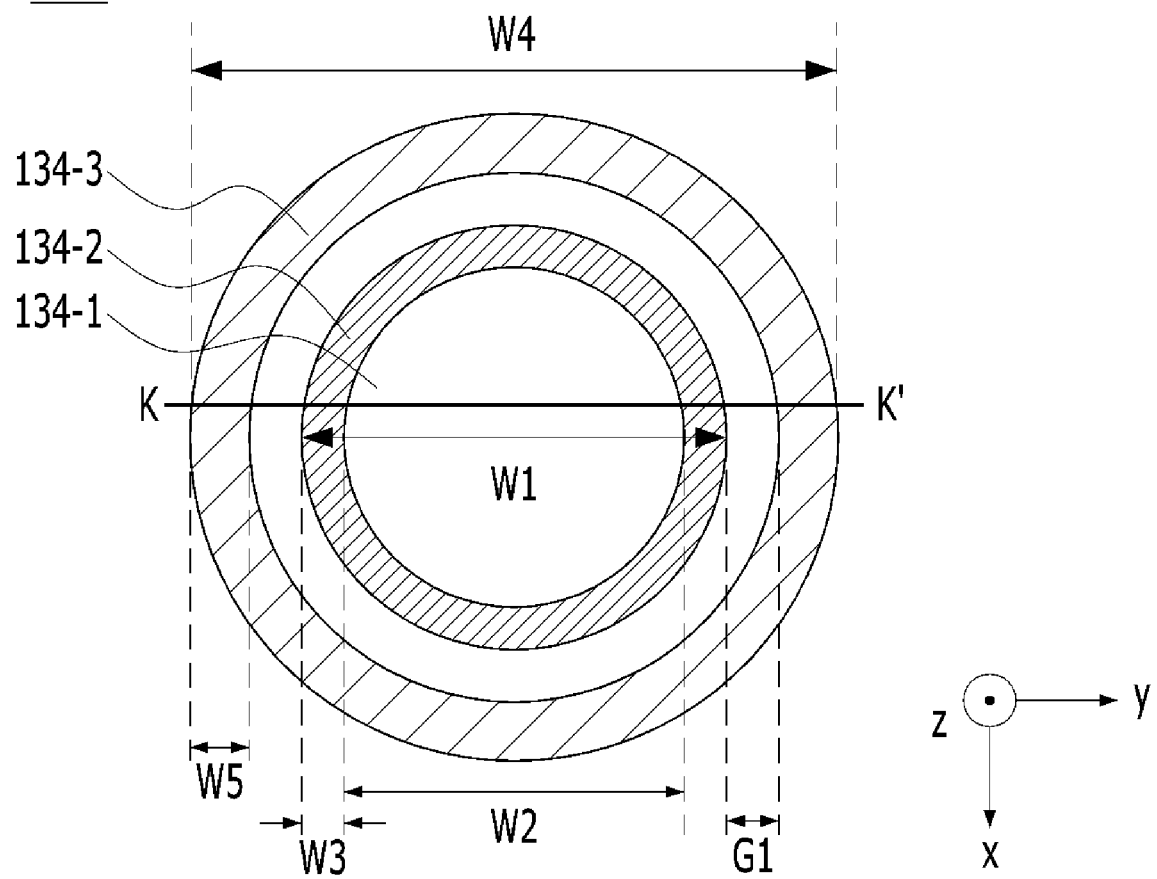

FIG. 13a shows a planar shape of another embodiment of the light-sensing part shown in FIG. 9.

Referring to FIG. 13a, a light-sensing part 134B according to this embodiment further includes a photodiode 134-3, which is disposed around the photodiode 134-2 defining the light-transmitting region 134-1 compared to the light-sensing part 134A shown in FIG. 11. In the following description, for the sake of convenience, the photodiode 134-2 defining the light-transmitting region 134-1 is referred to as a "first photodiode", and the photodiode 134-3 disposed around the first photodiode 134-2 is referred to as a "second photodiode". Here, since the photodiodes 134-2 and 134-3 may share one first electrode or may have respectively corresponding first electrodes, the planar shape shown in FIG. 13 may be considered to correspond to the planar shape of at least the semiconductor layer of each of the photodiodes 134-2 and 134-3.

Each of the first photodiode 134-2 and the second photodiode 134-3 may have an annular planar shape, and the outer edge of the first photodiode 134-2 and the inner edge of the second photodiode 134-3 may be spaced apart from each other by a predetermined distance G1. In this case, the first photodiode and the second photodiode may be formed so as to have a concentric circle shape when viewed in plan. Here, the optical axis may pass through the center of the concentric circle.

The outer diameter W1 and the width W3 of the first photodiode 134-2 may be the same as or different from the values described with reference to FIG. 10a. For example, the sizes of the respective portions of the photodiode may have values shown in Table 1 below. However, it is apparent to those skilled in the art that the embodiment is not limited thereto, but the respective portions of the photodiode may have various other sizes.

TABLE 1

| Length (mm) | Minimum Value | Maximum Value |
| --- | --- | --- |
| W1 | 2 | 8 |
| W2 | 1 | 6 |
| W3 | 0.5 | 3.5 |
| W4 | 4 | 10 |
| G1 | 0.2 | 1 |

Figure 13B:
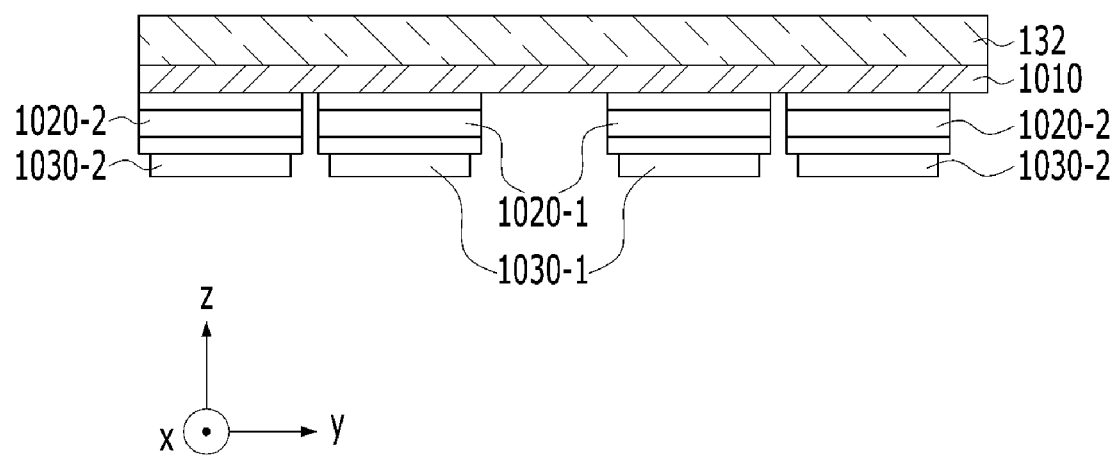
Figure 13C:
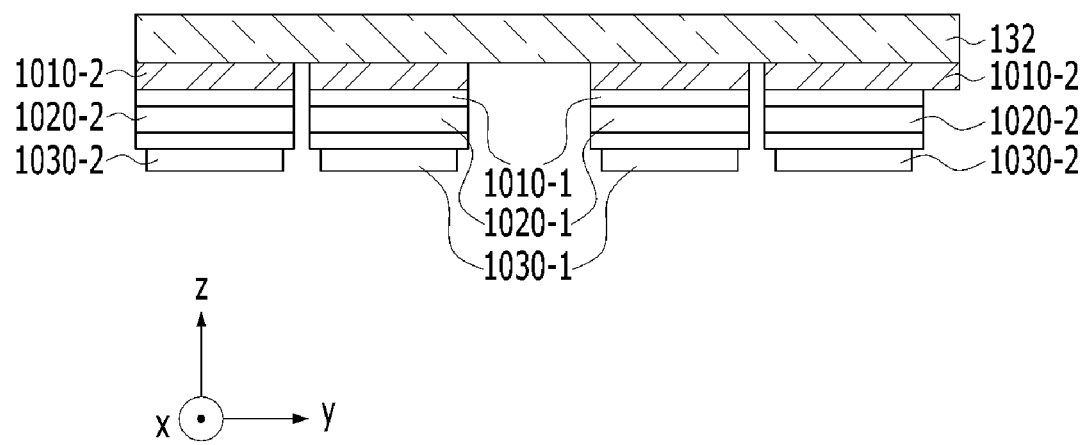

FIGS. 13b and 13c are cross-sectional views taken along line K-K' in the light-sensing part shown in FIG. 13a.

First, referring to FIG. 13b, the first photodiode 134-2 and the second photodiode 134-3 may have respectively corresponding semiconductor layers and respectively corresponding second electrodes, and may share one first electrode 1010. For example, the first photodiode 134-2 may include a first semiconductor layer 1020-1 and a 2-1st electrode 1030-1, which are disposed under the first electrode 1010. The second photodiode 134-3 may include a second semiconductor layer 1020-2 and a 2-2nd electrode 1030-2 under the same first electrode 1010.

Unlike the configuration shown in FIG. 13b, the first photodiode 134-2 and the second photodiode 134-3 may include respectively corresponding first electrode, as shown in FIG. 13c. For example, the first photodiode 134-2 may include a first semiconductor layer 1020-1 and a 2-1st electrode 1030-1, which are disposed under the 1-1st electrode 1010-1. The second photodiode 134-3 may include a second semiconductor layer 1020-2 and a 2-2nd electrode 1030-2, which are disposed under the 1-2nd electrode 1010-2. In the case in which the light-sensing part includes a plurality of photodiodes, the light-sensing part may include a portion, e.g. a bonding pad, at which bonding is performed so that each electrode is conductibly connected to the signal-converting unit 150 or to the information-analyzing unit 160. This will be described below with reference to FIG. 13d.

Figure 13D:
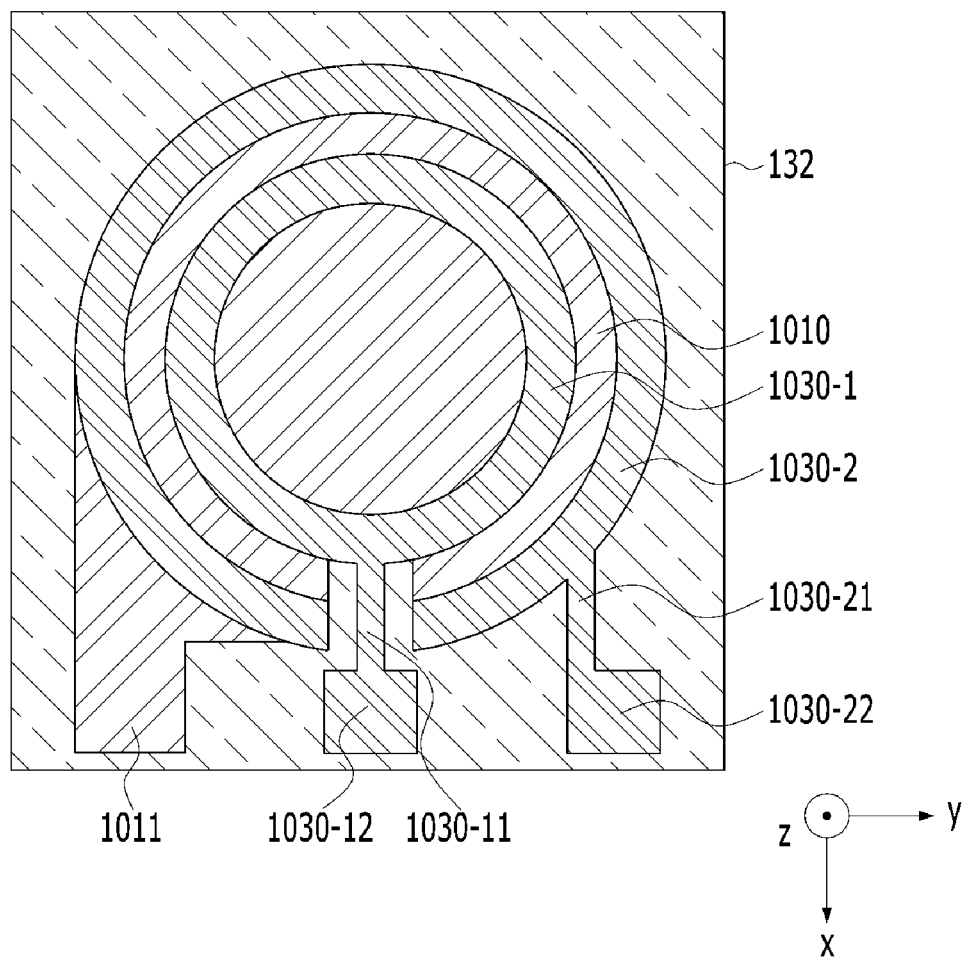
FIG. 13d shows a planar shape of the arrangement of electrodes according to an embodiment of the light-sensing part shown in FIG. 9.

FIG. 13d shows a planar shape of the arrangement of the electrodes according to an embodiment of the light-sensing part shown in FIG. 9. The planar shape shown in FIG. 13d corresponds to a configuration in which the light-sensing part has a cross-sectional shape shown in FIG. 13b, i.e. a configuration in which the first electrode is shared.

Referring to FIG. 13d, the first electrode 1010 and the 2-2nd electrode 1030-2 may respectively include a first bonding pad 1011, which extends to one edge region in the plane of the light-transmitting member 132, and a 2-2nd bonding pad 1030-22, which extends via a second extension portion 1030-21. However, it is difficult for the 2-1st electrode 1030-1 to be bent and extend to the edge of the light-transmitting member 132 so as to be spaced apart from the 2-2nd electrode 1030-2 in the Z-axis direction due to the 2-2nd electrode 1030-2, or it is difficult for the bonding pad with respect to the 2-1st electrode 1030-1 to extend to the edge region of the light-transmitting member 132 unless wire-bonding is performed. Therefore, in order to form the 2-1st electrode 1030-1 and a bonding pad with respect to the 2-1st electrode 1030-1 in a thin-film stacking manner, the 2-1st electrode 1030-1 should not be conductibly connected to the second photodiode 134-3. For example, to this end, as shown in FIG. 13d, the first electrode 1010, the second semiconductor layer 1020-2, and the 2-2nd electrode 1030-2 may not be disposed around a first extension portion 1030-11, which extends from the 2-1st electrode 1030-1 to the 2-1st bonding pad 1030-12. Alternatively, the first extension portion 1030-11 may be disposed on an insulation layer (not shown), which prevents conductible connection to the first electrode 1010 and to the second semiconductor layer 1020-2 or the 2-2nd electrode 1030-2 of the second photodiode 134-3.

Figure 14:
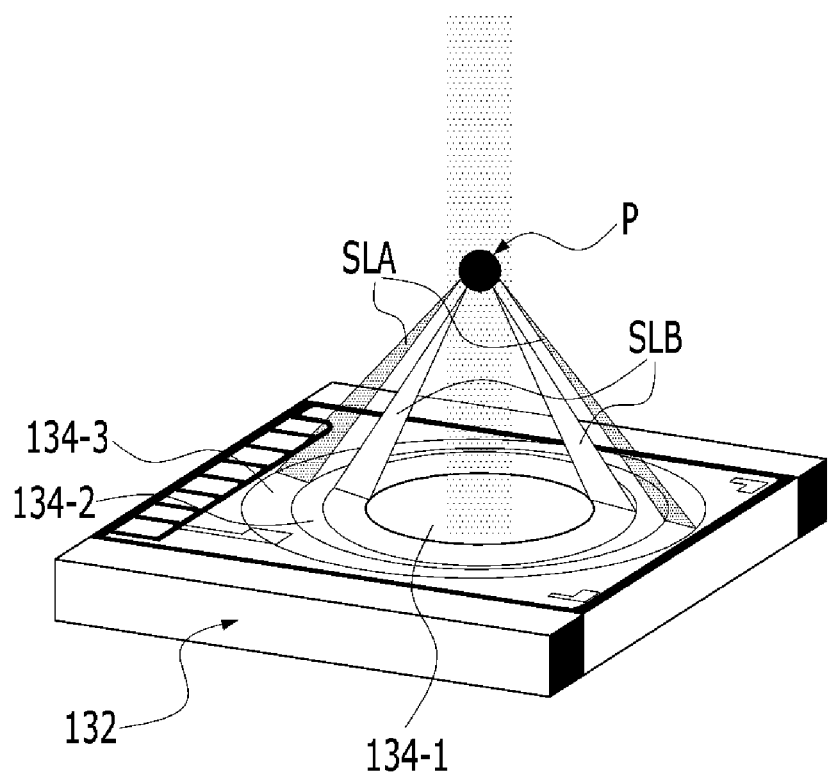

FIG. 14 is a perspective view illustrating an embodiment of detecting scattered light through the light-sensing part shown in FIG. 13a.

In the case in which a plurality of photodiodes is formed so as to have a concentric circle shape when viewed in plan as shown in FIG. 13a, a first scattered light portion SLB of the light scattered by the particle P is received by the first photodiode 134-2, and a second scattered light portion SLA of the scattered light is received by the second photodiode 134-3, as shown in FIG. 14. Here, the angle that is formed between the direction in which the first scattered light portion SLB travels and the optical axis of the light source is smaller than the angle that is formed between the direction in which the second scattered light portion SLA travels and the optical axis of the light source. Thus, in the case in which the profile of the scattered light is dispersed from the optical axis at a large angle in accordance with the size of the particle P, the intensity of the second scattered light portion SLA is relatively large. In the case in which the profile of the scattered light is dispersed from the optical axis at a small angle, the intensity of the second scattered light portion SLA is relatively small. The corresponding intensities of the output signals of the first photodiode 134-2 and the second photodiode 134-3 will be described below with reference to FIG. 15.

Figure 15:
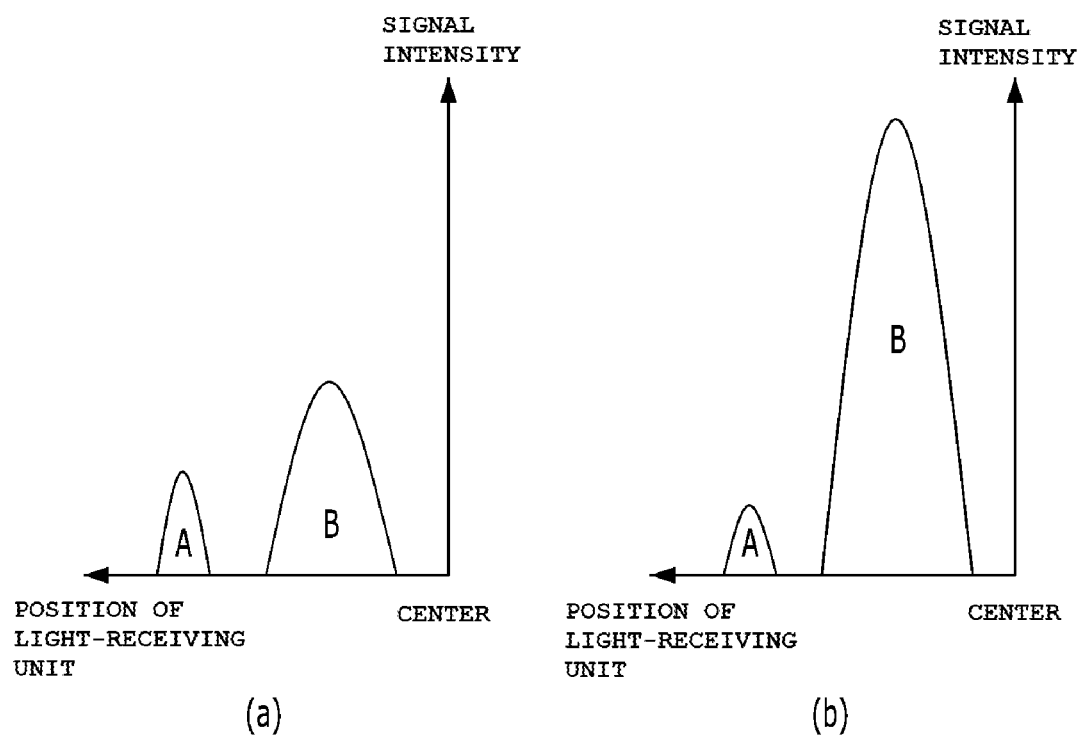
FIG. 15 shows an example of the relationship between the intensity of a signal output through the light-sensing part shown in FIG. 13a and the size of a particle.

FIG. 15 shows an example of the relationship between the intensity of a signal output through the light-sensing part shown in FIG. 13a and the size of a particle.

The particle size in the case shown in FIG. 15(a) is 0.3 μm, and the particle size in the case shown in FIG. 15(b) is 3 μm. Further, the profile of the scattered light according to each case corresponds to that shown in FIG. 2c. Furthermore, "A" in the graph indicates an output signal of the second photodiode 134-3, and "B" in the graph indicates an output signal of the first photodiode 134-2.

Comparing FIGS. 15(a) and 15(b), the value of "B" is greater than the value of "A" in common. However, the ratio of the value of "B" to the value of "A" when the particle size is 3 μm is greater than the ratio of the value of "B" to the value of "A" when the particle size is 0.3 μm.

Thus, the information-analyzing unit 160 determines the size of a particle using the value of "B", which has a relatively large intensity. As described above with reference to FIG. 12b, even when a plurality of particle sizes corresponds to the same amount of received light (i.e. the intensity of a signal), it is possible to determine the corresponding particle size among a plurality of particle sizes through the ratio of the value of "B" to the value of "A". Further, even when the quantity of light is reduced due to contamination of the optical system and deterioration of the light source and the amount of scattered light received by each photodiode 134-2/3 is reduced, if the particle size determination method according to the embodiment is applied, the ratio of the value of "B" to the value of "A" depending on the size of a particle is maintained, thereby correcting a measurement error due to a change in the amount of received light.

The magnitudes of the value of "B" and the value of "A" and the ratio thereof for each particle size will be described later in more detail with reference to FIGS. 27 to 29.

According to an embodiment, the light-sensing part may include photodiodes, the number of which is larger than the number of the photodiodes shown in FIG. 13, and may have a planar shape different from the concentric shape. This will be described below with reference to FIG. 16.

Figure 16:
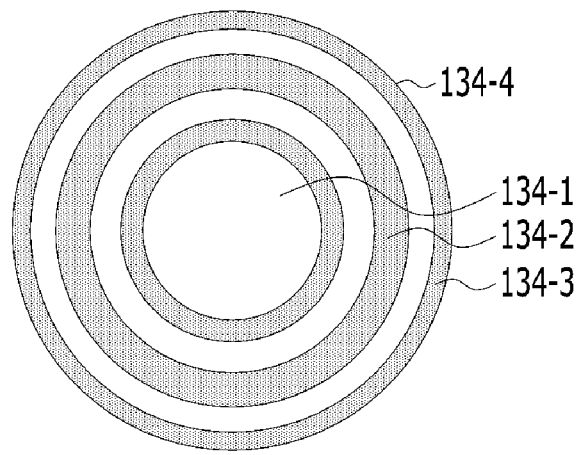
FIG. 16 shows planar shapes of still another embodiment of the light-sensing part shown in FIG. 9.
Figure 16:
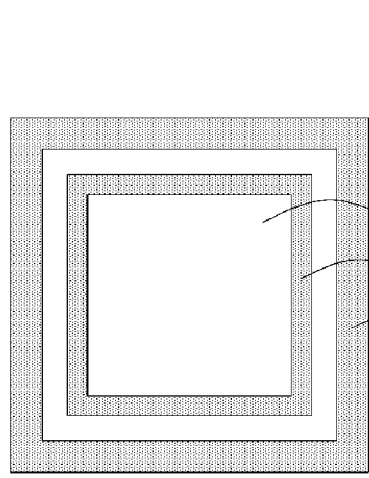
Figure 16:
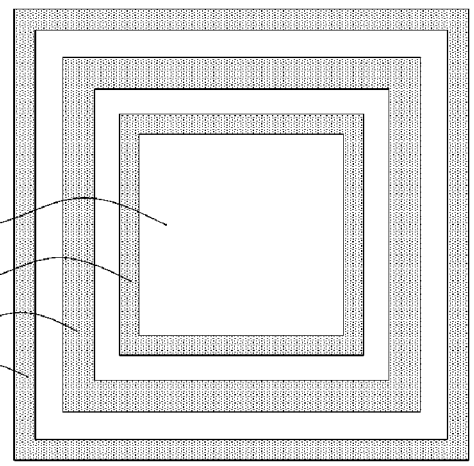

FIG. 16 shows planar shapes of still another embodiment of the light-sensing part shown in FIG. 9.

Referring to FIG. 16(a), the light-sensing part may include a first photodiode 134-2 disposed around the light-transmitting region 134-1, a second photodiode 134-3 disposed around the first photodiode 134-2, and a third photodiode 134-4 disposed around the second photodiode 134-3. Here, the photodiodes may be concentric with each other when viewed in plan. As such, when the third photodiode is additionally disposed, it is possible to more accurately correct the particle size through a ratio of the magnitudes of three different signal values with respect to the scattered light that is scattered by one particle.

Further, referring to FIG. 16(b), two photodiodes 134-2' and 134-3' are disposed in the light-sensing part, and the two photodiodes may have a polygonal ring shape having a common center when viewed in plan. Furthermore, as shown in FIG. 16(c), a photodiode 134-4' may be additionally disposed in the light-sensing part shown in FIG. 16(b) so that the light-sensing part includes three photodiodes. Of course, it is apparent to those skilled in the art that the number and the planar shape of the photodiodes are merely illustrative, and the embodiment is not limited thereto.

FIGS. 17a to 17e show planar shapes of still another embodiment of the light-sensing part shown in FIG. 9.

Each of the first photodiode 134-2 and the second photodiode 134-3 may include a plurality of sensing segments, which are spaced apart from each other in the same plane. For example, like the light-sensing part 134C shown in FIG. 17a, the first photodiode 134-2 may include a plurality of sensing segments 134-21, 134-22, 134-23 and 134-24, which are spaced apart from each other, and the second photodiode 134-3 may include a plurality of sensing segments 134-31, 134-32, 134-33 and 134-34, which are spaced apart from each other. Here, the gap G2 between the segments of the first photodiode 134-2 may be the same as or different from the gap G3 between the segments of the second photodiode 134-3. Further, the sensing segments 134-21, 134-22, 134-23, 134-24, 134-31, 134-32, 134-33 and 134-34 illustrated in FIG. 17a may be disposed so as to be spaced apart from each other at regular intervals or different intervals. For example, when the gap G2 between the sensing segments 134-21, 134-22, 134-23 and 134-24 of the first photodiode 134-2 increases, the signal level may increase, and freedom in design may increase. For example, the gap G may range from 0.01 mm to 1 mm, e.g. from 0.1 mm to 0.5 mm, specifically from 0.15 mm to 0.25 mm. However, the embodiment is not limited thereto.

Further, the sensing segments 134-21, 134-22, 134-23, 134-24, 134-31, 134-32, 134-33 and 134-34 may have the same planar area as each other, or may have different planar areas from each other.

Furthermore, each of the light-sensing parts 134A to 134C illustrated in FIGS. 10a, 13, 16, and 17a may be formed symmetrically when viewed in plan. However, the embodiment is not limited thereto. According to another embodiment, each of the light-sensing parts 134A to 134C may be formed asymmetrically when viewed in plan.

Still further, the sensing segments 134-21, 134-22, 134-23, 134-24, 134-31, 134-32, 134-33 and 134-34 may be disposed symmetrically or asymmetrically when viewed in plan.

FIGS. 17b to 17e show various planar shapes according to still another embodiment of the light-sensing part 134 shown in FIG. 9.

Figure 17A:
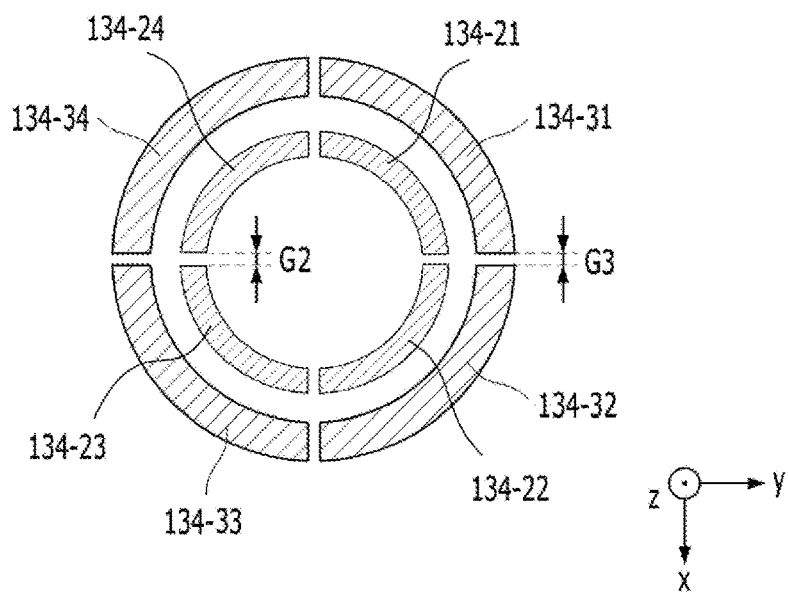
FIGS. 17a to 17e show planar shapes of still another embodiment of the light-sensing part shown in FIG. 9.
Figure 17B:
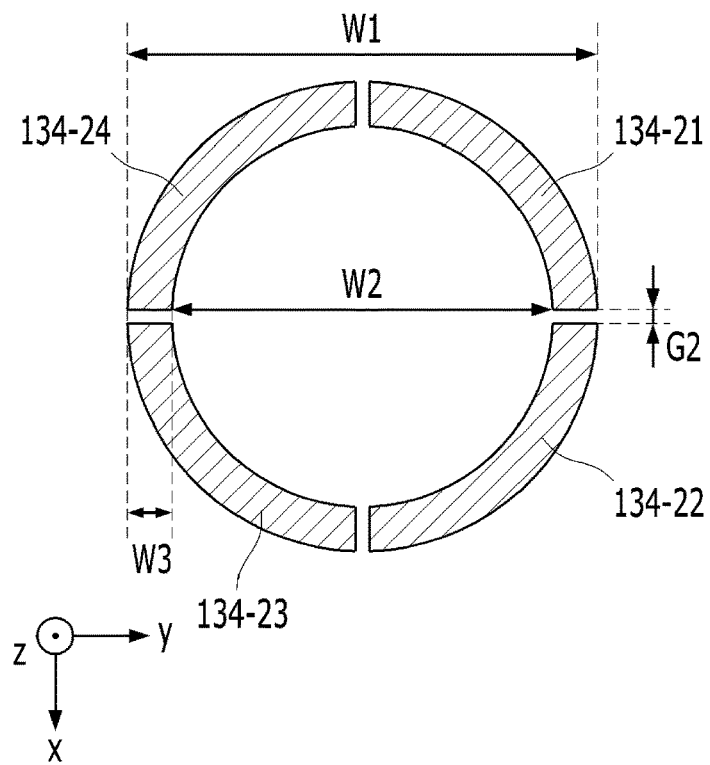
Figure 17C:
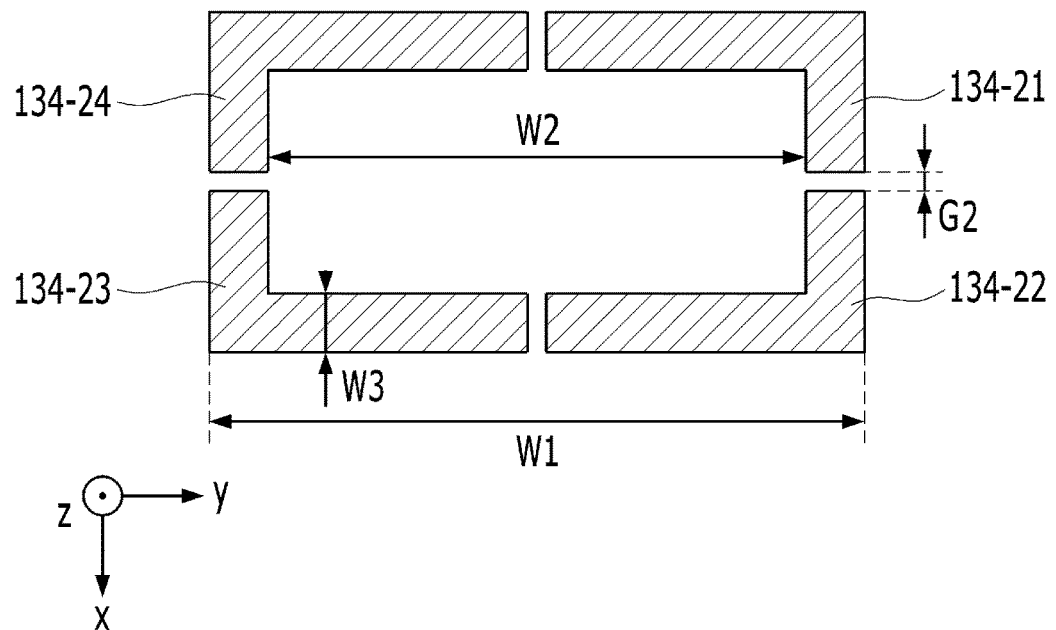
Figure 17D:
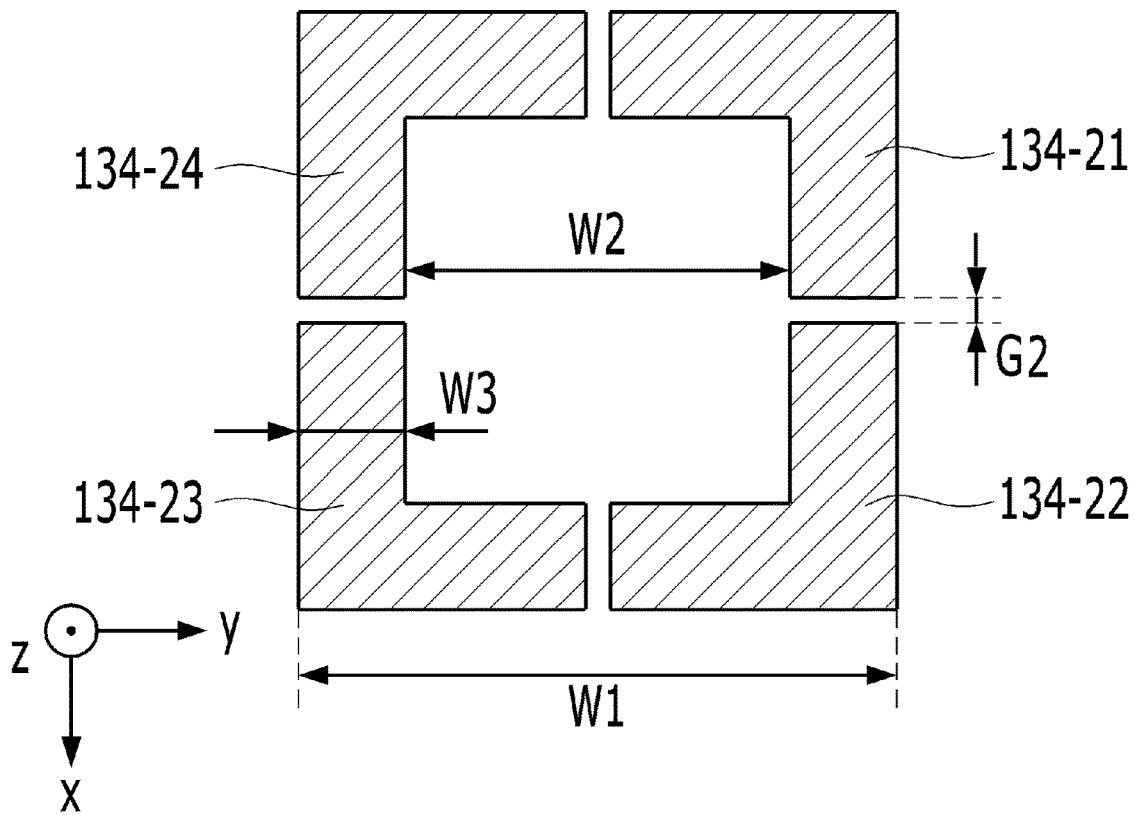
Figure 17E:
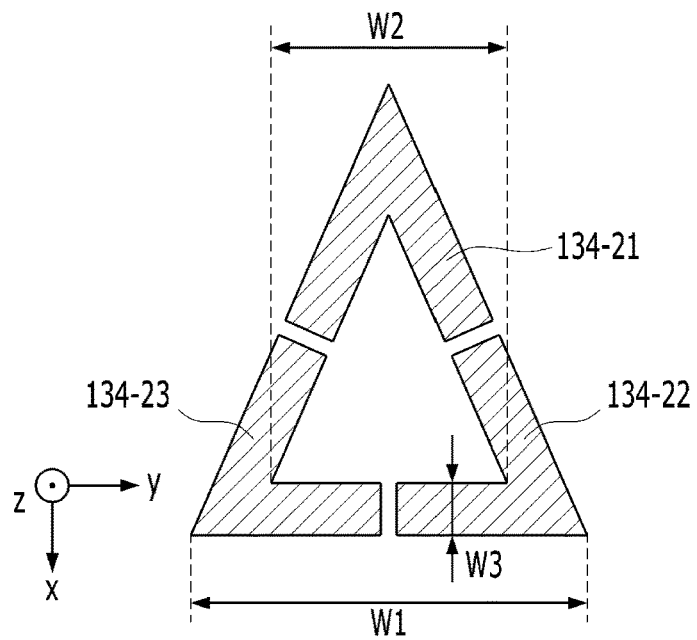

Each of a light-sensing part having a circular-ring-shaped plane shown in FIG. 17b, a light-sensing part having a rectangular-ring-shaped plane shown in FIG. 17c, a light-sensing part having a square-ring-shaped plane shown in FIG. 17d, and a light-sensing part having a triangular-ring-shaped plane shown in FIG. 17e may include a plurality of sensing segments 134-21, 134-22, 134-23 and 134-24, which are spaced apart from each other.

The description made above with reference to FIG. 10a may be applied to the size and the function of each of the photodiodes and each of the segments shown in FIGS. 13, 16 and 17a.

For example, like the first photodiode 134-2 and the second photodiode 134-3, each of the sensing segments 134-21, 134-22, 134-23, 134-24, 134-31, 134-32, 134-33 and 134-34 may detect light in a wavelength band of 380 nm to 1100 nm. However, the embodiment is not limited as to the specific wavelength band that is capable of being detected by the sensing segments 134-21, 134-22, 134-23, 134-24, 134-31, 134-32, 134-33 and 134-34. Further, in order to effectively sense scattered light, each of the sensing segments 134-21, 134-22, 134-23, 134-24, 134-31, 134-32, 134-33 and 134-34 may have a sensitivity of 0.4 A/W at a wavelength band of 660 nm or a sensitivity of 0.3 A/W at a wavelength band of 450 nm. However, the embodiment is not limited thereto.

Although not illustrated, the photodiodes included in each of the light-sensing parts shown in FIG. 16 may be divided into a plurality of segments like those shown in FIG. 17a.

As illustrated in FIG. 17a, when the first photodiode 134-2 and the second photodiode 134-3 are configured such that the sensing segments 134-21, 134-22, 134-23, 134-24, 134-31, 134-32, 134-33 and 134-34 are spaced apart from each other, the information-analyzing unit 160 may predict the shape of a particle using the relative intensity sensed by each of the sensing segments 134-21, 134-22, 134-23, 134-24, 134-31, 134-32, 134-33 and 134-34.

Figure 18A:
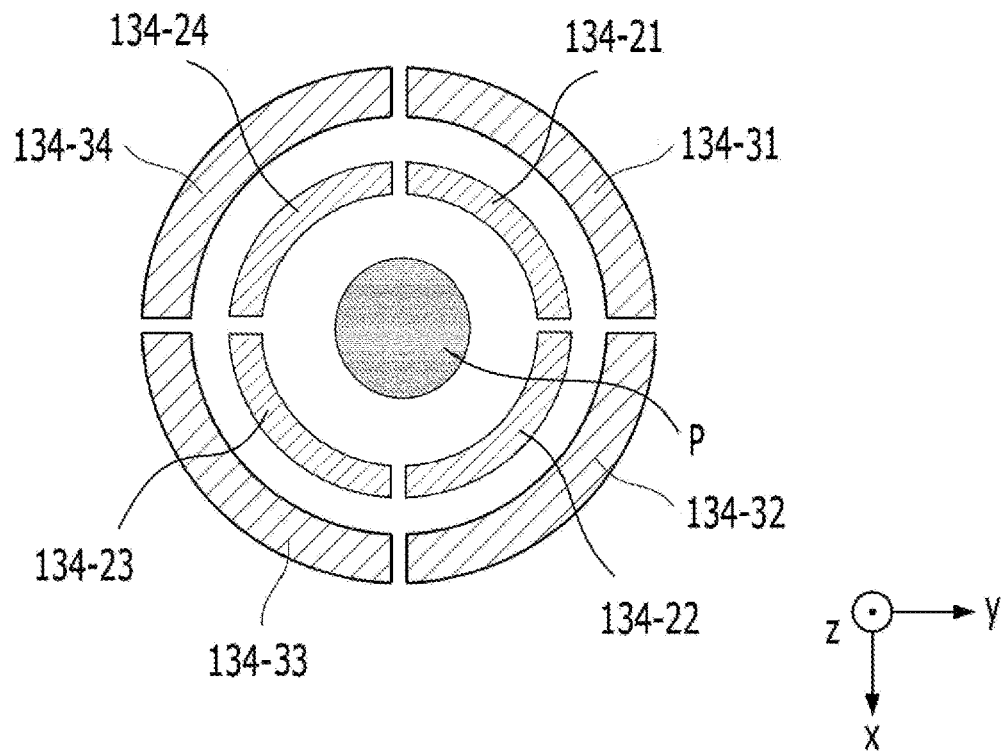
FIGS. 18a and 18b are views showing the prediction of the shape of a particle using a plurality of sensing segments.
Figure 18B:
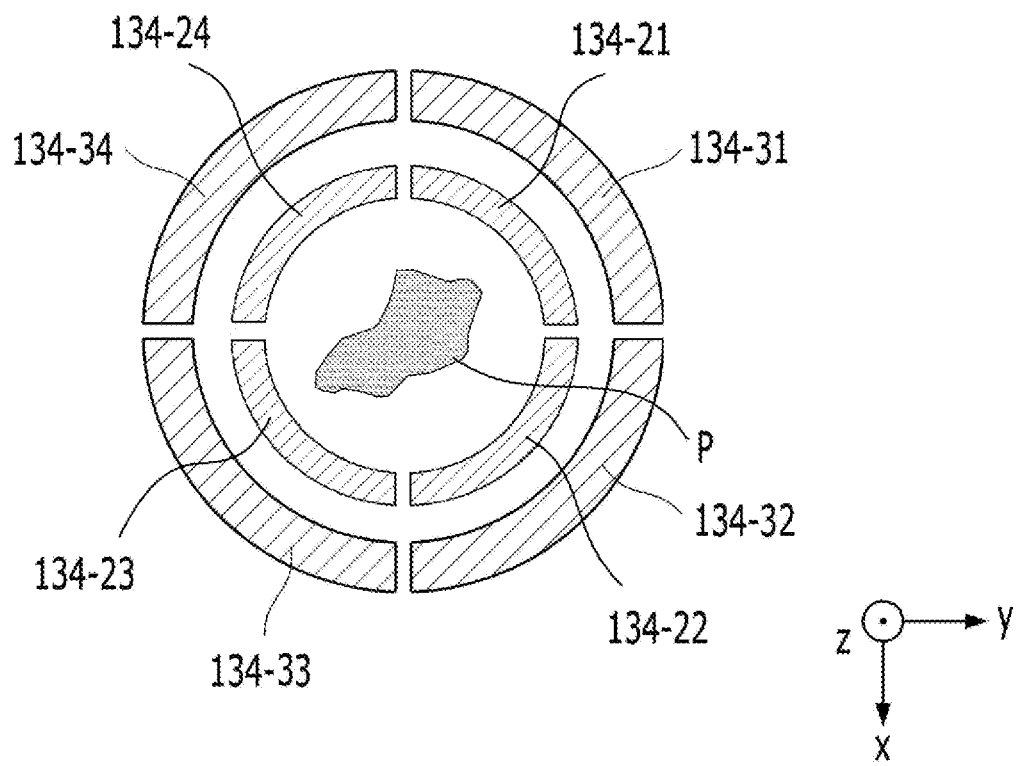

FIGS. 18a and 18b are views showing the prediction of the shape of the particle P using the sensing segments 134-21, 134-22, 134-23, 134-24, 134-31, 134-32, 134-33 and 134-34.

Referring to FIG. 18a, when the particle P has a symmetrical shape, e.g. a spherical shape, the intensities of scattered light sensed by the sensing segments 134-21, 134-22, 134-23 and 134-24 or the sensing segments 134-31, 134-32, 134-33 and 134-34, which are located at the same distance from the optical axis (or the light-transmitting region), are the same as each other. As such, when the intensities of light sensed by the sensing segments 134-21, 134-22, 134-23 and 134-24 or the sensing segments 134-31, 134-32, 134-33 and 134-34 are the same as each other, the information-analyzing unit 160 may determine that the particle P has a symmetrical shape.

On the other hand, referring to FIG. 18b, when the particle P has an asymmetrical shape, e.g. a non-spherical shape, the intensities of scattered light sensed by the sensing segments 134-21, 134-22, 134-23 and 134-24 or the sensing segments 134-31, 134-32, 134-33 and 134-34, which are located at the same distance from the optical axis (or the light-transmitting region), are different from each other. As such, when the intensities of light sensed by the sensing segments 134-21, 134-22, 134-23 and 134-24 or the sensing segments 134-31, 134-32, 134-33 and 134-34 are different from each other, the information-analyzing unit 160 may determine that the particle P has an asymmetrical shape.

The method of predicting the shape of the particle P described with reference to FIGS. 18a and 18b may also be applied to the light-sensing part shown in FIGS. 17b to 17e in a similar manner.

Of course, the divided shape and the number of the sensing segments may vary in order to predict various shapes of the particle.

Like the light source 112A of the light-emitting unit 110A, the photodiodes 134-2 to 134-3' and 134-21 to 134-34' of the above-described light-receiving unit 130A may be packaged in an SMD type or a lead type. However, the embodiment is not limited as to the specific packaging type of the photodiodes 134-2 to 134-3' and 134-21 to 134-34'.

Meanwhile, the light incidence portion may be disposed between the scattering portion SS and the light-receiving unit 130A, and may serve to adjust the amount of light incident on the light-receiving unit 130A. To this end, as shown in FIGS. 3, 5 and 7, the light incidence portion may include a third opening OP3 disposed on the optical axis LX.

The third opening OP3 may have an area (e.g. an area in the x-axis and y-axis directions) suitable to allow 20% to 80% of the total amount of light scattered by the particle P in the scattering portion SS to be incident on the light-receiving unit 130A.

For example, in the case in which the angle from the center of the scattering portion SS to a fifth opening OP5, which will be described later, is 12° in the left and right with respect to the optical axis LX, i.e. when a predetermined angle θ shown in FIGS. 3, 5 and 7 is 24°, 20% of the total amount of light scattered by the particle P in the scattering portion SS may be incident on the light-receiving unit 130A. In the case in which the predetermined angle θ is 60° (i.e. 30° in the left and right with respect to the optical axis LX), 50% of the total amount of light scattered by the particle P in the scattering portion SS may be incident on the light-receiving unit 130A. Considering this, according to the embodiment, the third opening OP3 may have an area suitable for a portion of the light scattered by the particle P, which is located within a range of a certain angle in the left and right with respect to the optical axis LX, i.e. the predetermined angle θ of 24° to 60°, e.g. a range of 30° in the left and right with respect to the optical axis LX, to be incident on the light-receiving unit 130A. As a result, it is possible to adjust the amount of light incident on the light-receiving unit 130A by adjusting the area of the third opening OP3.

Further, referring to FIGS. 4, 6 and 8, the area of the third opening OP3 (e.g. the area in the x-axis and y-axis directions) may be different from the area of the first opening OP1

(e.g. the area in the x-axis and y-axis directions). For example, when the third opening OP3 has a circular planar shape and when the diameter D3 of the third opening OP3 exceeds 10 mm, the photodiodes 134-2 and 134-21 to 134-24 receive a relatively large amount of scattered light, leading to the occurrence of optical noise. Further, when the diameter D3 of the third opening OP3 is less than 2 mm, the photodiodes 134-2 and 134-21 to 134-24 receive a relatively small amount of scattered light, whereby the intensity of a signal sensed by the photodiodes 134-2 and 134-21 to 134-24 may be small. Thus, the diameter D3 of the third opening OP3 may be 2 mm to 10 mm. However, the embodiment is not limited thereto.

Further, as illustrated in FIGS. 6 and 8, the cross-sectional area of each of the inlet hole IH and the outlet hole OH may be greater than the area of the first opening OP1 and may be greater than the cross-sectional area of the second opening OP2 in a direction (e.g. the x-axis direction and the z-axis direction) perpendicular to the direction (e.g. the y-axis direction) in which the air flows.

Alternatively, the maximum cross-sectional area of each of the first path in the flow path inlet portion FI and the second path in the flow path outlet portion FO may be greater than the area of the first opening OP1 and may be greater than the cross-sectional area of the second opening OP2 in a direction (e.g. the x-axis direction and the z-axis direction) perpendicular to the direction (e.g. the y-axis direction) in which the air flows.

For example, when the x-axis length of each of the inlet hole IH and the outlet hole OH is the same as the x-axis length of each of the first opening OP1 and the second opening OP2, the height D2 of each of the inlet hole IH and the outlet hole OH in the z-axis direction may be greater than the width D1 of the first opening OP1 in the y-axis direction, and may be greater than the height D4 of the second opening OP2 in the z-axis direction.

Further, for example, when each of the flow path inlet portion FI, the flow path outlet portion FO, and the second opening OP2 has a circular side cross-sectional shape and when the first opening OP1 has a circular planar shape, the diameter D2 of each of the inlet hole IH and the outlet hole OH may be greater than the diameter D1 of the first opening OP1 and may be greater than the diameter D4 of the second opening OP2.

Alternatively, for example, when the x-axis length of each of the inlet hole IH and the outlet hole OH is the same as the x-axis length of each of the first opening OP1 and the second opening OP2, the maximum height of each of the first path and the second path in the z-axis direction may be greater than the width D1 of the first opening OP1 in the y-axis direction and may be greater than the height D4 of the second opening OP2 in the z-axis direction.

Further, for example, when each of the flow path inlet portion FI, the flow path outlet portion FO, and the second opening OP2 has a circular side cross-sectional shape and when the first opening OP1 has a circular planar shape, the maximum diameter of each of the first path and the second path may be greater than the diameter D1 of the first opening OP1 and may be greater than the diameter D4 of the second opening OP2.

Meanwhile, referring again to FIG. 9, the light guide part 136A serves to guide the light scattered in the scattering portion SS to the light-sensing part 134. To this end, for example, the light guide part 136A may include inner partition walls 136-1 and 136-2 and outer partition walls 136-3 and 136-4. In the case in which the inner partition walls 136-1 and 136-2 have a circular planar shape, the inner partition walls 136-1 and 136-2 may have a unitary configuration. In the case in which the outer partition walls 136-3 and 136-4 have a circular planar shape, the outer partition walls 136-3 and 136-4 may have a unitary configuration.

The inner partition walls 136-1 and 136-2 may define a fourth opening OP4, which overlaps the light entrance OPL of the light-absorbing unit 140 in a direction (e.g. the z-axis direction) parallel to the optical axis LX. The inner partition walls 136-1 and 136-2 may have a height H1 such that the scattered light that has passed through the third opening OP3 travels to the fifth opening OP5 and such that the main light that has passed through the third opening OP3 travels to the fourth opening OP4. That is, the inner partition walls 136-1 and 136-2 serve to separate the main light and the scattered light from each other.

The outer partition walls 136-3 and 136-4 may define the fifth opening OP5, which overlaps the photodiode 134-2 in a direction (e.g. the z-axis direction) parallel to the optical axis LX, together with the inner partition walls 136-1 and 136-2.

The width W4 of the fifth opening OP5 may range from 2 mm to 6 mm. However, the embodiment is not limited thereto.

When the inner partition walls 136-1 and 136-2 and the outer partition walls 136-3 and 136-4 are disposed as described above, the scattered light incident on the third opening OP3 may travel to the photodiode 134-2 of the light-sensing part 134, and the main light incident on the third opening OP3 may travel to the light-absorbing unit 140, as indicated by the arrows in FIG. 3.

Meanwhile, the light-receiving unit 130A may further include a sensing support part 138. Depending on the embodiment, the sensing support part 138 may be omitted.

The sensing support part 138 serves to support the light-sensing part 134. As shown in FIG. 3, the sensing support part may be provided separately from the bottom portion 176 of the housing 170. Alternatively, unlike the illustrated configuration, the sensing support part may be integrally formed with the bottom portion 176 of the housing 170.

Meanwhile, according to an embodiment, as shown in FIG. 3, the light-absorbing unit 140 may include an absorption case 142 and a protruding portion 144. The absorption case 142 defines the light entrance OPL, on which the light that has passed through the light-receiving unit 130A is incident, and serves to receive the main light that has passed through the light-receiving unit 130A. To this end, the inner wall of the absorption case 142 may be coated with a material having a light-absorbing property. In FIG. 3, the absorption case 142 and the bottom portion 176 of the housing 170 are illustrated as being provided separately from each other. However, the embodiment is not limited thereto. That is, like a particle-sensing device 100D, which will be described later, the bottom portion 176 of the housing 170 and the absorption case 142 may be integrally formed with each other. That is, the bottom portion 176 of the housing 170 may also serve as the absorption case 142.

Further, the protruding portion 144 may protrude from the bottom surface of the absorption case 142 toward the light entrance OPL. Furthermore, the width of the protruding portion 144 may gradually decrease from the bottom surface of the absorption case 142 toward the light entrance OPL. For example, as illustrated in FIG. 3, the protruding portion 144 may have a circular (conical) cross-sectional shape. However, the embodiment is not limited thereto. As such, when the protruding portion 144 is disposed, the main light incident on the light entrance OPL is prevented from being reflected by the inner wall of the absorption case 142 and escaping through the light entrance OPL, and the main light incident through the light entrance OPL is reflected toward the inner wall of the absorption case 142, thereby increasing the absorption rate of the main light incident on the light entrance OPL.

Figure 19:
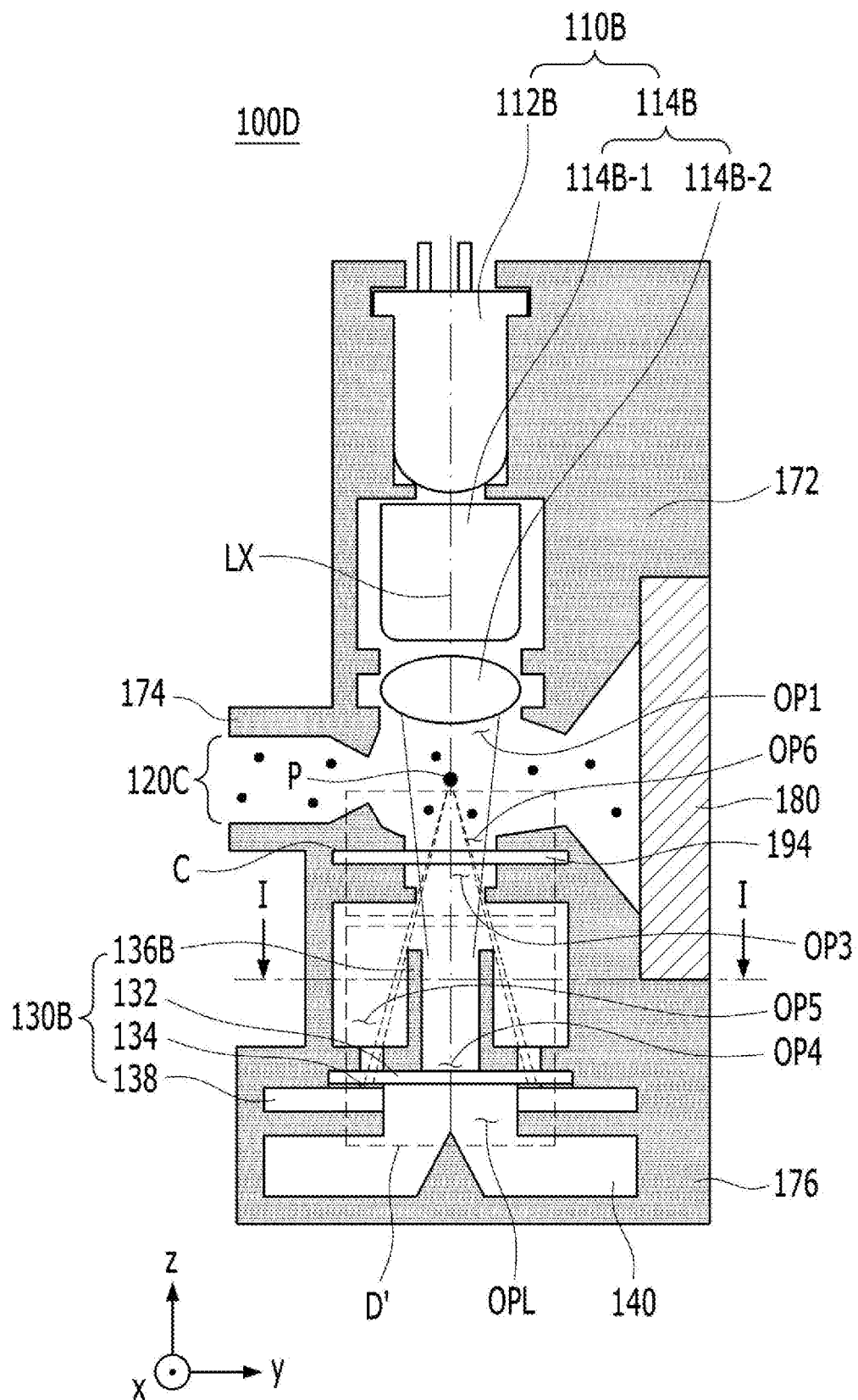
FIG. 19 is a cross-sectional view of still another embodiment of the particle-sensing device shown in FIG. 1.
Figure 20:
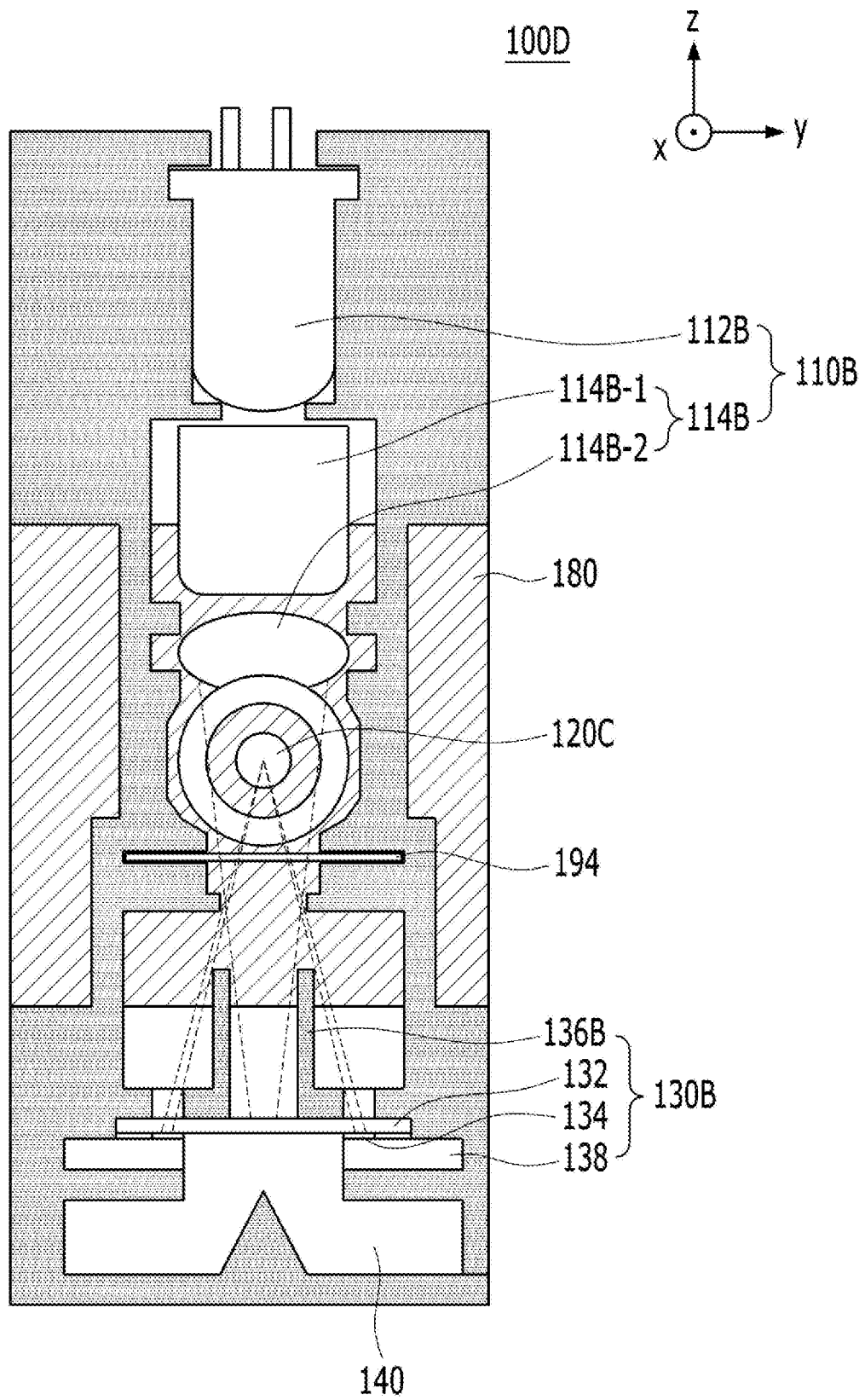
FIG. 20 is a side view of the particle-sensing device shown in FIG. 19.
Figure 21:
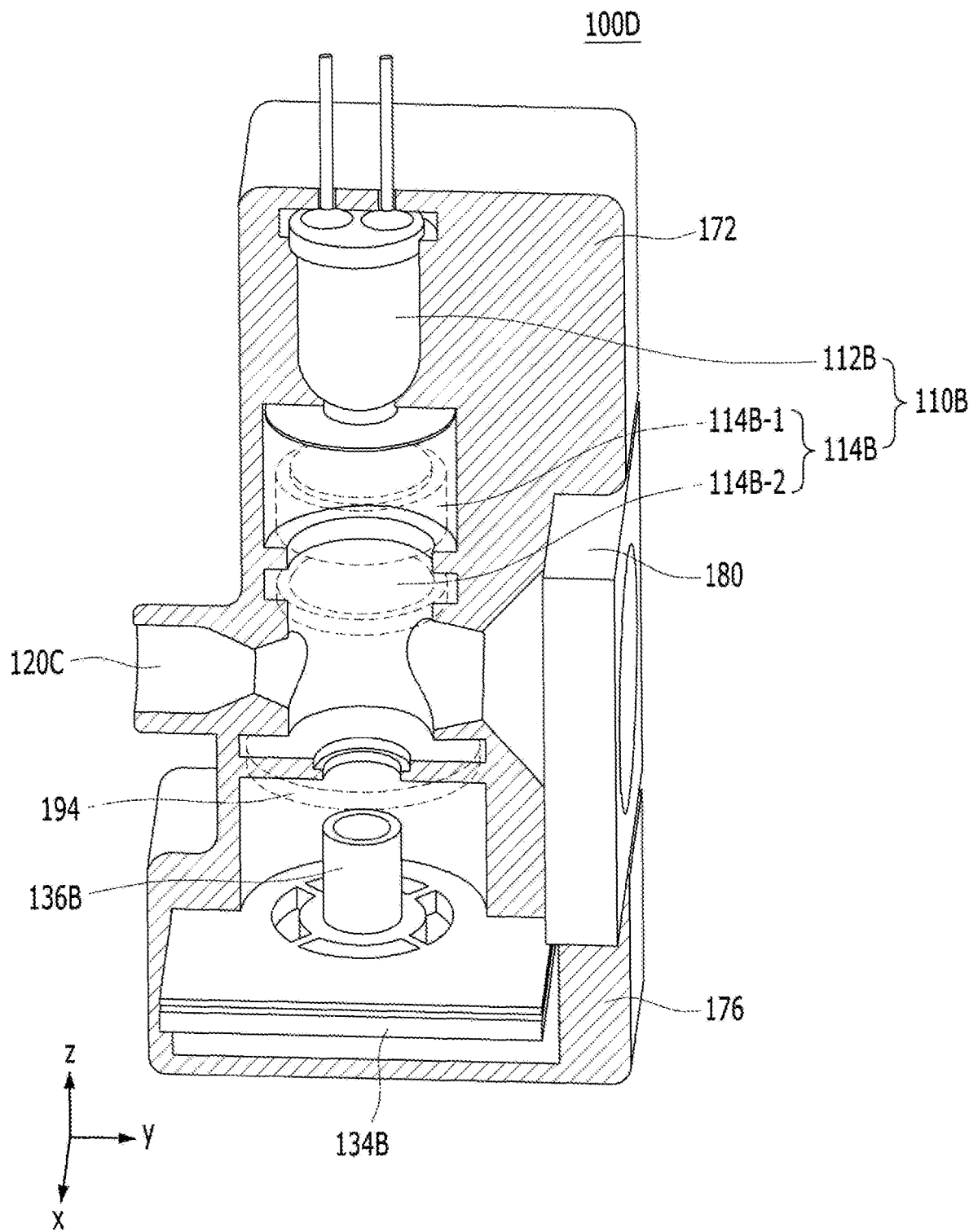
FIG. 21 is a top perspective view of the particle-sensing device shown in FIG. 19.
Figure 22:
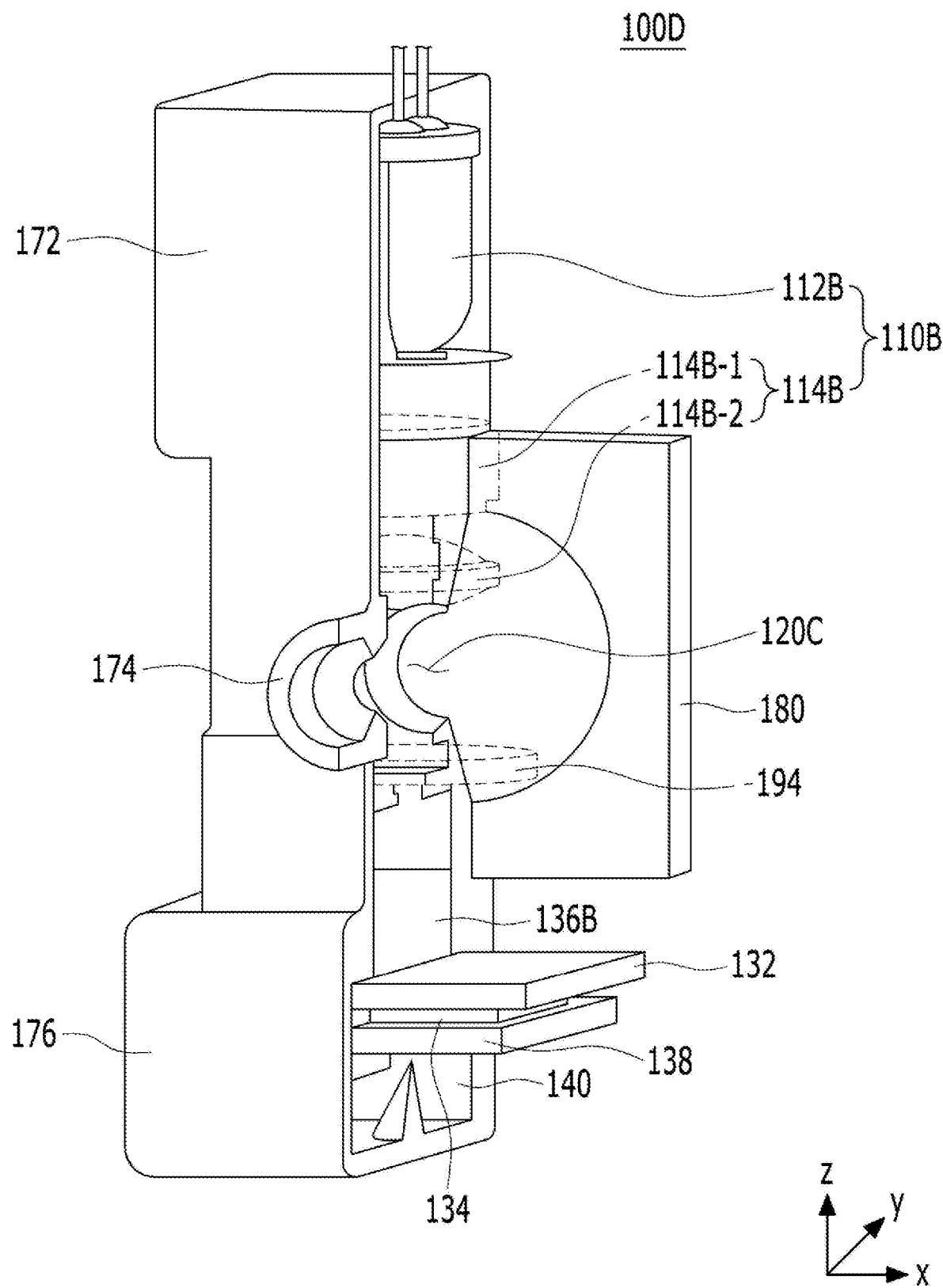
FIG. 22 is a left perspective view of the particle-sensing device shown in FIG. 19.
Figure 23:
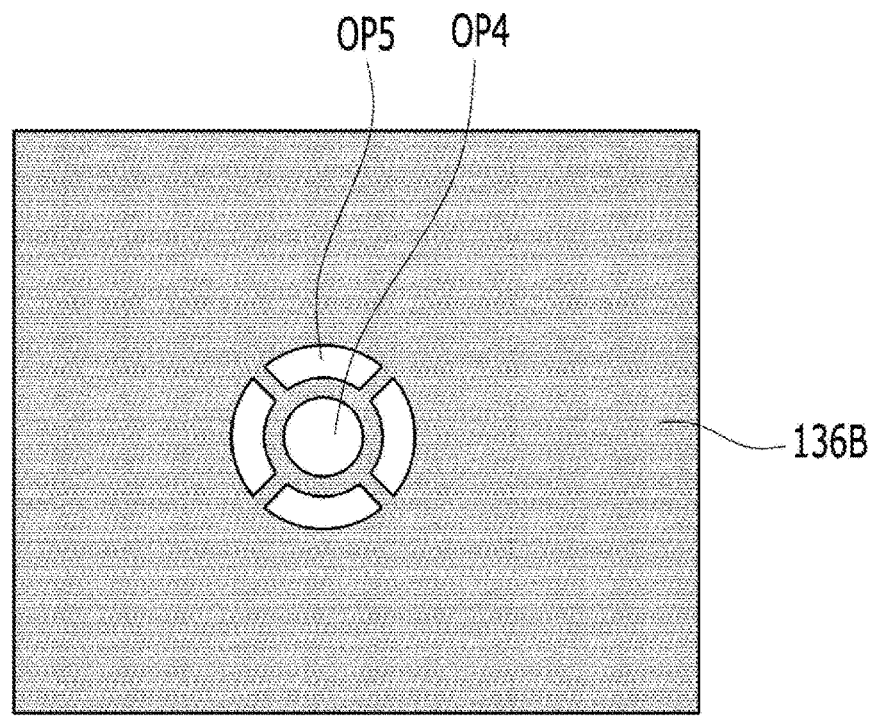
FIG. 23 is a plan view taken along line I-I' in FIG. 19.

FIG. 19 is a cross-sectional view of still another embodiment 100D of the particle-sensing device 100 shown in FIG. 1, FIG. 20 is a side view of the particle-sensing device 100D shown in FIG. 19, FIG. 21 is a top perspective view of the particle-sensing device 100D shown in FIG. 19, FIG. 22 is a left perspective view of the particle-sensing device 100D shown in FIG. 19, and FIG. 23 is a plan view taken along line I-I' in FIG. 19.

Only parts different from those shown in FIGS. 3 to 18*b* will be described below with reference to FIGS. 19 to 23. Therefore, the description made above with reference to FIGS. 3 to 18*b* may be applied to unexplained parts other than the parts described below with reference to FIGS. 19 to 22.

While the light source unit 112A of the particle-sensing devices 100A, 100B and 100C shown in FIGS. 3, 5 and 7 is packaged in an SMD type, a light source unit 112A of the particle-sensing device 100D shown in FIGS. 19 to 22 may be implemented as a dome-type (or a through-hole-type) LED. However, the embodiment is not limited thereto. For example, the dome-type light-emitting unit 110B may have a diameter φ of 3 mm to 5 mm and a view angle of 20° or less. However, the embodiment is not limited thereto.

Further, the operating temperature of the photodiodes 134-2 to 134-3' may range from −10° C. to 50° C. However, the embodiment is not limited as to the specific operating temperature of the photodiodes 134-2 to 134-3'.

While the lens unit 114A of the particle-sensing devices 100A, 1006 and 100C shown in FIGS. 3, 5 and 7 includes only one lens, a lens unit 114B of the particle-sensing device 100D shown in FIGS. 19 to 22 includes first and second lenses 114B-1 and 114B-2. The first lens 114B-1 may serve to convert the light emitted from the light source unit 112B into parallel light, and the second lens 114B-2 may serve to concentrate the parallel light emitted from the first lens 114B-1 onto the first opening OP1.

In the particle-sensing devices 100A, 100B and 100C shown in FIGS. 3, 5 and 7, the top portion 172 of the housing 170 and the light-emitting case 116 are provided separately from each other. On the other hand, in the particle-sensing device 100D shown in FIGS. 19 to 22, the top portion 172 of the housing 170 and the light-emitting case 116 are integrally formed with each other. That is, the top portion of the housing 170 serves as the light-emitting case 116.

Like the flow path unit 120C shown in FIGS. 7 and 8, the flow path unit 120C of the particle-sensing device 100D shown in FIGS. 19 to 22 may have a double nozzle (DN) structure. Thus, a duplicate explanation of the flow path unit 120C shown in FIGS. 19 to 22 will be substituted by the explanation of the flow path unit 120C shown in FIGS. 7 and 8.

Figure 24:
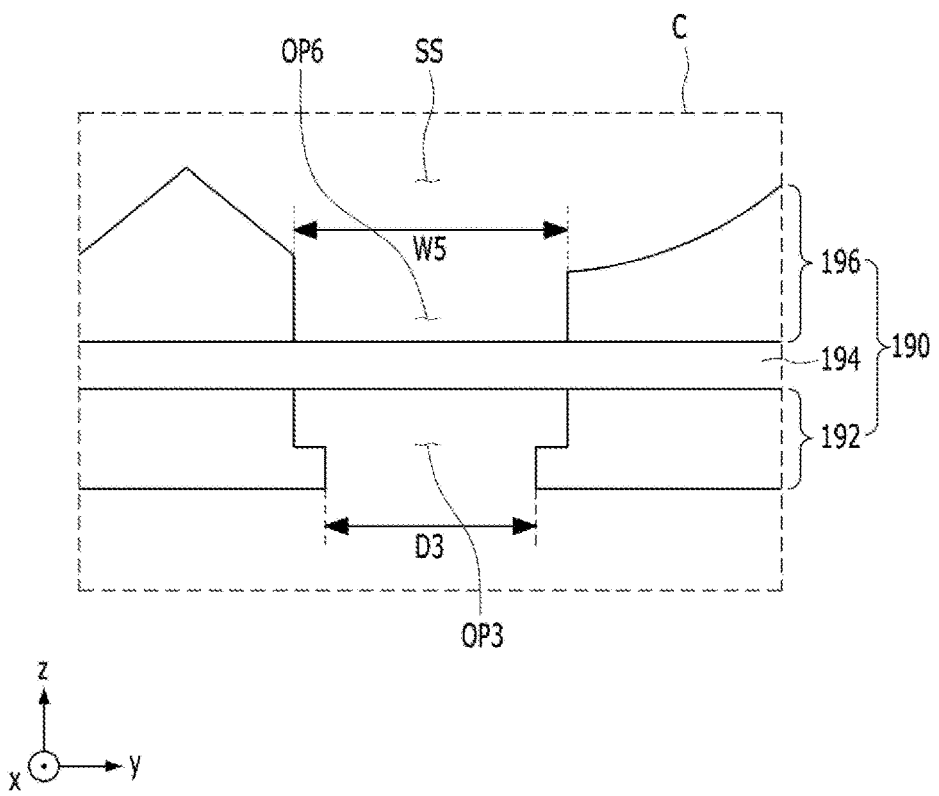
FIG. 24 is an enlarged cross-sectional view of portion 'C' shown in FIG. 19.

FIG. 24 is an enlarged cross-sectional view of portion 'C' shown in FIG. 19.

Referring to FIG. 24, the light incidence portion 190 may include a light-inducing portion 192, a cover light-transmitting portion 194, and a light-blocking portion 196.

The light-inducing portion 192 may be disposed between the scattering portion SS and the light-receiving portion 130B, and may define a third opening OP3. Here, the third opening OP3 may have the same characteristics as the third opening OP3 described above with reference to FIG. 3. That is, the third opening OP3 may have an area (e.g. an area having a length in the x-axis direction and a width in the y-axis direction) suitable to allow 20% to 80% of the total amount of light scattered by the particle P in the scattering portion SS to be incident on the light-receiving unit 130B. Further, the third opening OP3 may have an area suitable for a portion of the light scattered by the particle P, which is located within a range of a certain angle in the left and right from the center of the scattering portion SS to the fifth opening OP5 with respect to the optical axis LX, i.e. a predetermined angle θ of 24° to 60°, e.g. an angle of 60°, to be incident on the light-receiving unit 130B. As a result, it is possible to adjust the amount of light incident on the light-receiving unit 130B by adjusting the area of the third opening OP3.

Further, the area of the third opening OP3 may be different from the area of the first opening OP1. For example, when the third opening OP3 has a circular planar shape, the diameter D3 of the third opening OP3 may range from 2 mm to 10 mm. However, the embodiment is not limited thereto.

For example, the area of the first opening OP1 may be greater than the area of the third opening OP3. In this case, the focal point of the light generated from the light-emitting unit 110*b* is formed farther than the center of the scattering portion SS, thus reducing a measurement error due to the main beam.

The light-blocking portion 196 may be disposed between the scattering portion SS and the light-inducing portion 192, and may define a sixth opening OP6. It is possible to prevent the main light from being incident on the photodiode 134-2 or to adjust the amount of main light incident on the light-receiving unit 130B and traveling to the light-absorbing unit 140 by adjusting the width W5 of the sixth opening OP6. The light-blocking portion 196 disposed in this manner may prevent the main light from traveling to the photodiode 134-2 of the light-sensing part 134 through the fifth opening OP5. Here, the light-sensing part 134 may be implemented in a module form.

Further, the cover light-transmitting portion 194 may be disposed between the third opening OP3 and the sixth opening OP6. The cover light-transmitting portion 194 serves to prevent foreign substances from entering the light-receiving unit 130B. The cover light-transmitting portion 194 disposed in this manner may prevent the particle P passing through the scattering portion SS from entering the light-receiving unit 130B, thereby securing smooth flow of the particle P in the flow path unit 120C and reducing a measurement error. In this case, even when the photodiodes 134-2 and 134-21 to 134-24 are formed on any one of the first surface 132-1 and the second surface 132-2 of the light-transmitting member 132, it is possible to prevent damage to the photodiodes 134-2 and 134-21 to 134-24 due to foreign substances.

Figure 25:
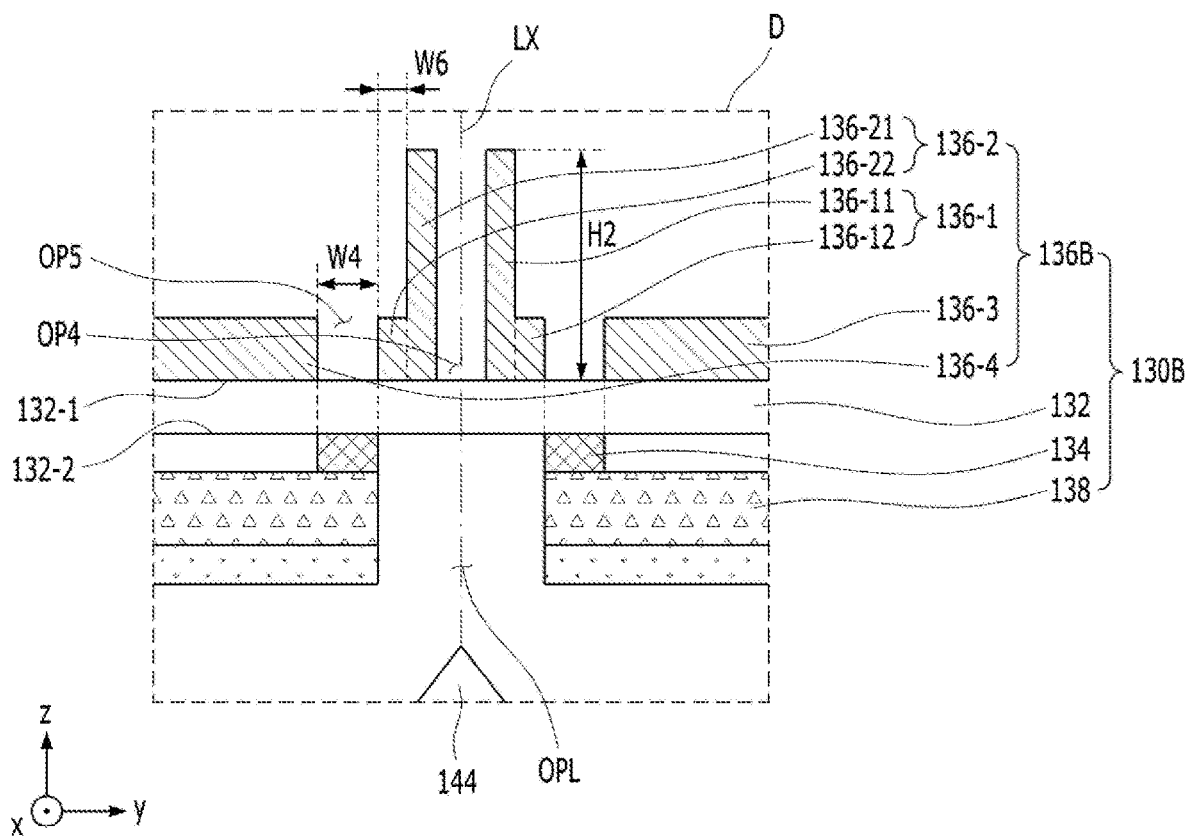
FIG. 25 is an enlarged cross-sectional view of portion 'D' in FIG. 19.

FIG. 25 is an enlarged cross-sectional view of portion 'D' in FIG. 19.

The light-sensing part 134 and the light guide part 136B shown in FIG. 25 may be disposed around the optical axis of the light-transmitting member 132. The light-sensing part 132 and the light guide part 136B may be disposed on the opposite surfaces of the light-transmitting member 132. For example, as shown in FIG. 25, the light-sensing part 134 may be disposed on the second surface 132-2 of the light-transmitting member 132, and the light guide part 136B may be disposed on the first surface 132-1 of the light-transmitting member 132. Alternatively, unlike the configuration shown in FIG. 25, the light-sensing part 134 may be disposed on the first surface 132-1 of the light-transmitting member 132, and the light guide part 136B may be disposed on the second surface 132-2 of the light-transmitting member 132. Here, the first surface 132-1 and the second surface 132-2 are the same as defined above with reference to FIG. 9. Hereinafter, a description will be made on the assumption that the light-sensing part 134 is disposed on the second surface 132-2 of the light-transmitting member 132, and the light guide part 136B is disposed on the first surface 132-1 of the light-transmitting member 132. However, the following description may also be applied to the opposite case.

The cross-section shown in FIG. 25 is the same as the cross-section shown in FIG. 9, except for the difference in the structure of the inner partition walls 136-1 and 136-2. Thus, the same parts as those in the cross-section shown in FIG. 9 are denoted by the same reference numerals, and will be described briefly. The following description will focus on different parts.

The inner partition walls 136-1 and 136-2 may have a height H2 such that the scattered light that has passed through the third opening OP3 travels to the fifth opening OP5 and such that the main light that has passed through the sixth opening OP6 travels to the fourth opening OP4. For example, the height H2 may be 3.3 mm. However, the embodiment is not limited thereto.

Each inner partition wall 136-1 or 136-2 may include an inner portion 136-11 or 136-21, which defines the fourth opening OP4, and an outer portion 136-12 or 136-22, which extends from the inner portion 136-11 or 136-21 and defines the fifth opening OP5 together with the corresponding outer partition wall 136-3 or 136-4. The diameter of the fourth opening OP4 having a circular planar shape needs to be greater than the focusing size of the main beam. If the diameter of the fourth opening OP4 is less than 2 mm, the entire main beam is not capable of passing through the fourth opening OP4, and only a portion thereof is incident on the photodiodes 134-2 and 134-21 to 134-24, whereby the photodiodes 134-2 and 134-21 to 134-24 may not sense the scattered light. Further, if the diameter of the fourth opening OP4 is greater than 6 mm, it may be difficult to realize a slit. Thus, the diameter of the fourth opening OP4 may range from 2 mm to 6 mm. However, the embodiment is not limited thereto.

The width W4 of the fifth opening OP5 may range from 1 mm to 6 mm. However, the embodiment is not limited thereto.

Further, the width W4 of the fifth opening OP5 may be greater than the width W6 of the outer portions 136-12 and 126-22. For example, the width W4 of the fifth opening OP5 may be 1.1 mm, and the width W6 of the outer portions 136-12 and 136-22 may be 0.8 mm. However, the embodiment is not limited thereto.

Furthermore, the outer portions 136-12 and 136-22 and the inner portions 136-11 and 136-21 of the inner partition walls 136-1 and 136-2 may be integrally formed with each other.

Still further, the cross-sectional width of at least one of the outer portions 136-12 and 136-22 or the inner portions 136-11 and 136-21 may gradually decrease from the first surface 132-1 of the light-transmitting substrate 132 to the third opening OP3. That is, the inner portions 136-11 and 136-21 and the outer portions 136-12 and 136-22 may be divided from each other in order to cause the scattered light to be effectively incident on the photodiode 134 at a predetermined angle, and may have a triangular cross-sectional shape.

Still further, the area (e.g. the area in the x-axis and y-axis directions) of the fourth opening OP4 shown in FIG. 25 may be less than the area (e.g. the area in the x-axis and y-axis directions) of the sixth opening OP6 shown in FIG. 24. However, the embodiment is not limited thereto. As such, when the area of the sixth opening OP6 is set to be greater than the area of the fourth opening OP4, it is possible to more effectively prevent the main beam from traveling to the photodiode 134-2.

The scattering portion SS may be in contact with a plurality of openings. That is, the scattering portion SS may communicate with the light-emitting unit 110A through the first opening OP1, may communicate with the first flow path intermediate portion FII1 (or the second flow path intermediate portion FII2) through the second opening OP2, and may communicate with the light-receiving unit 130A or 130B through the third opening OP3 or the sixth opening OP6.

Figure 26:
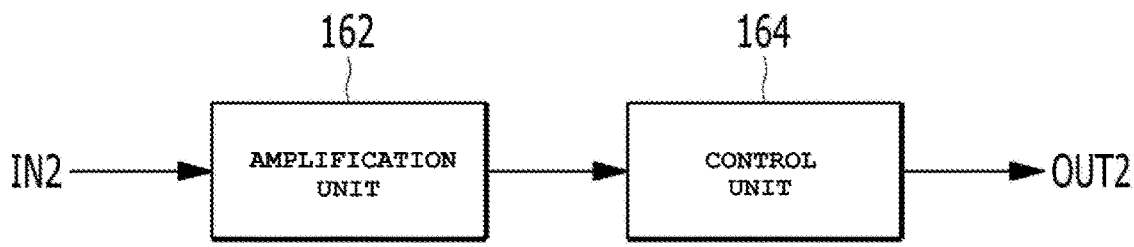
FIG. 26 is a block diagram of an embodiment of the information-analyzing unit shown in FIG. 1.

FIG. 26 is a block diagram of an embodiment of the information-analyzing unit 160 shown in FIG. 1, which may include an amplification unit 162 and a control unit 164.

The amplification unit 162 may amplify an electrical signal input from the light-receiving unit 130A or 130B (or the signal-converting unit 150) through the input terminal IN2, and may output the amplified result to the control unit 164. The control unit 164 may compare the analog signal amplified by the amplification unit 162 with a pulse width modulation (PWM) reference signal, may analyze at least one of the number, concentration, size or shape of particles P using the comparison result, and may output the analyzed result through the output terminal OUT2.

The particle-sensing devices 100 (100A to 100D) according to the above-described embodiments have the following effects.

First, the fan 180 is provided in order to induce the flow of air so that the air introduced into the flow path inlet portion FI flows to the flow path outlet portion FO via the scattering portion SS. Thus, many particles P included in the air may enter the flow path unit 120 and may be sensed, thus leading to improvement of the performance of sensing particles P.

A conventional device radiates light toward dust in an optical-axis direction, senses light scattered by the dust on the lateral side of the optical axis, and analyzes information about the dust. Unlike the conventional lateral-type dust-sensing device, the particle-sensing device according to the embodiment radiates light to the scattering portion SS, which is located in the path through which air including a particle P flows, in the optical-axis direction, senses the light scattered by the particle P in a direction parallel to the optical-axis direction, rather than on the lateral side of the optical axis, and analyzes information about the particle P. That is, the particle-sensing device according to the embodiment is a forward-type particle-sensing device.

Hereinafter, a lateral-type dust-sensing device according to a comparative example and a particle-sensing device according to the embodiment will be described with reference to the accompanying drawings.

Figure 27:
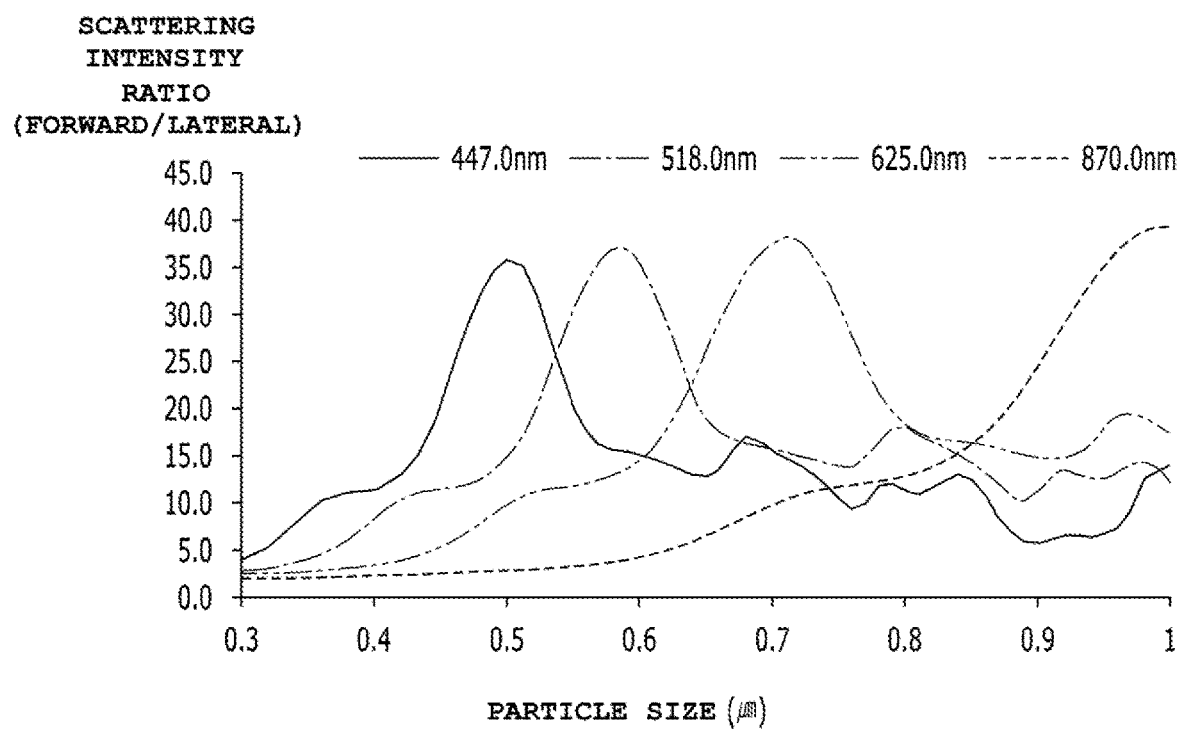
FIG. 27 is a graph showing a scattering intensity ratio depending on the size of a particle by a wavelength.

FIG. 27 is a graph showing a scattering intensity ratio depending on the size of a particle (or dust) by a wavelength, in which the horizontal axis represents the size of a particle, and the vertical axis represents a scattering intensity ratio.

The scattering intensity ratio in the vertical axis in FIG. 27 may be expressed using Equation 1 below.

Scattering Intensity Ratio=SIforward/SIlateral [Equation 1]

Here, SIforward represents a scattering intensity of the forward-type particle-sensing device according to the embodiment, and SIlateral represents a scattering intensity of the lateral-type dust-sensing device according to the comparative example.

The scattering intensity was calculated according to the Mie scattering theory, and is a value generated when incident light (intensity of 1 W/m2 and wavelength of 470 nm) is scattered by a polystyrene particle in the air.

The intensity of scattered light sensed by the photodiode 134-2 with respect to an ultra-fine particle (e.g. ultra-fine dust) in the forward-type device according to the embodiment is greater than that in the comparative example. For example, referring to FIG. 27, when the size of a particle is 0.3 μm, the intensity of scattered light received by the light-receiving unit 130 (130A and 130B) is about four times as large as that in the lateral-type device.

Figure 28:
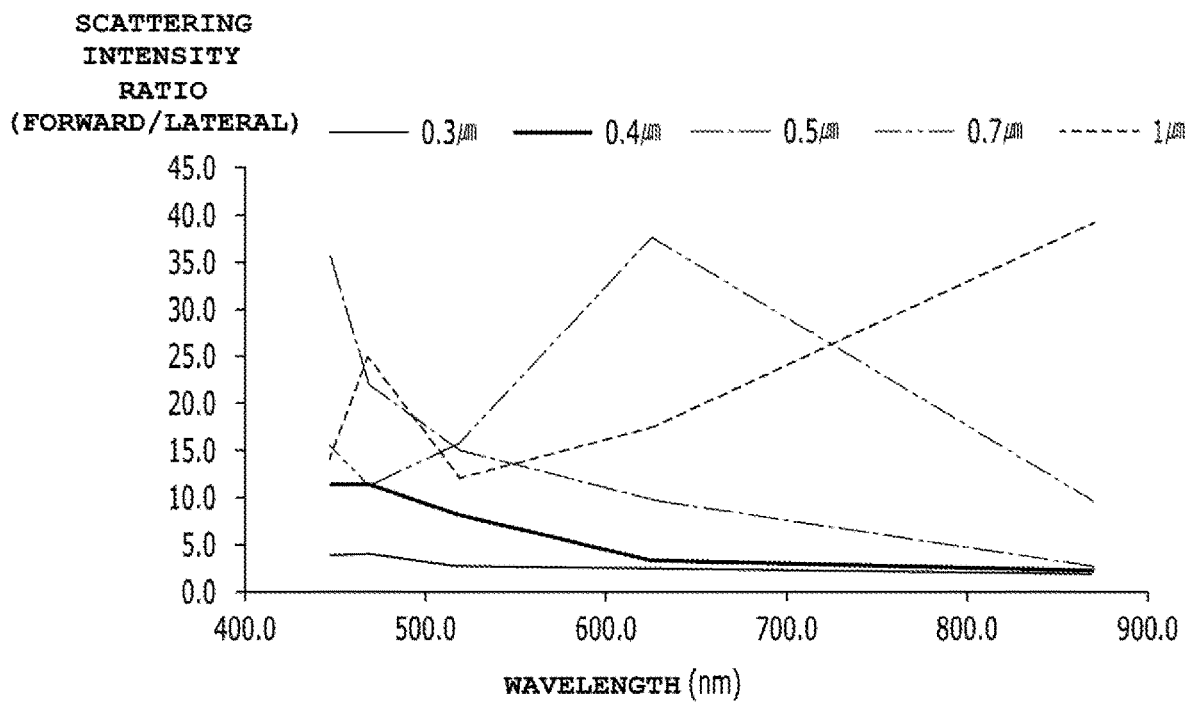
FIG. 28 is a graph showing a scattering intensity ratio depending on a wavelength by the size of a particle.

FIG. 28 is a graph showing a scattering intensity ratio depending on a wavelength by the size of a particle, in which the horizontal axis represents the wavelength of light, and the vertical axis represents a scattering intensity ratio of the forward-type device according to the embodiment to the lateral-type device according to the comparative example.

In the case of an ultra-fine particle having a size of 0.5 μm or less, referring to FIG. 28, the shorter the wavelength of the light emitted from the light-emitting unit 110, the greater the intensity of scattered light of the forward-type device according to the embodiment compared to the lateral-type device according to the comparative example.

Figure 29:
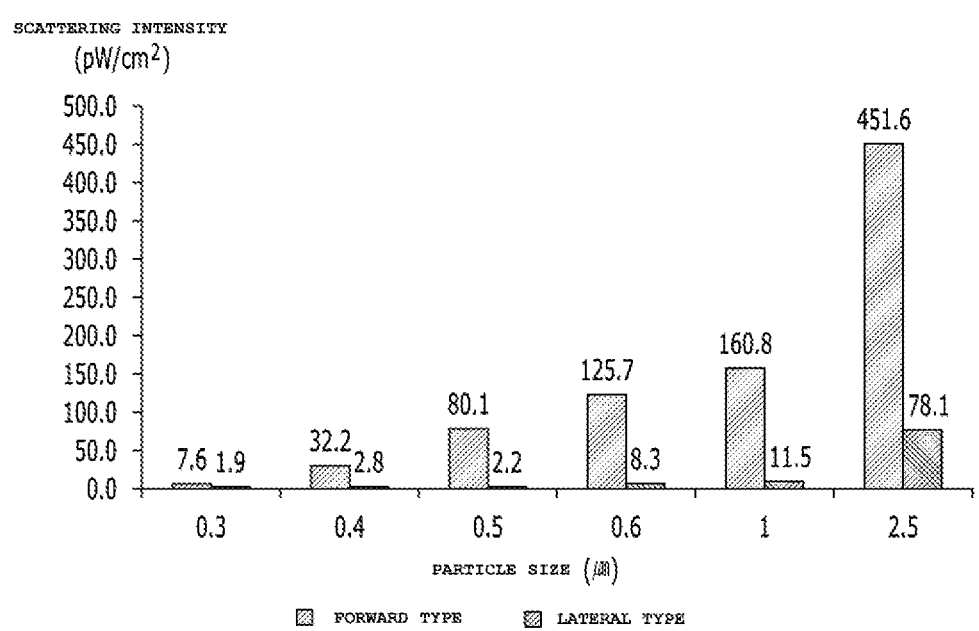
FIG. 29 is a graph showing the intensity of scattered light depending on the size of a particle when a light source unit emits light of a blue wavelength band.

FIG. 29 is a graph showing the intensity of scattered light depending on the size of a particle when the light source unit 110 emits light of a blue wavelength band, in which the horizontal axis represents the size of a particle and the vertical axis represents a scattering index of the quantity of scattered light. FIG. 29 shows results obtained when the angle θ in the forward-type device shown in FIG. 3 is 12° and when an angle at which scattered light is sensed in the lateral-type device is 60° in the lateral direction with respect to main light scattered by dust.

Referring to FIG. 29, when the light source unit 110 emits light of a blue wavelength band and when the particle size is 1 μm, the intensity of scattered light in the forward-type particle-sensing device is very large compared to the lateral-type device.

As a result, as shown in FIGS. 27 to 29, since the intensity of scattered light in the forward-type device according to the embodiment is large compared to the lateral-type device according to the comparative example, it is possible to accurately analyze information about particles using the sensed scattered light.

Hereinafter, the intensity of scattered light incident on respectively different photodiodes and the intensity ratio of scattered light depending on the size of a particle will be described in more detail with reference to FIGS. 30 to 32.

First, an environment in which the intensity of scattered light that is incident on respectively different photodiodes depending on the size of a particle is measured according to the embodiment will be described with reference to FIG. 30.

Figure 30:
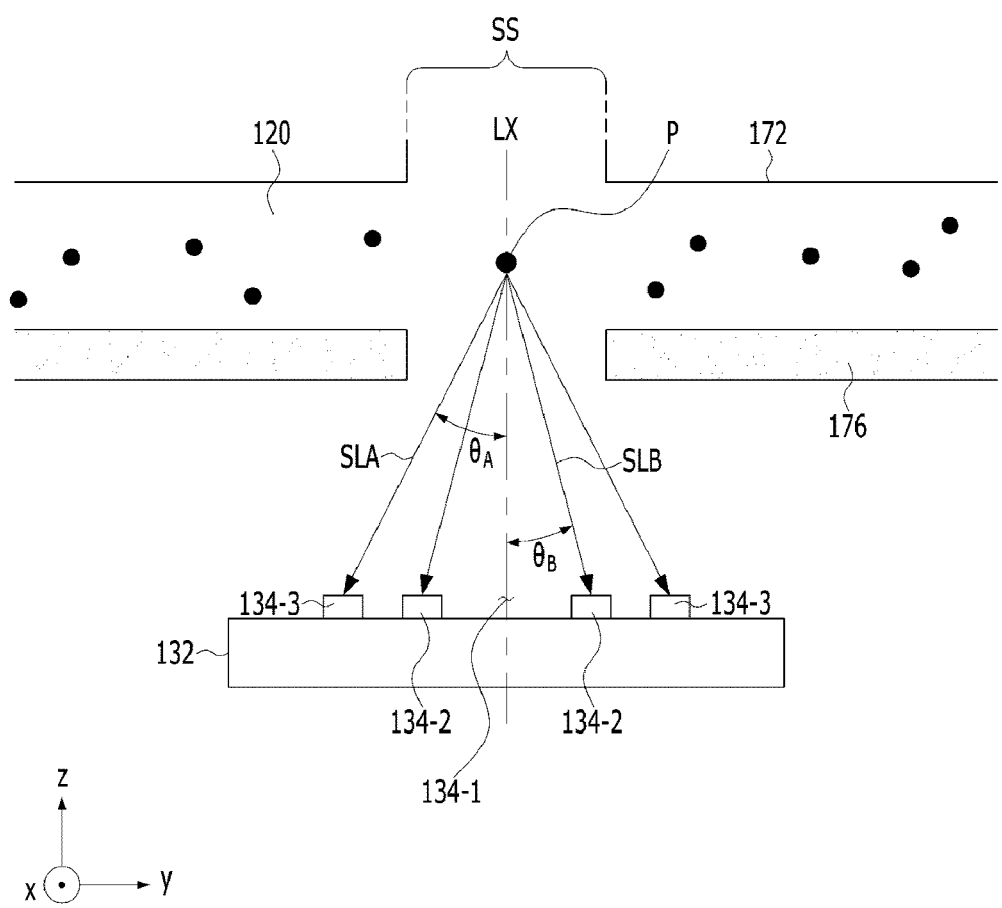
FIG. 30 is a cross-sectional view showing the relationship between the light-sensing part shown in FIG. 13a and scattered light.

FIG. 30 is a cross-sectional view showing the relationship between the light-sensing part shown in FIG. 13 and scattered light.

FIG. 30 is a view showing reconstruction of parts corresponding to portion 'A' and portion 'B' shown in FIG. 3. Unless otherwise noted, parts not described herein may be substituted by the description made with reference to FIG. 3, and the planar shape of the light-sensing part is the same as that shown in FIG. 13*a*.

A configuration shown in FIG. 30 will be described on the assumption that a particle P is present at the center of the scattering portion SS of the flow path unit 120. Here, the state in which the particle P is located at the center of the scattering portion SS may mean that the particle P is located on the optical axis LX with respect to the Z axis. Further, in the case in which the flow path unit 120 has a circular-shaped cross-section when the cross-section thereof cut along the X-Z plane is viewed in the Y-axis direction, the state in which the particle P is located at the center of the scattering portion SS may mean that the particle P is located at the center of the circular-shaped cross-section of the flow path unit.

When light is scattered by the particle P located at this position, the first scattered light portion SLB of the scattered light is received by the first photodiode 134-2, and the second scattered light portion SLA of the scattered light is received by the second photodiode 134-3.

With regard to the arrangement of the above-described components, the conditions applied to FIGS. 28 and 29 are as follows.

The angle θA formed by the direction in which the first scattered light portion SLB travels and the optical axis of the light source ranges from 60 degrees to 65 degrees. Further, the angle θB formed by the direction in which the second scattered light portion SLA travels and the optical axis of the light source ranges from 20 degrees to 25 degrees. Furthermore, the particle P includes a polystyrene material, and light having a wavelength of 470 nm is scattered by the particle P under a pressure of 1 atm at 25° C.

Figure 31:
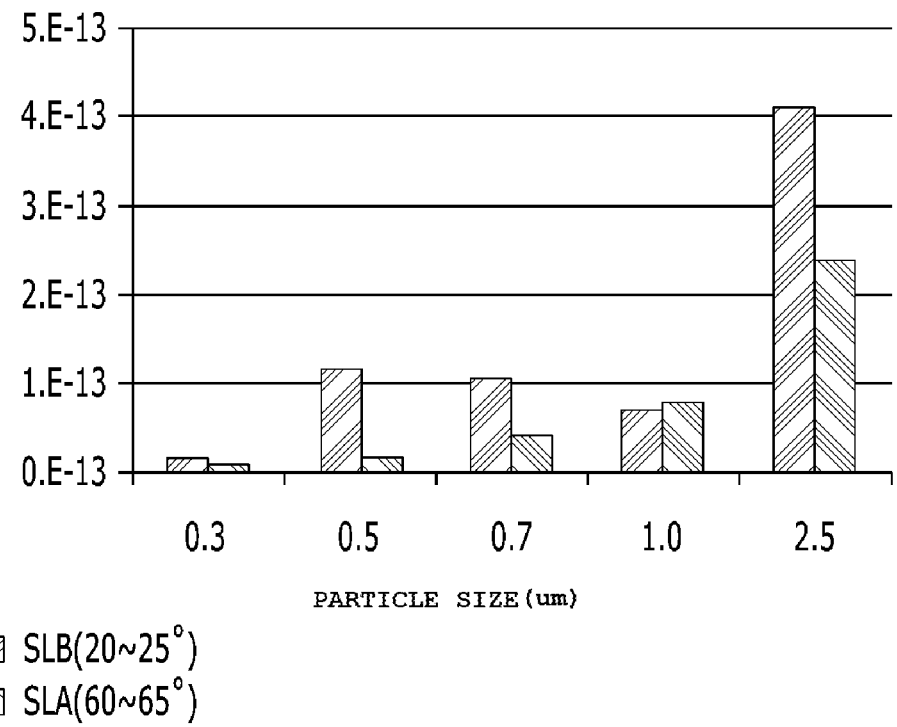
FIG. 31 is a graph showing the intensity of scattered light incident on different positions depending on the size of a particle.
Figure 32:
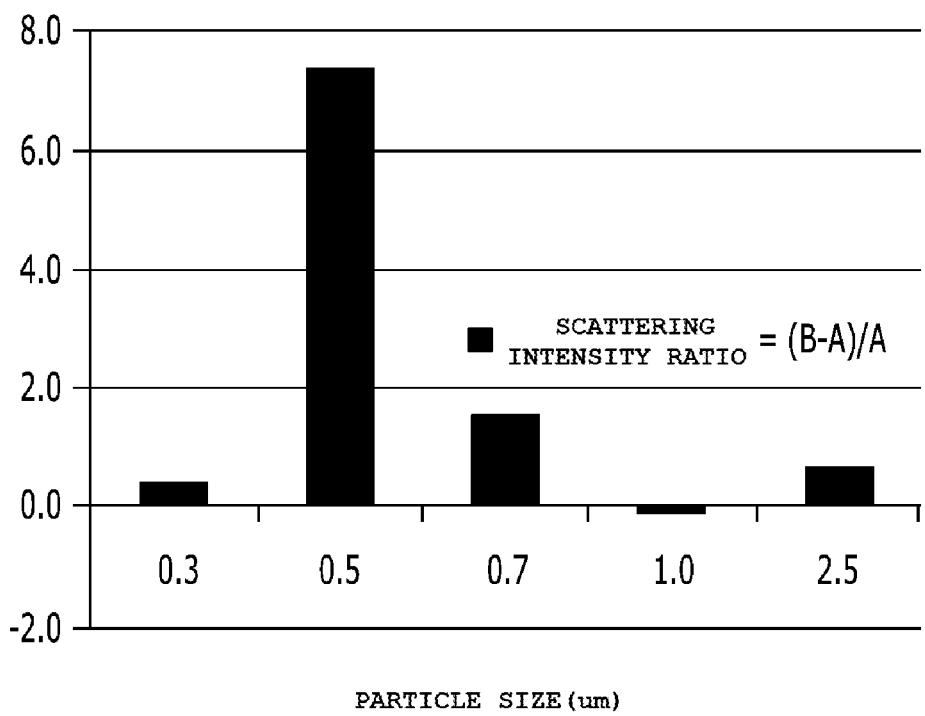
FIG. 32 is a graph showing a scattered light ratio according to the graph shown in FIG. 31 depending on the size of a particle.

FIG. 31 is a graph showing the intensity of scattered light incident on different positions depending on the size of a particle, and FIG. 32 is a graph showing the scattered light ratio according to the graph shown in FIG. 31 depending on the size of a particle.

FIG. 31 shows the intensity B of the first scattered light portion SLB and the intensity A of the second scattered light portion SLA depending on the size of a particle in the above-described environment. The second scattered light portion SLA tends to continuously increase as the particle size increases. The first scattered light portion SLB generally tends to increase, but decreases (i.e. the presence of a dip section) in the section in which the particle size ranges from 0.5 μm to 1 μm. This phenomenon is caused by the difference between the characteristics of the scattering patterns. Specifically, the first scattered light portion SLB, which is incident on the first photodiode 134-2, substantially has a forward scattering pattern, and the second scattered light portion SLA, which is incident on the second photodiode 134-3, substantially has a lateral scattering pattern. In other words, the forward scattering pattern has a large advantage in that the absolute value of the intensity of scattered light that is scattered by a particle having a size of 1 μm or less is large, but has a dip section in which the intensity of scattered light decreases as the particle size increases. On the other hand, the lateral scattering pattern has an advantage in that the intensity of scattered light is proportional to the particle size, but the absolute value of the intensity of scattered light that is scattered by a particle having a size of 1 μm or less is small, thus making it difficult to increase a signal-to-noise ratio (SNR).

Therefore, in the case in which only the first photodiode 134-2 is present, if the particle size is measured only using the intensity of a signal in the section in which the particle size ranges from 0.5 μm to 1 μm, a measurement error may occur. However, as shown in FIG. 32, the scattering intensity ratio ((B−A)/A) clearly varies from a very small negative value to 7.0 or greater depending the particle size. Thus, it is possible to more accurately determine the particle size by combining the value of "A", the value of "B", and the "scattering intensity ratio". For example, when the intensity of the scattered light SLA detected by the second photodiode 134-3 is about 1.4e-14 W and the intensity of the scattered light SLB detected by the first photodiode 134-2 is about 1e-13 W, the scattering intensity ratio is 7.4, with the result that the information-analyzing unit 160 may determine that the size of the corresponding particle is 0.5 µm.

The particle-sensing device according to the above-described embodiment has the following advantages.

First, freedom in configuration of the photodiode constituting the light-sensing part is high, and the photodiode is formed in various manners such as patterning, deposition, and printing. As a result, it is easy to manufacture multiple light-receiving elements.

In addition, in spite of deterioration of an optical system, it is possible to correct the particle size due to the scattering characteristics in accordance with the light-receiving angle of the photodiode, and this effect is further improved as the number of photodiodes increases. Thus, since a calibration process, which is required when the particle-sensing device is mounted to another device, may be omitted, a time and cost may be reduced.

Further, according to the embodiment, the photodiode (e.g. 134-2) may be divided into a plurality of sensing segments 134-21, 134-22, 134-23 and 134-24, and the shape of a particle may be predicted using a relative intensity sensed by the divided sensing segments 134-21, 134-22, 134-23 and 134-24.

In the case in which the light-absorbing unit 140 is disposed on the light-receiving unit 130 (130A and 130B), main light that has not been absorbed by the light-absorbing unit 140 may be absorbed by the light-receiving unit 130 (130A and 130B), which may cause optical noise. In order to prevent this, the light-absorbing unit 140 needs to be designed very precisely. Further, it is very difficult to consider a tolerance due to various factors such as an assembly tolerance and a lens position tolerance.

On the other hand, according to the embodiment, the light-sensing part 134 including the light-transmitting region 134-1 having a light-transmitting property is used, and the light-absorbing unit 140 is disposed under the light-receiving unit 130 (130A and 130B). Thus, the light-absorbing unit 140 may be designed more easily than when the light-absorbing unit 140 is disposed on the light-receiving unit 130 (130A and 130B), and it is possible to solve deterioration in detection of scattered light due to main beam.

According to the embodiment, the fan 180 is provided, the structure of the flow path unit 120 is modified such that the area of the opening OP1 becomes greater than the cross-sectional area of the flow path unit 120, or the flow path unit 120 is formed so as to have a double nozzle structure. Thus, compared to a lateral-type device in which air including a particle P is flowed by heat flow, the embodiment is capable of measuring a great number of particles P, forming a light curtain in the scattering portion SS, and sensing all of the particles flowing through the flow path unit 120. As a result, the embodiment is capable of more accurately sensing particles, e.g. counting the number of particles P, unlike a related art.

In addition, as described above, since the intensity of scattered light sensed in the embodiment is higher than that in the lateral-type device. Thus, it is not necessary to consume a large amount of power to increase the intensity of scattered light.

In addition, since the light guide part 136A and 136B is disposed on the photodiode 134-2, the photodiode 134-2 is capable of more effectively sensing scattered light, and thus the intensity of light sensed by the photodiode may increase.

In addition, a single photodiode may be disposed over a large area in order to increase the amount of light received thereby. Further, unlike a general photodiode device, the structure may formed so as to be easily connected to a control circuit, and the internal structure of the sensing device to which the light-sensing device is applied may be simplified, thereby reducing the overall volume.

The particle-sensing devices according to the embodiments described above may be applied to domestic and industrial air cleaners, air purifiers, air washers, air coolers, or air conditioners, or may be applied to air quality management systems for buildings, indoor/outdoor air conditioning systems for vehicles, or indoor air quality measurement devices for vehicles. However, it should be noted that the particle-sensing devices 100 (100A to 100D) according to the embodiments are not limited to these applications and may be applied to various fields.

While the present disclosure has been particularly shown and described with reference to exemplary embodiments thereof, these embodiments are only proposed for illustrative purposes and do not restrict the present disclosure, and it will be apparent to those skilled in the art that various changes in form and details may be made without departing from the essential characteristics of the embodiments set forth herein. For example, respective configurations set forth in the embodiments may be modified and applied. Further, differences in such modifications and applications should be construed as falling within the scope of the present disclosure as defined by the appended claims.

The invention claimed is:

1. A light-sensing device sensing light that is emitted from a light source and is reflected or scattered from an object, the light-sensing device comprising:
   a light-transmitting member; and
   a light-sensing part disposed on the light-transmitting member, the light-sensing part comprising a light-transmitting region,
   wherein the light-sensing part comprises:
   a first electrode layer;
   a semiconductor layer disposed on the first electrode layer in a first direction; and
   a second electrode layer disposed on the semiconductor layer in the first direction, and
   wherein the semiconductor layer comprises:
   a first semiconductor layer disposed, in a second direction, around the light-transmitting region located on an optical axis of the light source, the first semiconductor layer to have a first circular shape when viewed in plan, the second direction being different than the first direction; and
   a second semiconductor layer disposed, in the second direction, outside the first circular shape of the first semiconductor layer when viewed in plan, the second semiconductor layer to have a second circular shape when viewed in plan, the second circular shape and the first circular shape to have a concentric circle shape when viewed in plan, the optical axis passes through a center of the concentric circle shape, and the second circular shape is larger in the second direction than the first circular shape.

2. The light-sensing device according to claim 1, wherein the light-transmitting member has a circular planar shape, and wherein each of the first semiconductor layer and the second semiconductor layer has an annular planar shape.

3. The light-sensing device according to claim 2, wherein a planar width of the first semiconductor layer is less than a planar width of the second semiconductor layer.

4. The light-sensing device according to claim 2, wherein the first electrode layer is shared by the first semiconductor layer and the second semiconductor layer.

5. The light-sensing device according to claim 4, wherein the second electrode layer comprises:
   a 2-1st electrode layer connected to the first semiconductor layer; and
   a 2-2nd electrode layer connected to the second semiconductor layer.

6. The light-sensing device according to claim 5, wherein the 2-1st electrode layer comprises an extending portion extending toward an edge of the light-transmitting member when viewed in plan.

7. The light-sensing device according to claim 6, wherein the first electrode layer, the second semiconductor layer, and the 2-2nd electrode layer are not disposed around the extending portion when viewed in plan.

8. The light-sensing device according to claim 6, wherein the extending portion is disposed on an insulation layer preventing conductible connection to the first electrode layer, the second semiconductor layer, or the 2-2nd electrode layer.

9. The light-sensing device according to claim 1, wherein the semiconductor layer further comprises a third semiconductor layer disposed outside the second semiconductor layer, the third semiconductor layer sensing the scattered light.

10. A particle-sensing device comprising:
    a light-emitting unit emitting light;
    a flow path unit disposed below the light-emitting unit so as to intersect an optical axis of the light-emitting unit, the flow path unit providing a space in which air including a particle flows and light is scattered by the particle;
    a light-receiving unit disposed below the flow path unit, the light-receiving unit receiving the scattered light; and
    a light-absorbing unit disposed on the optical axis below the light-receiving unit, and the light-absorbing unit absorbing light that has passed through the light-receiving unit,
    wherein the light-receiving unit comprises:
    a light-transmitting member; and
    a light-sensing part disposed on the light-transmitting member, the light-sensing part comprising a light-transmitting region,
    wherein the light-sensing part comprises:
    a first electrode layer;
    a semiconductor layer disposed on the first electrode layer in a first direction; and
    a second electrode layer disposed on the semiconductor layer in the first direction, and
    wherein the semiconductor layer comprises:
    a first semiconductor layer disposed, in a second direction, around the light-transmitting region located on the optical axis of the light-emitting unit, the first semiconductor layer to have a first circular shape when viewed in plan, the second direction being different than the first direction; and
    a second semiconductor layer disposed, in the second direction, outside the first circular shape of the first semiconductor layer when viewed in plan, the second semiconductor layer to have a second circular shape when viewed in plan, the second circular shape and the first circular shape to have a concentric circle shape when viewed in plan, the optical axis passes through a center of the concentric circle shape, and the second circular shape is larger in the second direction than the first circular shape.

11. The particle-sensing device according to claim 10, further comprising:
    an information-analyzing unit determining a size of the particle using a ratio of an intensity of an output signal of the first semiconductor layer to an intensity of an output signal of the second semiconductor layer.

12. The particle-sensing device according to claim 10, wherein the light-transmitting region has a circular planar shape, and
    wherein the first semiconductor layer and the second semiconductor layer have an annular planar shape so as to be concentric with each other.

* * * * *